US011764276B2

(12) United States Patent
Kimoto et al.

(10) Patent No.: US 11,764,276 B2
(45) Date of Patent: Sep. 19, 2023

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Shinichi Kimoto, Tsukuba (JP); Ryosuke Iijima, Setagaya (JP); Shinsuke Harada, Tsukuba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 232 days.

(21) Appl. No.: 17/447,003

(22) Filed: Sep. 7, 2021

(65) Prior Publication Data

US 2022/0190130 A1 Jun. 16, 2022

(30) Foreign Application Priority Data

Dec. 11, 2020 (JP) ................................. 2020-206239

(51) Int. Cl.
*H01L 29/78* (2006.01)
*H01L 29/423* (2006.01)
(Continued)

(52) U.S. Cl.
CPC ........ *H01L 29/4238* (2013.01); *H01L 23/528* (2013.01); *H01L 29/0696* (2013.01); *H01L 29/41741* (2013.01); *H01L 29/66068* (2013.01); *H01L 29/7813* (2013.01); *H01L 29/045* (2013.01); *H01L 29/1608* (2013.01); *H01L 29/4916* (2013.01)

(58) Field of Classification Search
CPC ......... H01L 21/02529; H01L 21/02378; H01L 29/1608; H01L 29/4236; H01L 29/66734; H01L 29/7811; H01L 29/7813
See application file for complete search history.

(56) References Cited

U.S. PATENT DOCUMENTS 9,196,720 B2 11/2015 Tokuda
9,496,391 B2* 11/2016 Yedinak .............. H01L 29/7827
(Continued)

FOREIGN PATENT DOCUMENTS

JP 2014-150148 A 8/2014
JP 2015-082503 A 4/2015
(Continued)

*Primary Examiner* — Eric A. Ward
(74) *Attorney, Agent, or Firm* — Oblon, McClelland, Maier & Neustadt, L.L.P.

(57) ABSTRACT

A semiconductor device according to an embodiment includes: a silicon carbide layer having a first plane parallel to a first direction and a second direction orthogonal to the first direction, and a second plane facing the first plane, the silicon carbide layer including a first trench and a second trench extending in the first direction; a gate electrode in the first trench and the second trench; a gate insulating layer; a gate wiring extending in the second direction, intersecting with the first trench and the second trench, connected to the gate electrode; a first electrode; a second electrode; and an interlayer insulating layer provided between the gate electrode and the first electrode. Neither the gate electrode nor the gate wiring is present between an end of the first trench in the first direction and the interlayer insulating layer.

17 Claims, 47 Drawing Sheets

(51) Int. Cl.
    *H01L 29/06*     (2006.01)
    *H01L 23/528*     (2006.01)
    *H01L 29/417*     (2006.01)
    *H01L 29/66*     (2006.01)
    *H01L 29/16*     (2006.01)
    *H01L 29/49*     (2006.01)
    *H01L 29/04*     (2006.01)

(56) References Cited

U.S. PATENT DOCUMENTS

| | | | |
|---|---|---|---|
| 9,837,498 B2 * | 12/2017 | Schwetlick | H01L 29/408 |
| 10,475,916 B2 | 11/2019 | Hatakenaka et al. | |
| 2016/0181408 A1 | 6/2016 | Aichinger et al. | |
| 2018/0158938 A1 * | 6/2018 | Kyogoku | H01L 29/407 |

FOREIGN PATENT DOCUMENTS

| | | | |
|---|---|---|---|
| JP | 2016-129226 A | 7/2016 |
| JP | 2018-170456 A | 11/2018 |
| JP | 2020-096084 A | 6/2020 |
| JP | 2020-127017 A | 8/2020 |

* cited by examiner

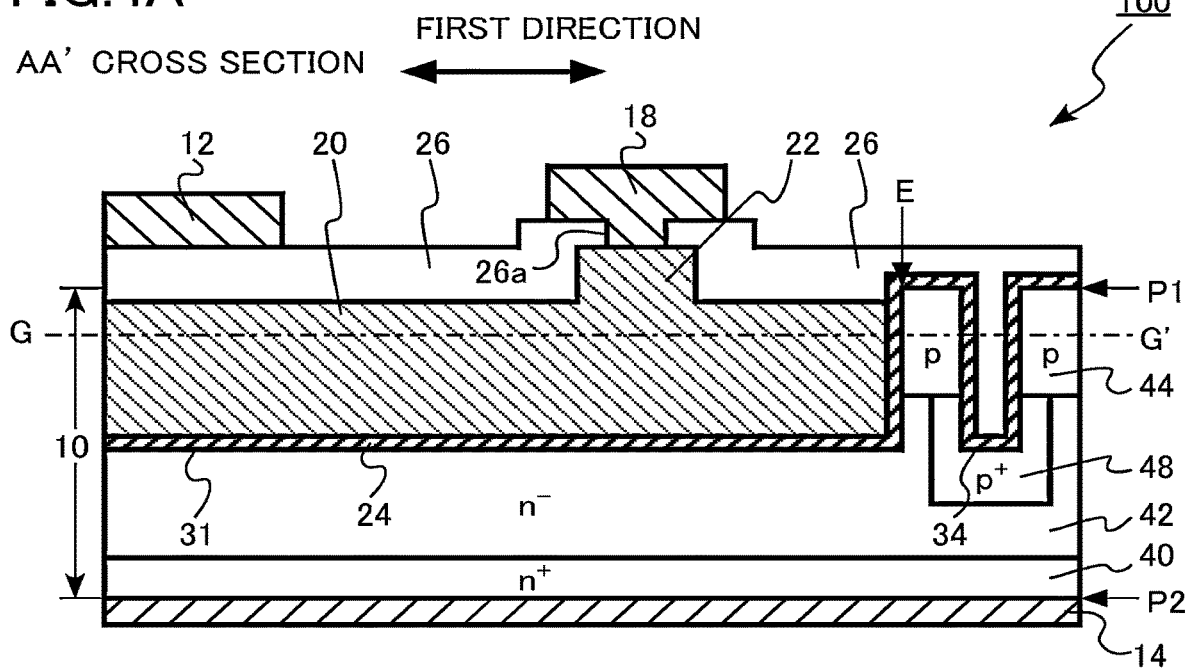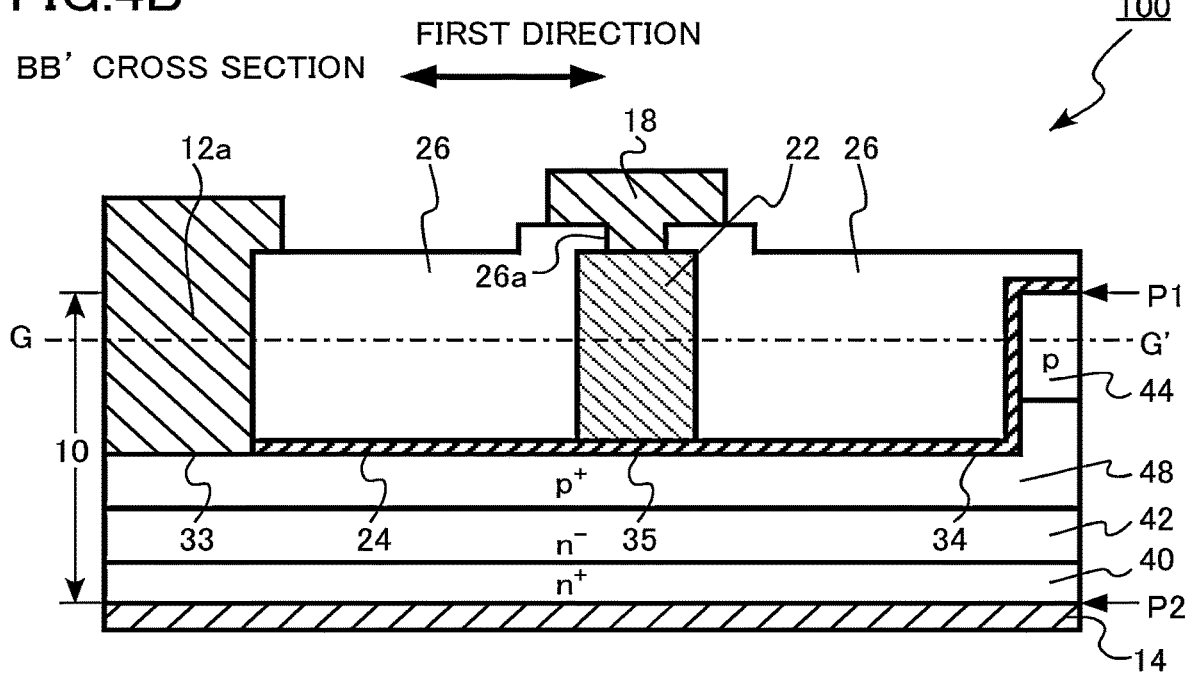

CC' CROSS SECTION

SECOND DIRECTION

DD' CROSS SECTION

SECOND DIRECTION

EE' CROSS SECTION

FF' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

CC' CROSS SECTION

DD' CROSS SECTION

EE' CROSS SECTION

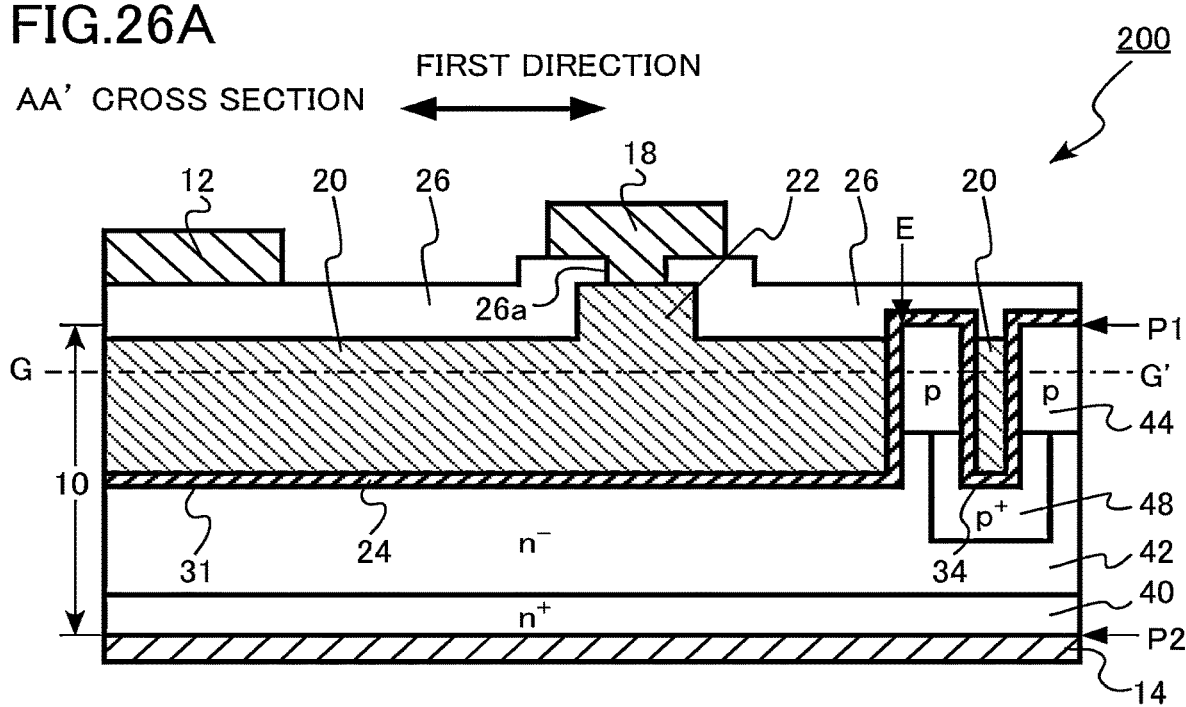
FIG.26A AA' CROSS SECTION
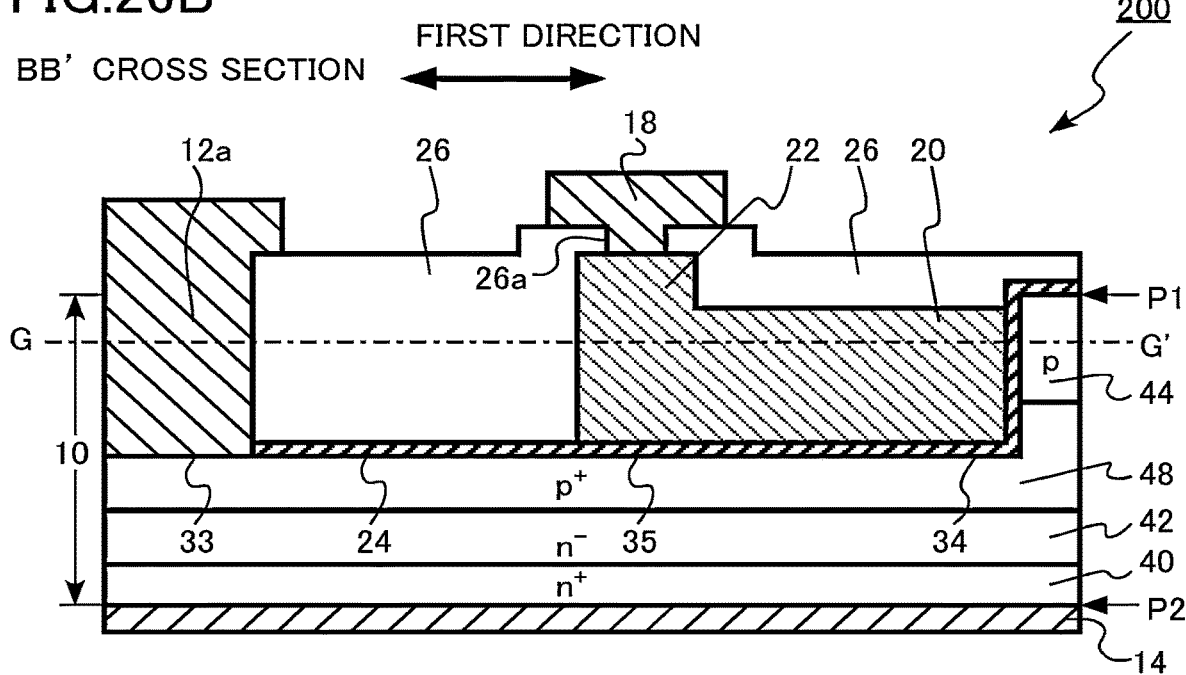
FIG.26B BB' CROSS SECTION

CC' CROSS SECTION

SECOND DIRECTION

DD' CROSS SECTION

SECOND DIRECTION

EE' CROSS SECTION

SECOND DIRECTION

FF' CROSS SECTION

SECOND DIRECTION

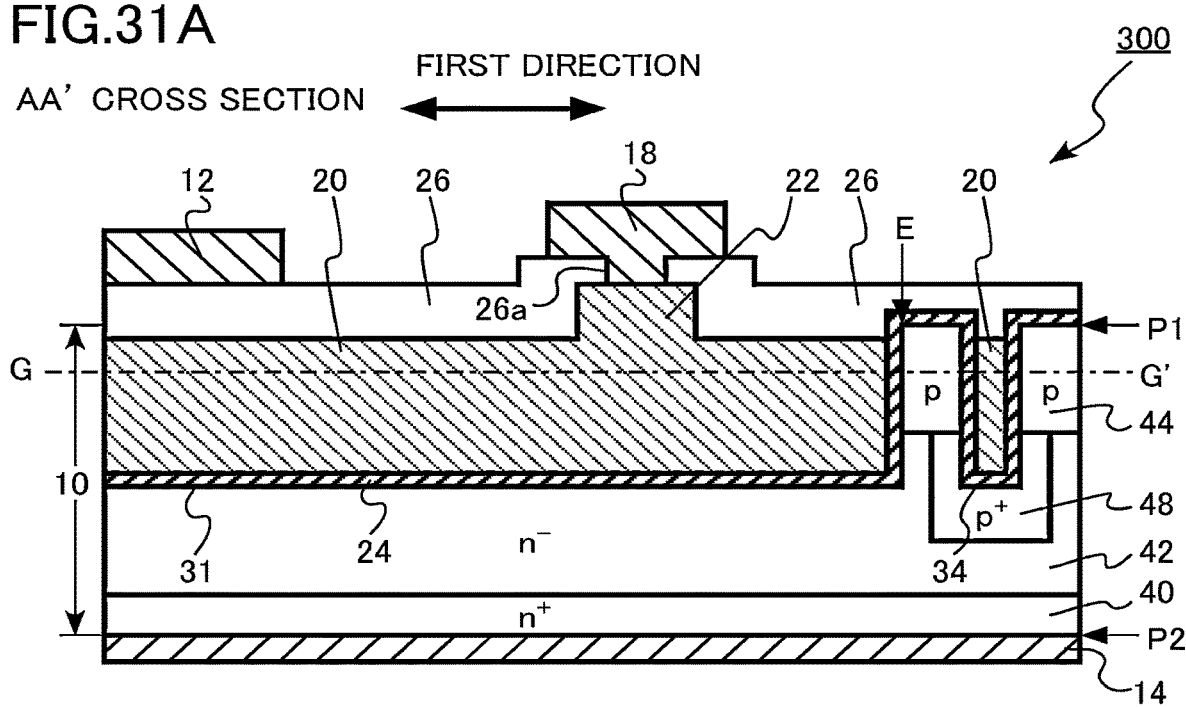
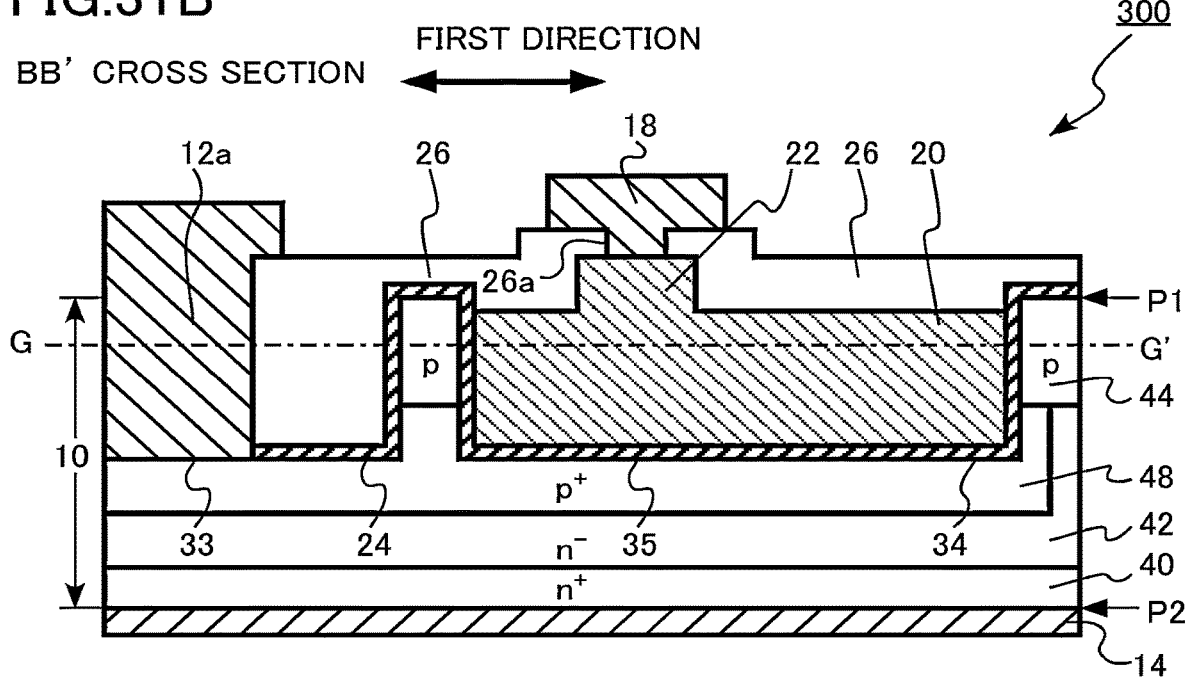

CC' CROSS SECTION

SECOND DIRECTION

DD' CROSS SECTION

SECOND DIRECTION

EE' CROSS SECTION

FF' CROSS SECTION

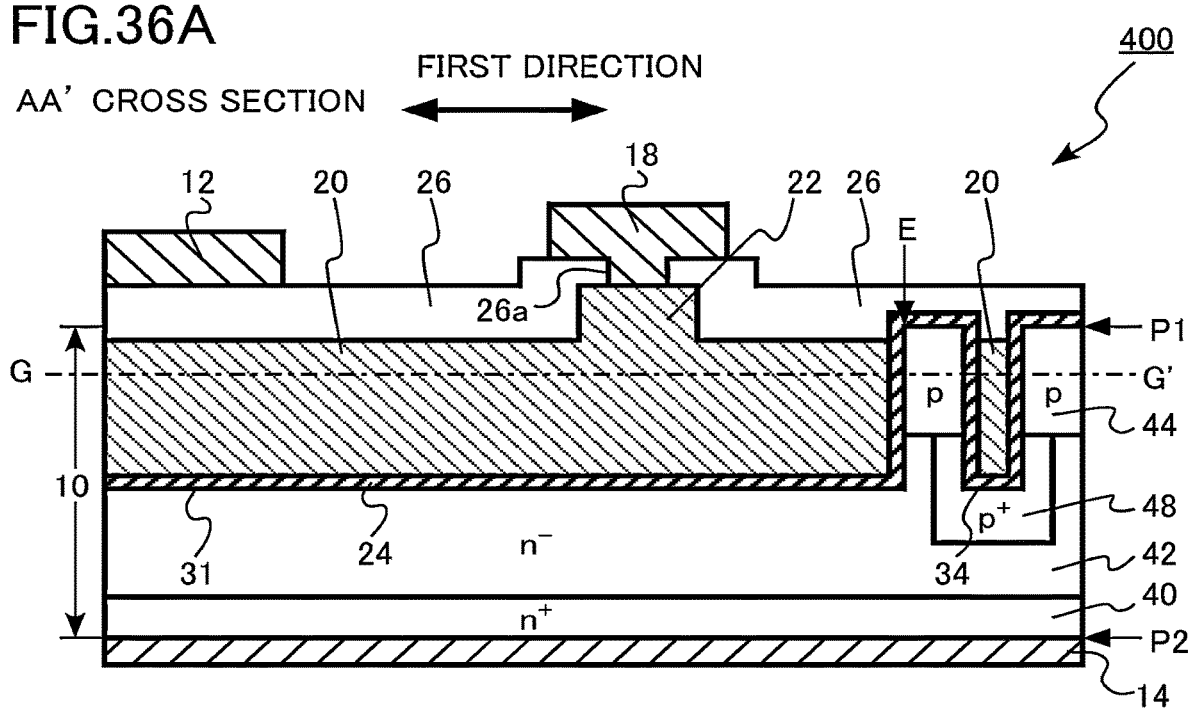
FIG.36A AA' CROSS SECTION
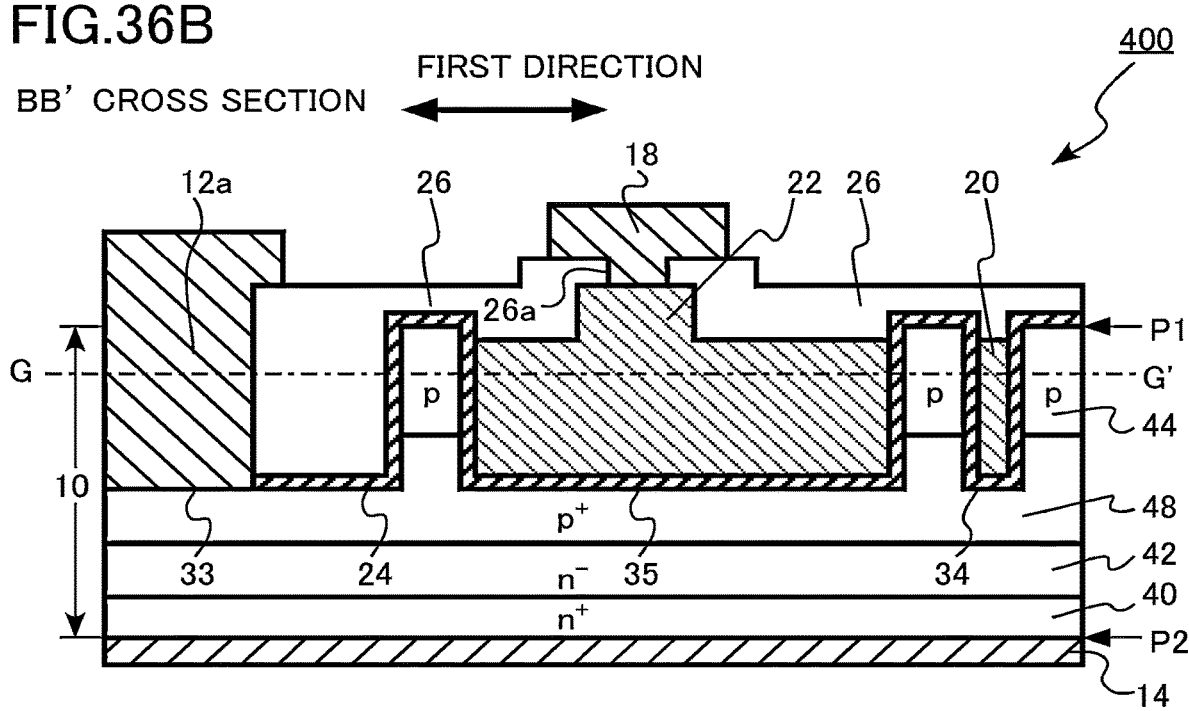
FIG.36B BB' CROSS SECTION

CC' CROSS SECTION

SECOND DIRECTION

DD' CROSS SECTION

SECOND DIRECTION

EE' CROSS SECTION

SECOND DIRECTION

FF' CROSS SECTION

SECOND DIRECTION

AA' CROSS SECTION

BB' CROSS SECTION

CC' CROSS SECTION

SECOND DIRECTION

DD' CROSS SECTION

SECOND DIRECTION

EE' CROSS SECTION

SECOND DIRECTION

FF' CROSS SECTION

SECOND DIRECTION

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2020-206239, filed on Dec. 11, 2020, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected as a material for next-generation semiconductor devices. As compared with silicon, the silicon carbide has superior physical properties such as an approximately threefold band gap, approximately tenfold breakdown field strength, and approximately threefold thermal conductivity. By using these physical properties, a semiconductor device in which low loss and a high-temperature operation are enabled can be realized.

In a vertical metal oxide semiconductor field effect transistor (MOSFET), in order to realize low on-resistance, a trench gate structure in which a gate electrode is provided in a trench is applied. By applying the trench gate structure, a channel area per unit area is increased and the on-resistance is reduced.

When the trench gate structure is applied, there is a method in which the gate electrode in the trench is drawn to the outside of the trench by a gate wiring, and a gate voltage is applied to the drawn gate wiring. In this case, an electric field may concentrate on a gate insulating layer at an end of the trench, and reliability of the gate insulating layer may decrease.

BRIEF DESCRIPTION OF THE DRAWINGS

FIGS. 4A and 4B are schematic cross-sectional views of the semiconductor device according to the first embodiment;

FIGS. 26A and 26B are schematic cross-sectional views of the semiconductor device according to the second embodiment;

FIGS. 31A and 31B are schematic cross-sectional views of the semiconductor device according to the third embodiment;

FIGS. 36A and 36B are schematic cross-sectional views of the semiconductor device according to the fourth embodiment;

DETAILED DESCRIPTION

Figure 1:
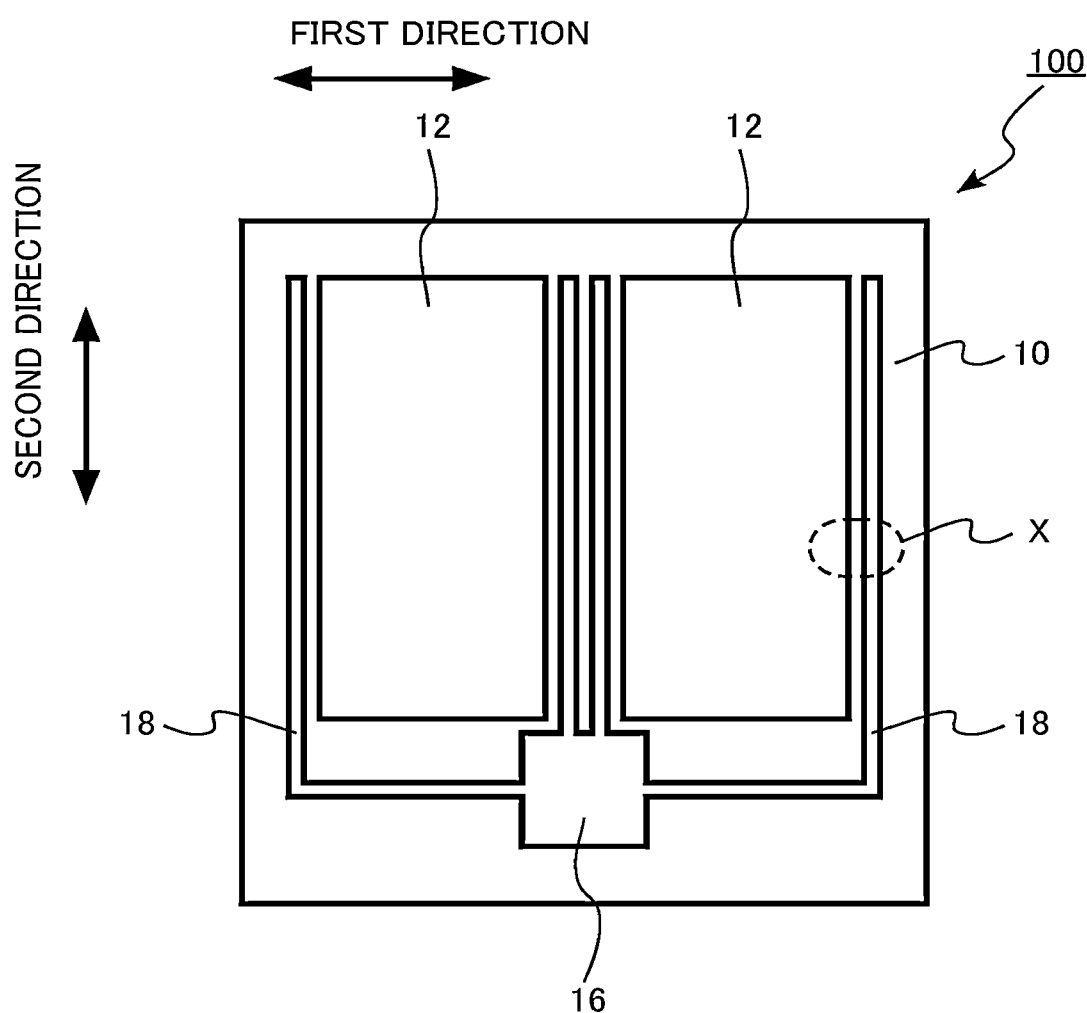
FIG. 1 is a schematic top view of a semiconductor device according to a first embodiment.

A semiconductor device according to an embodiment includes: a silicon carbide layer having a first plane parallel to a first direction and a second direction orthogonal to the first direction, and a second plane facing the first plane, the silicon carbide layer including a first trench provided on a side of the first plane and extending in the first direction, a second trench provided on the side of the first plane, the second trench extending in the first direction, and the second trench separated from the first trench in the second direction, an n-type first silicon carbide region, a p-type second silicon carbide region provided between the first silicon carbide region and the first plane and provided between the first trench and the second trench, and an n-type third silicon carbide region provided between the second silicon carbide region and the first plane and provided between the first trench and the second trench; a gate electrode provided in the first trench and the second trench; a gate insulating layer provided between the gate electrode and the silicon carbide layer; a gate wiring extending in the second direction, the gate wiring intersecting with the first trench and the second trench, the gate wiring connected to the gate electrode, and the gate wiring made of a same material as the gate electrode; a first electrode provided on the side of the first plane of the silicon carbide layer and electrically connected to the third silicon carbide region; a second electrode provided on a side of the second plane of the silicon carbide layer; and an interlayer insulating layer provided between the gate electrode and the first electrode. Neither the gate electrode nor the gate wiring is present between an end of the first trench in the first direction and the interlayer insulating layer.

Hereinafter, embodiments of the present disclosure will be described with reference to the drawings. In the following description, the same or similar members are denoted by the same reference numerals and the description of the members described once may be appropriately omitted.

Further, in the following description, when notations $n^+$, n, $n^-$, $p^+$, p, and $p^-$ are used, these notations represent the relative magnitudes of impurity concentrations in respective conductive types. That is, an n-type impurity concentration of $n^+$ is relatively higher than an n-type impurity concentration of n and an n-type impurity concentration of $n^-$ is relatively lower than the n-type impurity concentration of n. Further, a p-type impurity concentration of $p^+$ is relatively higher than a p-type impurity concentration of p and a p-type impurity concentration of $p^-$ is relatively lower than the p-type impurity concentration of p. The $n^+$ type and the $n^-$ type may be simply described as the n types and the $p^+$ type and the $p^-$ type may be simply described as the p types.

The impurity concentration can be measured by secondary ion mass spectrometry (SIMS), for example. In addition, the relative magnitude of the impurity concentration can be determined from the magnitude of a carrier concentration obtained by scanning capacitance microscopy (SCM), for example. In addition, a distance such as a width or a depth of an impurity region can be obtained by SIMS, for example. Further, the distance such as the width or the depth of the impurity region can be obtained from an SCM image, for example.

The depth of the trench, the width of the trench, the thickness of an insulating layer, and the like can be measured on an SIMS or transmission electron microscope (TEM) image, for example.

In the present specification, a "p-type impurity concentration" of a p-type silicon carbide region means a net p-type impurity concentration obtained by subtracting an n-type impurity concentration of the p-type silicon carbide region from the p-type impurity concentration of the p-type silicon carbide region. Further, an "n-type impurity concentration" of an n-type silicon carbide region means a net n-type impurity concentration obtained by subtracting a p-type impurity concentration of the n-type silicon carbide region from the n-type impurity concentration of the n-type silicon carbide region.

First Embodiment

A semiconductor device according to a first embodiment includes: a silicon carbide layer having a first plane parallel to a first direction and a second direction orthogonal to the first direction, and a second plane facing the first plane, the silicon carbide layer including a first trench provided on a side of the first plane and extending in the first direction, a second trench provided on the side of the first plane, the second trench extending in the first direction, and the second trench separated from the first trench in the second direction, an n-type first silicon carbide region, a p-type second silicon carbide region provided between the first silicon carbide region and the first plane and provided between the first trench and the second trench, and an n-type third silicon carbide region provided between the second silicon carbide region and the first plane and provided between the first trench and the second trench; a gate electrode provided in the first trench and the second trench; a gate insulating layer provided between the gate electrode and the silicon carbide layer; a gate wiring extending in the second direction, the gate wiring intersecting with the first trench and the second trench, the gate wiring connected to the gate electrode, and the gate wiring made of a same material as the gate electrode; a first electrode provided on the side of the first plane of the silicon carbide layer and electrically connected to the third silicon carbide region; a second electrode provided on a side of the second plane of the silicon carbide layer; and an interlayer insulating layer provided between the gate electrode and the first electrode. Neither the gate electrode nor the gate wiring is present between an end of the first trench in the first direction and the interlayer insulating layer.

The semiconductor device according to the first embodiment is a vertical MOSFET 100 using silicon carbide. The MOSFET 100 is a MOSFET having a trench gate structure in which a gate electrode is provided in a trench. Further, the MOSFET 100 is a MOSFET having so-called double trench structure in which a source electrode is provided in a trench. Further, the MOSFET 100 is an n-channel MOSFET using electrons as carriers.

Figure 2:
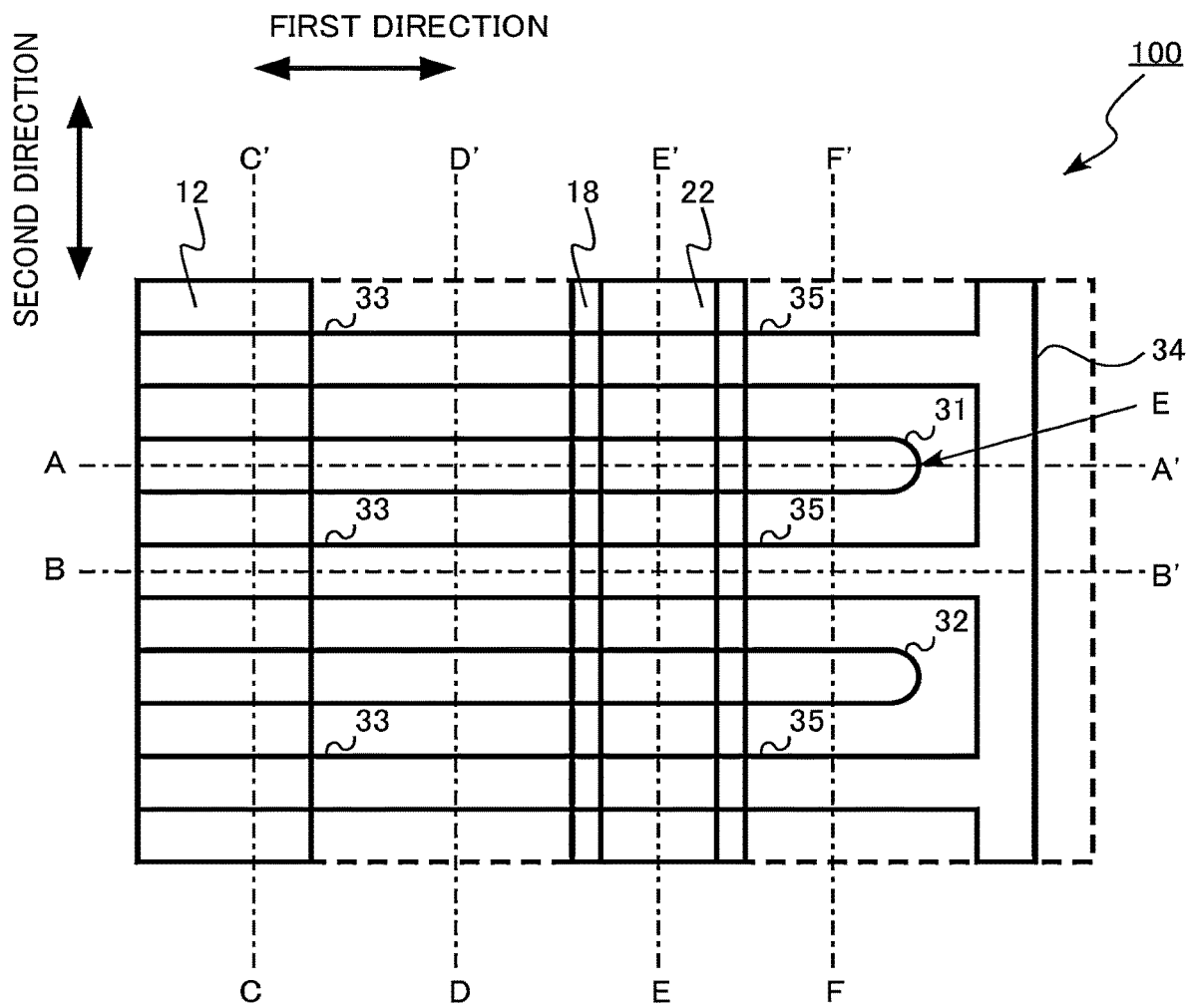
FIG. 2 is an enlarged schematic top view of the semiconductor device according to the first embodiment.

FIG. 1 is a schematic top view of the semiconductor device according to the first embodiment. FIG. 2 is an enlarged schematic top view of the semiconductor device according to the first embodiment. FIG. 2 is an enlarged view of a region X surrounded by a dotted line in FIG. 1. FIG. 2 illustrates a pattern layout of a trench, a source electrode, a gate wiring, and a metal wiring.

Figure 3:
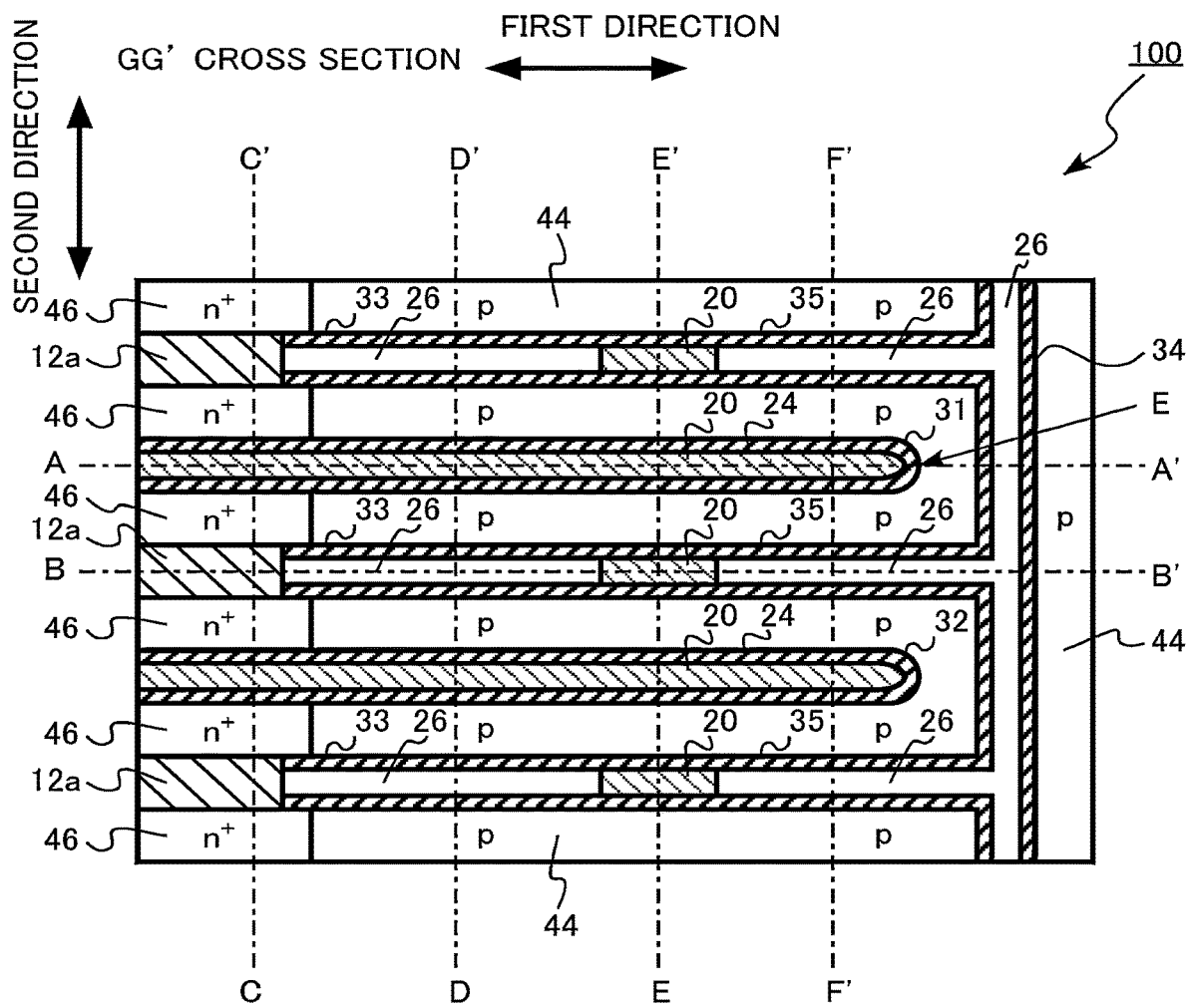
FIG. 3 is a schematic cross-sectional view of the semiconductor device according to the first embodiment.
Figure 5A:
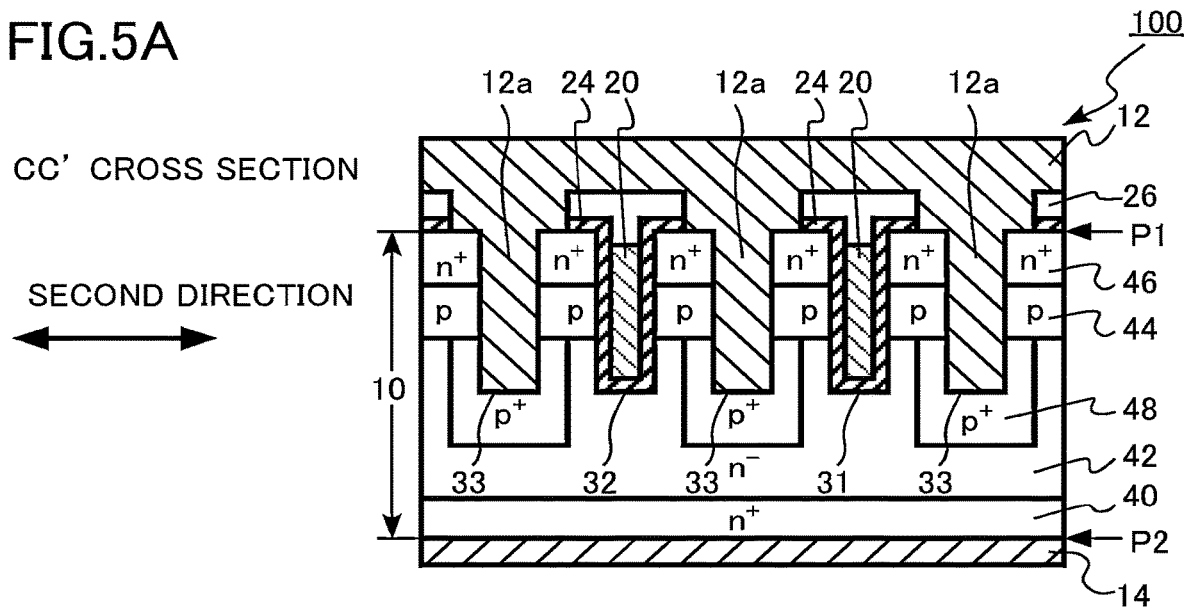
FIGS. 5A and 5B are schematic cross-sectional views of the semiconductor device according to the first embodiment.
Figure 5B:
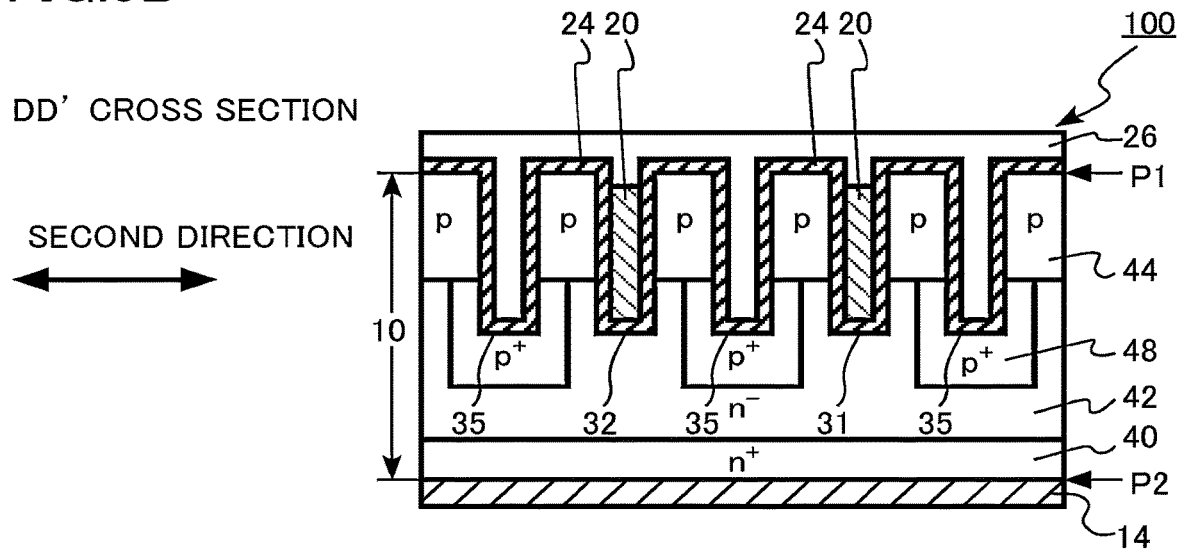
Figure 6A:
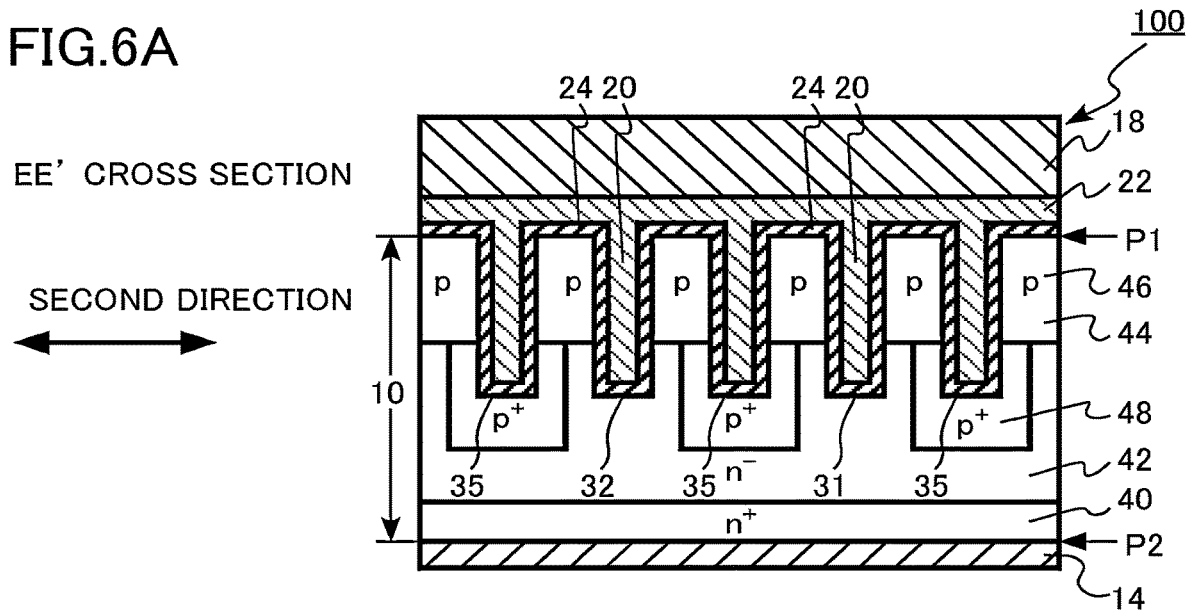
FIGS. 6A and 6B are schematic cross-sectional views of the semiconductor device according to the first embodiment.
Figure 6B:
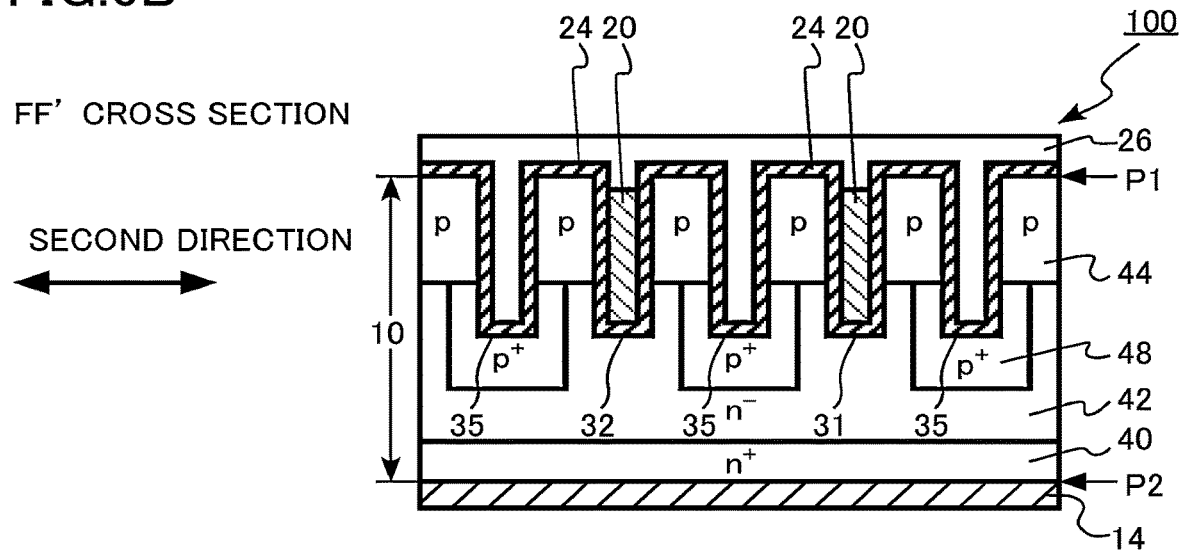

FIGS. 3, 4A, 4B, 5A, 5B, 6A, and 6B are schematic cross-sectional views of the semiconductor device according to the first embodiment. FIG. 3 is a cross-sectional view taken along the line GG' of FIGS. 4A and 4B. FIG. 4A is a cross-sectional view taken along the line AA' of FIGS. 2 and 3. FIG. 4B is a cross-sectional view taken along the line BB' of FIGS. 2 and 3. FIG. 5A is a cross-sectional view taken along the line CC' of FIGS. 2 and 3. FIG. 5B is a cross-sectional view taken along the line DD' of FIGS. 2 and 3. FIG. 6A is a cross-sectional view taken along the line EE' of FIGS. 2 and 3. FIG. 6B is a cross-sectional view taken along the line FF' of FIGS. 2 and 3.

The MOSFET 100 includes a silicon carbide layer 10, a source electrode 12 (first electrode), a drain electrode 14 (second electrode), a gate electrode pad 16, a metal wiring 18, a gate electrode 20, a gate wiring 22, a gate insulating layer 24, and an interlayer insulating layer 26. The source electrode 12 has a contact region 12a. The interlayer insulating layer 26 has a contact hole 26a.

The source electrode 12 is an example of the first electrode. The drain electrode 14 is an example of the second electrode.

The silicon carbide layer 10 includes a first gate trench 31 (first trench), a second gate trench 32 (second trench), a contact trench 33 (third trench), an outer peripheral trench 34 (fourth trench), an intermediate trench 35 (fifth trench), an n$^+$-type drain region 40, an n$^-$-type drift region 42 (first silicon carbide region), a p-type body region 44 (second silicon carbide region), an n'-type source region 46 (third silicon carbide region), and a p$^+$-type electric field relaxation region 48 (fourth silicon carbide region).

The first gate trench 31 is an example of the first trench. The second gate trench 32 is an example of the second trench. The contact trench 33 is an example of the third trench. The outer peripheral trench 34 is an example of the fourth trench. The intermediate trench 35 is an example of the fifth trench. The drift region 42 is an example of the first silicon carbide region. The body region 44 is an example of the second silicon carbide region. The source region 46 is an example of the third silicon carbide region. The electric field relaxation region 48 is an example of the fourth silicon carbide region.

The silicon carbide layer 10 is disposed between the source electrode 12 and the drain electrode 14. The silicon carbide layer 10 includes a first plane ("P1" in FIG. 1) and a second plane ("P2" in FIG. 1). Hereinafter, the first plane P1 is also referred to as a face and the second plane P2 is also referred to as a back face. The second plane P2 faces the first plane P1.

A first direction and a second direction are directions parallel to the first plane P1. Further, the second direction is a direction orthogonal to the first direction.

Hereinafter, a "depth" means a depth based on the first plane P1.

The silicon carbide layer 10 is single crystal SiC. The silicon carbide layer 10 is, for example, 4H—SiC. A thickness of the silicon carbide layer 10 is, for example, 5 μm or more and 500 μm or less.

Figure 7:
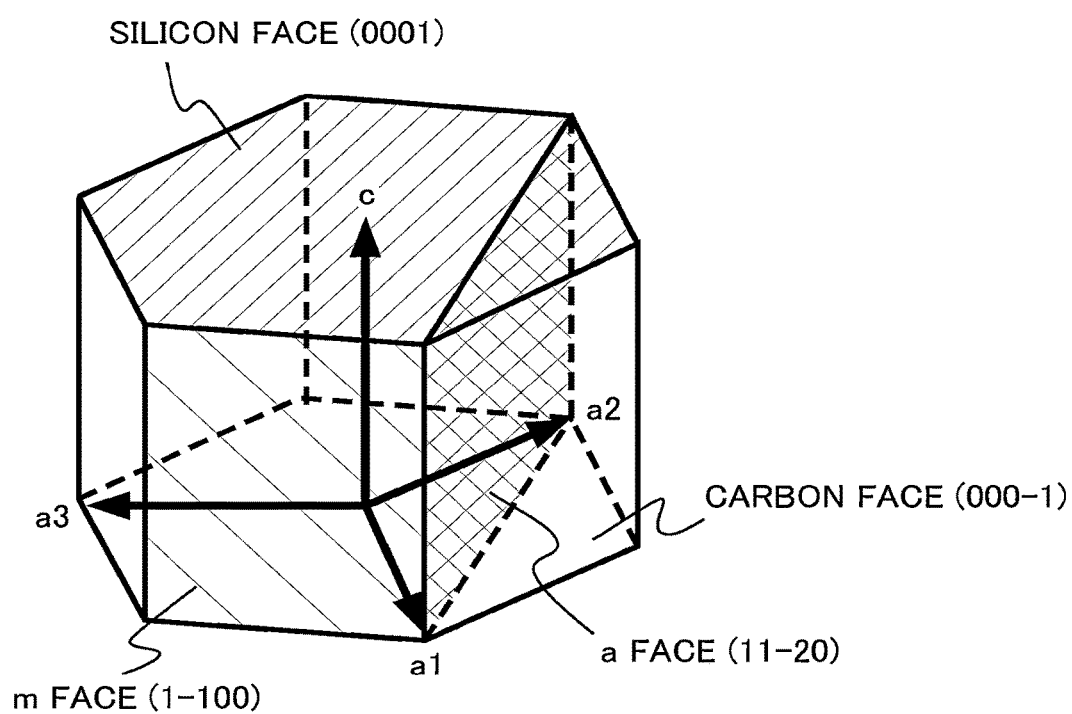
FIG. 7 is a diagram illustrating a crystal structure of a SiC semiconductor.

FIG. 7 is a diagram illustrating a crystal structure of a SiC semiconductor. A typical crystal structure of the SiC semiconductor is a hexagonal crystal system such as 4H—SiC. One of faces (top faces of a hexagonal column) with a c axis along an axial direction of the hexagonal column as a normal is a (0001) face. A face equivalent to the (0001) face is referred to as a silicon face (Si face) and expressed as a {0001} face. Silicon atoms (Si) are arranged on an outermost face of the silicon face.

The other of the faces (top faces of the hexagonal column) with the c axis along the axial direction of the hexagonal column as the normal is a (000-1) face. A face equivalent to the (000-1) face is referred to as a carbon face (C face) and expressed as a {000-1} face. Carbon atoms (C) are arranged on an outermost face of the carbon face.

A side face (column face) of the hexagonal column is an m face which is a face equivalent to a (1-100) face, that is, a {1-100} face. A normal direction of the {1-100} face is a <1-100> direction.

Further, a face passing through a pair of ridge lines not adjacent to each other is an a-face which is a face equivalent to a (11-20) face, that is, a {11-20} face. A normal direction of the {11-20} face is a <11-20> direction. Both the silicon atoms (Si) and the carbon atoms (C) are arranged on outermost faces of the m face and the a face.

The first plane P1 is, for example, a plane inclined by 0° or more and 8° or less with respect to a (0001) face. That is, the first plane is a plane in which a normal is inclined by 0° or more and 8° or less with respect to a c axis in a [0001] direction. In other words, an off angle with respect to the (0001) face is 0° or more and 8° or less. Further, the second plane P2 is, for example, a plane inclined by 0° or more and 8° or less with respect to the (000-1) face.

An inclination direction of each of the first plane P1 and the second plane P2 is, for example, a <11-20> direction. The <11-20> direction is an a-axis direction. In FIGS. 1, 2, 3, 4A, 4B, 5A, and 5B, for example, the first direction illustrated in the drawings is a direction inclined by 0° or more and 8° or less with respect to the <11-20> direction.

The first gate trench 31 is provided on the side of the first plane P1 of the silicon carbide layer 10. The first gate trench 31 is a groove formed in the silicon carbide layer 10.

As illustrated in FIGS. 2 and 3, the first gate trench 31 extends in the first direction. The first gate trench 31 has an end (E in FIGS. 2, 3, and 4A) in the first direction.

The first gate trench 31 penetrates the source region 46 and the body region 44.

The second gate trench 32 is provided on the side of the first plane P1 of the silicon carbide layer 10. The second gate trench 32 is a groove formed in the silicon carbide layer 10.

As illustrated in FIGS. 2 and 3, the first gate trench 31 extends in the first direction. The second gate trench 32 is provided to be separated from the first gate trench 31 in the second direction.

The second gate trench 32 penetrates the source region 46 and the body region 44.

A plurality of gate trenches including the first gate trench 31 and the second gate trench 32 are repeatedly disposed in the second direction. The depth of the gate trench is, for example, 1 μm or more and 2 μm or less. The width of the gate trench in the second direction is, for example, 0.5 μm or more and 1 μm or less.

The contact trench 33 is provided on the side of the first plane P1 of the silicon carbide layer 10. The contact trench 33 is a groove formed in the silicon carbide layer 10.

The contact trench 33 extends in the first direction as illustrated in FIGS. 2 and 3. The contact trench 33 is provided between the two gate trenches. One of the contact trenches 33 is provided, for example, between the first gate trench 31 and the second gate trench 32.

The contact trench 33 penetrates the source region 46 and the body region 44.

The contact trench 33 is repeatedly disposed in the second direction as illustrated in FIGS. 2 and 3. The depth of the contact trench 33 is, for example, 1 μm or more and 2 μm or less. The width of the contact trench 33 in the second direction is, for example, 0.5 μm or more and 1 μm or less.

The width of the contact trench 33 in the second direction and the width of the first gate trench 31 in the second direction are, for example, the same. The depth of the contact trench 33 and the depth of the first gate trench 31 are, for example, the same.

A distance between the first gate trench 31 and the contact trench 33 in the second direction is, for example, 0.5 μm or more and 1 μm or less.

The outer peripheral trench 34 is provided on the side of the first plane P1 of the silicon carbide layer 10. The outer peripheral trench 34 is a groove formed in the silicon carbide layer 10.

The outer peripheral trench 34 is provided, for example, so as to surround the outer periphery of the gate trenches. A part of the outer peripheral trench 34 extends in the second direction as illustrated in FIGS. 2 and 3. A part of the outer peripheral trench 34 is separated from the first gate trench 31 and the second gate trench 32 in the first direction.

The depth of the outer peripheral trench 34 is, for example, 1 μm or more and 2 μm or less. The width of the outer peripheral trench 34 in the first direction is, for example, 0.5 μm or more and 1 μm or less.

The width of the outer peripheral trench 34 in the first direction and the width of the contact trench 33 in the second direction are, for example, the same. The depth of the outer peripheral trench 34 and the depth of the contact trench 33 are, for example, the same.

A distance between the first gate trench 31 and the outer peripheral trench 34 in the first direction is, for example, 0.5 μm or more and 1 μm or less.

The intermediate trench 35 is provided on the side of the first plane P1 of the silicon carbide layer 10. The intermediate trench 35 is a groove formed in the silicon carbide layer 10.

As illustrated in FIGS. 2 and 3, the intermediate trench 35 extends in the first direction. The intermediate trench 35 is provided between two gate trenches. One of the intermediate trenches 35 is provided, for example, between the first gate trench 31 and the second gate trench 32.

The intermediate trench 35 is provided between the contact trench 33 and the outer peripheral trench 34. The contact trench 33, the outer peripheral trench 34, and the intermediate trench 35 are continuously provided. The contact trench 33, the outer peripheral trench 34, and the intermediate trench 35 are grooves that are continuously provided.

The intermediate trench 35 penetrates the source region 46 and the body region 44.

As illustrated in FIGS. 2 and 3, the intermediate trench 35 is repeatedly disposed in the second direction. The depth of the intermediate trench 35 is, for example, 1 μm or more and 2 μm or less. The width of the intermediate trench 35 in the second direction is, for example, 0.5 μm or more and 1 μm or less.

The width of the intermediate trench 35 in the second direction and the width of the first gate trench 31 in the second direction are, for example, the same. The depth of the intermediate trench 35 and the depth of the first gate trench 31 are, for example, the same. The depth of the intermediate trench 35 and the depths of the contact trench 33 and the outer peripheral trench 34 are, for example, the same.

A distance between the first gate trench 31 and the intermediate trench 35 in the second direction is, for example, 0.5 μm or more and 1 μm or less.

The gate electrode 20 is provided in the first gate trench 31 and the second gate trench 32. The gate electrode 20 is provided between the source electrode 12 and the drain electrode 14. The gate electrode 20 extends in the first direction in the first gate trench 31 and the second gate trench 32.

A part of the gate electrode 20 is provided in the intermediate trench 35.

The gate electrode 20 is a conductive layer. The gate electrode 20 is, for example, polycrystalline silicon including p-type impurities or n-type impurities.

The gate insulating layer 24 is provided between the gate electrode 20 and the silicon carbide layer 10.

The gate insulating layer 24 is provided between the source region 46, the body region 44, and the drift region 42 and the gate electrode 20.

For example, as illustrated in FIG. 6A, the gate insulating layer 24 is provided on the first plane P1 between the first gate trench 31 and the second gate trench 32. For example, as illustrated in FIG. 6A, the gate insulating layer 24 is provided on the first plane P1 between the first gate trench 31 and the intermediate trench 35.

The gate insulating layer 24 is, for example, silicon oxide. For example, a high dielectric material such as HfSiON, ZrSiON, or AlON can be applied to the gate insulating layer 24. Further, for example, a stacked film of silicon oxide and a high dielectric material can also be applied to the gate insulating layer 24.

The gate wiring 22 is provided so as to cross the first gate trench 31, the second gate trench 32, and the intermediate trench 35. The gate wiring 22 extends in the second direction.

The gate wiring 22 is provided above the gate electrode 20. The gate wiring 22 is connected to the gate electrode 20. The gate wiring 22 electrically connects the gate electrode 20 in the first gate trench 31 and the gate electrode 20 in the second gate trench 32.

The gate wiring 22 is a conductive layer. The gate wiring 22 is, for example, polycrystalline silicon including p-type impurities or n-type impurities.

The gate electrode 20 and the gate wiring 22 are made of the same material. The material of the gate electrode 20 and the material of the gate wiring 22 are the same material. The gate electrode 20 and the gate wiring 22 are, for example, polycrystalline silicon.

For example, the gate insulating layer 24 is provided between the first plane P1 between the first gate trench 31 and the second gate trench 32 and the gate wiring 22. The gate wiring 22 is in contact with, for example, the gate insulating layer 24. For example, the gate insulating layer 24 is in contact with the first plane P1 between the first gate trench 31 and the second gate trench 32.

For example, the gate insulating layer 24 is provided between the first plane P1 between the first gate trench 31 and the intermediate trench 35 and the gate wiring 22. The gate wiring 22 is in contact with, for example, the gate insulating layer 24. For example, the gate insulating layer 24 is in contact with the first plane P1 between the first gate trench 31 and the intermediate trench 35.

The interlayer insulating layer 26 is provided on the gate electrode 20 and the gate wiring 22. The interlayer insulating layer 26 is provided, for example, between the gate electrode 20 and the source electrode 12.

The thickness of the interlayer insulating layer 26 is larger than the thickness of the gate insulating layer 24, for example. The interlayer insulating layer 26 is, for example, silicon oxide. The interlayer insulating layer 26 electrically isolates the gate electrode 20 and the source electrode 12.

A part of the interlayer insulating layer 26 is provided in the outer peripheral trench 34 and the intermediate trench 35. A part of the interlayer insulating layer 26 is embedded in the outer peripheral trench 34 and the intermediate trench 35.

As illustrated in FIG. 4A, neither the gate electrode 20 nor the gate wiring 22 is present between the end E of the first gate trench 31 in the first direction and the interlayer insulating layer 26. For example, the gate insulating layer 24 and the interlayer insulating layer 26 are in contact with each other at the end E of the first gate trench 31 in the first direction.

The source electrode 12 is provided on the side of the first plane P1 of the silicon carbide layer 10. The source electrode 12 is provided on the first plane P1 of the silicon carbide layer 10. The source electrode 12 is electrically connected to the source region 46, the body region 44, and the electric field relaxation region 48.

The contact region 12a to be a part of the source electrode 12 is provided in the contact trench 33. The contact region 12a is in contact with the source region 46 on the side face of the contact trench 33. The contact region 12a is in contact with the electric field relaxation region 48 on the side face and the bottom face of the contact trench 33. The contact region 12a is electrically connected to the source region 46, the body region 44, and the electric field relaxation region 48.

The source electrode 12 includes a metal. The metal forming the source electrode 12 has a stacked structure of titanium (Ti) and aluminum (Al), for example. The source electrode 12 may include metal silicide or metal carbide in contact with the silicon carbide layer 10, for example.

For example, a source voltage is applied to the source electrode 12. The source voltage is, for example, 0 V.

The metal wiring 18 is provided on the side of the first plane P1 of the silicon carbide layer 10. The metal wiring 18 includes a metal.

As illustrated in FIGS. 1 and 2, the metal wiring 18 extends, for example, in the second direction. The metal wiring 18 is electrically connected to the gate electrode pad 16.

The metal wiring 18 is isolated from the source electrode 12. The metal wiring 18 is electrically isolated from the source electrode 12.

The metal wiring 18 includes a metal. The metal forming the source electrode 12 has a stacked structure of titanium (Ti) and aluminum (Al), for example.

The metal wiring 18 is formed of, for example, the same material as the source electrode 12. The material of the metal wiring 18 is the same as the material of the source electrode 12.

The metal wiring 18 and the source electrode 12 are simultaneously formed, for example, by patterning the formed conductive film. The metal wiring 18 and the source electrode 12 are separated by patterning.

The metal wiring 18 is provided on the gate wiring 22. The metal wiring 18 is electrically connected to the gate wiring 22. As illustrated in FIGS. 4A and 4B, the metal wiring 18 is electrically connected to the gate wiring 22 via the contact hole 26a provided in the interlayer insulating layer 26 on the gate wiring 22. The metal wiring 18 is in contact with, for example, the gate wiring 22.

The drain electrode 14 is provided on the side of the second plane P2 of the silicon carbide layer 10. The drain electrode 14 is provided on the second plane P2 of the silicon carbide layer 10. The drain electrode 14 is in contact with the drain region 40. The drain electrode 14 is electrically connected to the drain region 40.

The drain electrode 14 is, for example, a metal or a metal semiconductor compound. The drain electrode 14 includes a material selected from the group consisting of nickel silicide, titanium (Ti), nickel (Ni), silver (Ag), and gold (Au), for example.

For example, a drain voltage is applied to the drain electrode 14. The drain voltage is, for example, 500 V or more and 6000 V or less.

The gate electrode pad 16 is provided on the side of the first plane P1 of the silicon carbide layer 10. The gate electrode pad 16 is electrically connected to the metal wiring 18.

The gate electrode pad 16 is formed of, for example, the same material as the metal wiring 18 and the source electrode 12.

The gate electrode pad 16, the metal wiring 18, and the source electrode 12 are simultaneously formed, for example, by patterning the deposited conductive film. The gate electrode pad 16 is separated from the source electrode 12 by, for example, patterning.

A gate voltage for driving the MOSFET 100 is applied to the gate electrode pad 16. The gate voltage is, for example, 0 V or more and 30 V or less.

A gate voltage is applied from the gate electrode pad 16 to the gate electrode 20 via the metal wiring 18 and the gate wiring 22.

The n+-type drain region 40 is provided on the side of the second plane P2 of the silicon carbide layer 10.

The drain region 40 includes nitrogen (N) as n-type impurities, for example. An n-type impurity concentration of the drain region 40 is, for example, equal to or more than $1 \times 10^{18}$ cm$^{-3}$ and equal to or less than $1 \times 10^{21}$ cm$^{-3}$.

The n−-type drift region 42 is provided on the drain region 40. The drift region 42 is provided between the first plane P1 and the drain region 40.

The drift region 42 includes nitrogen (N) as n-type impurities, for example. An n-type impurity concentration of the drift region 42 is lower than the n-type impurity concentration of the drain region 40. The n-type impurity concentration of the drift region 42 is, for example, equal to or more than $4 \times 10^{14}$ cm$^{-3}$ and equal to or less than $1 \times 10^{18}$ cm$^{-3}$.

The p-type body region 44 is provided between the drift region 42 and the first plane P1. The body region 44 is provided between the first gate trench 31 and the second gate trench 32. The body region 44 is provided between the first gate trench 31 and the contact trench 33. The body region 44 is provided between the second gate trench 32 and the contact trench 33.

The body region 44 is provided between the first gate trench 31 and the outer peripheral trench 34. The body region 44 is provided between the second gate trench 32 and the outer peripheral trench 34.

The body region 44 functions as a channel formation region of the MOSFET 100. For example, when the MOSFET 100 is turned on, a channel through which electrons flow is formed in a region of the body region 44 in contact with the gate insulating layer 24. The region of the body region 44 in contact with the gate insulating layer 24 becomes the channel formation region.

The body region 44 includes aluminum (Al) as p-type impurities, for example. A p-type impurity concentration of the body region 44 is, for example, $5 \times 10^{16}$ cm$^{-3}$ or more and $5 \times 10^{17}$ cm$^{-3}$ or less.

The depth of the body region 44 is shallower than the depths of the first gate trench 31 and the second gate trench 32. A depth of the body region 44 is, for example, 0.4 μm or more and 1.0 μm or less.

The n+-type source region 46 is provided between the body region 44 and the first plane P1. The source region 46 is provided between the first gate trench 31 and the second gate trench 32. The source region 46 is provided between the first gate trench 31 and the contact trench 33. The source region 46 is provided between the second gate trench 32 and the contact trench 33.

The source region 46 is in contact with the source electrode 12. The source region 46 is in contact with the gate insulating layer 24.

The source region 46 includes phosphorus (P) as n-type impurities, for example. An n-type impurity concentration of the source region 46 is higher than the n-type impurity concentration of the drift region 42. The n-type impurity concentration of the source region 46 is, for example, $1 \times 10^{19}$ cm$^{-3}$ or more and $1 \times 10^{21}$ cm$^{-3}$ or less.

The depth of the source region 46 is shallower than the depth of the body region 44. The depth of the source region 46 is, for example, equal to or more than 0.3 μm and equal to or less than 0.6 μm.

The p+-type electric field relaxation region 48 is provided between the contact trench 33 and the drift region 42. The electric field relaxation region 48 is in contact with the bottom face of the contact trench 33. The electric field relaxation region 48 is in contact with the contact region 12a of the source electrode 12.

The electric field relaxation region 48 is provided between the outer peripheral trench 34 and the drift region 42. The electric field relaxation region 48 is in contact with the bottom face of the outer peripheral trench 34.

The electric field relaxation region 48 is provided between the intermediate trench 35 and the drift region 42. The intermediate trench 35 is in contact with the bottom face of the outer peripheral trench 34.

The electric field relaxation region 48 below the contact trench 33, the electric field relaxation region 48 below the intermediate trench 35, and the electric field relaxation region 48 below the outer peripheral trench 34 are continuous. The electric field relaxation region 48 below the contact trench 33 and the electric field relaxation region 48 below the intermediate trench 35 are in contact with each other. The electric field relaxation region 48 below the intermediate trench 35 and the electric field relaxation region 48 below the outer peripheral trench 34 are in contact with each other.

The electric field relaxation region 48 has a function of relaxing an electric field applied to the gate insulating layer 24 at the bottom of the gate trench when the MOSFET 100 is turned off. The electric field relaxation region 48 is fixed at the same electric potential as the source electrode 12, for example.

The electric field relaxation region 48 includes aluminum (Al) as p-type impurities, for example. The p-type impurity concentration of the electric field relaxation region 48 is higher than the p-type impurity concentration of the body region 44, for example. The p-type impurity concentration of the electric field relaxation region 48 is, for example, 10 times or more the p-type impurity concentration of the body region 44. A p-type impurity concentration of the electric field relaxation region 48 is, for example, equal to or more than $5 \times 10^{17}$ cm$^{-3}$ and equal to or less than $5 \times 10^{20}$ cm$^{-3}$.

Next, an example of a method for manufacturing the semiconductor device according to the first embodiment will be described.

FIGS. 8A to 20C are schematic cross-sectional views illustrating an example of the method for manufacturing the semiconductor device according to the first embodiment. FIGS. 8A, 9A, 10A, 11A, 12A, 13A, 14A, 15A, 16A, 17A, 18A, 19A, and 20A illustrate cross sections corresponding to FIG. 5A. FIGS. 8B, 9B, 10B, 11B, 12B, 13B, 14B, 15B, 16B, 17B, 18B, 19B, and 20B illustrate cross sections corresponding to FIG. 5B. FIGS. 8C, 9C, 10C, 11C, 12C, 13C, 14C, 15C, 16C, 17C, 18C, 19C, and 20C illustrate cross sections corresponding to FIG. 6A.

Figure 8A:
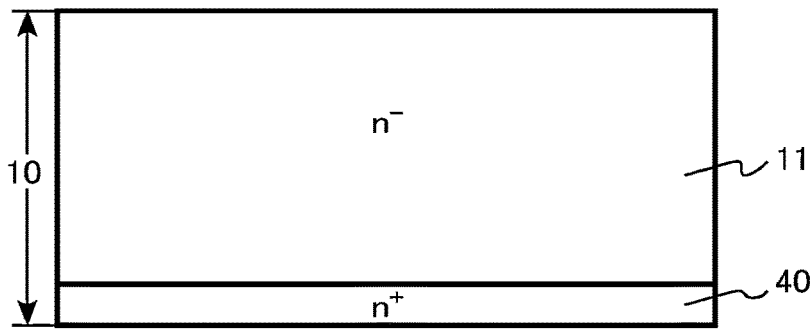
FIGS. 8A, 8B, and 8C are schematic cross-sectional views illustrating an example of a method for manufacturing the semiconductor device according to the first embodiment.
Figure 8B:
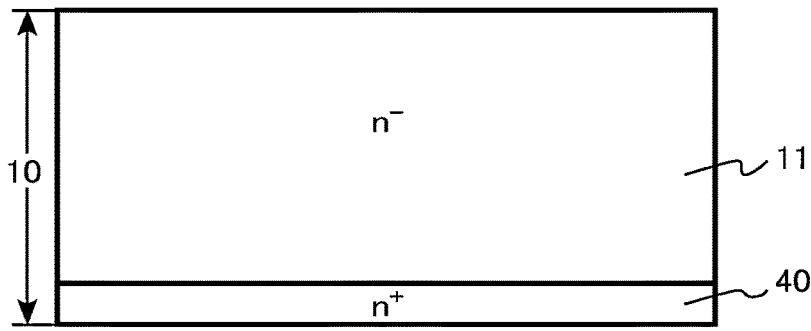
Figure 8C:
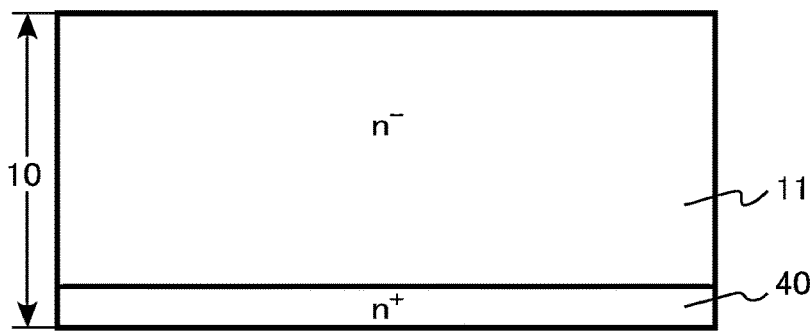

First, the silicon carbide layer 10 having the n+-type drain region 40 and an n−-type epitaxial layer 11 formed on the drain region 40 by epitaxial growth is prepared (FIGS. 8A, 8B, and 8C). A part of the epitaxial layer 11 finally becomes the drift region 42.

Figure 9A:
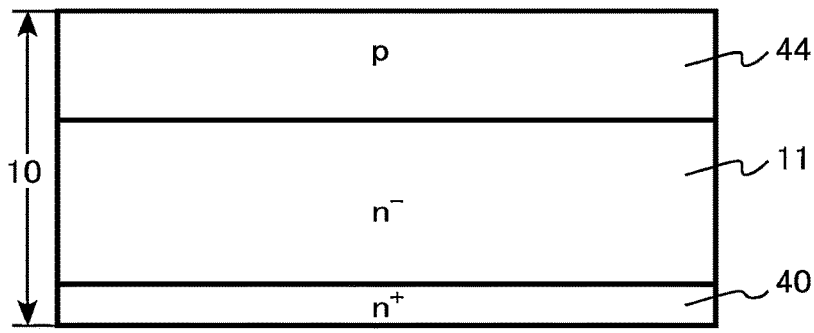
FIGS. 9A, 9B, and 9C are schematic cross-sectional views illustrating an example of the method for manufacturing the semiconductor device according to the first embodiment.
Figure 9B:
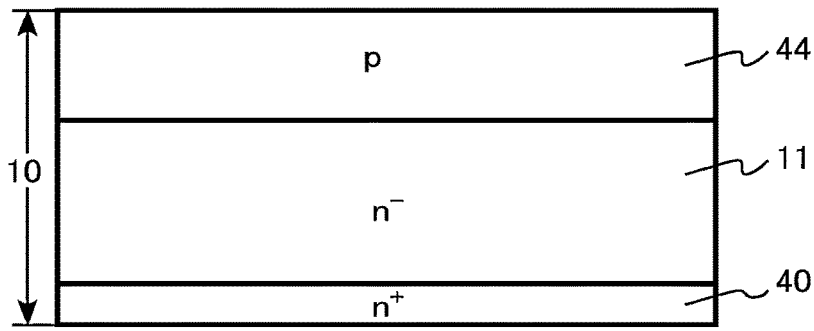
Figure 9C:
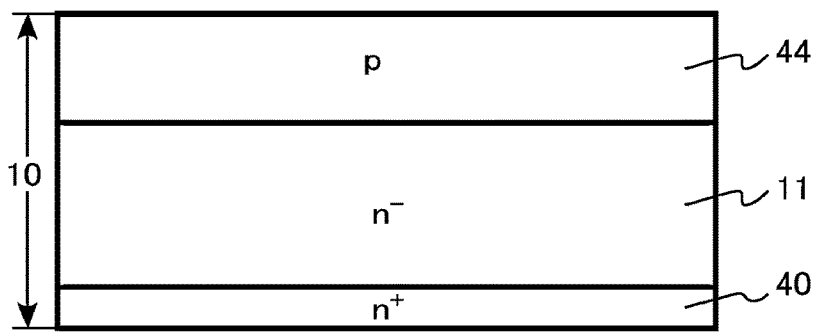

Next, a p-type body region 44 is formed in the epitaxial layer 11 (FIGS. 9A, 9B, and 9C). The body region 44 is formed, for example, by ion-implanting aluminum (Al) into the epitaxial layer 11.

Next, a mask material 50 is formed on the face of the silicon carbide layer 10. The mask material 50 is, for example, a photoresist.

Figure 10A:
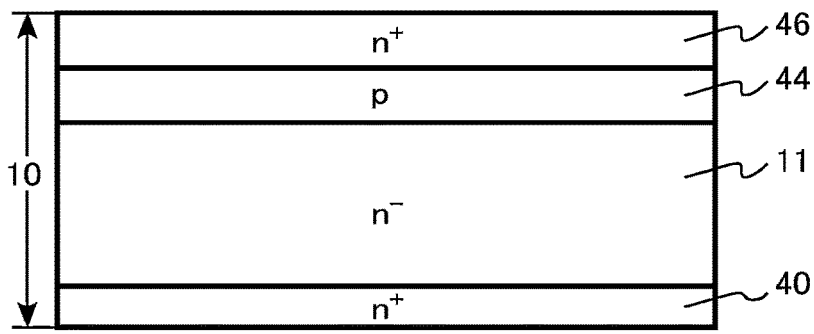
FIGS. 10A, 10B, and 10C are schematic cross-sectional views illustrating an example of the method for manufacturing the semiconductor device according to the first embodiment.
Figure 10B:
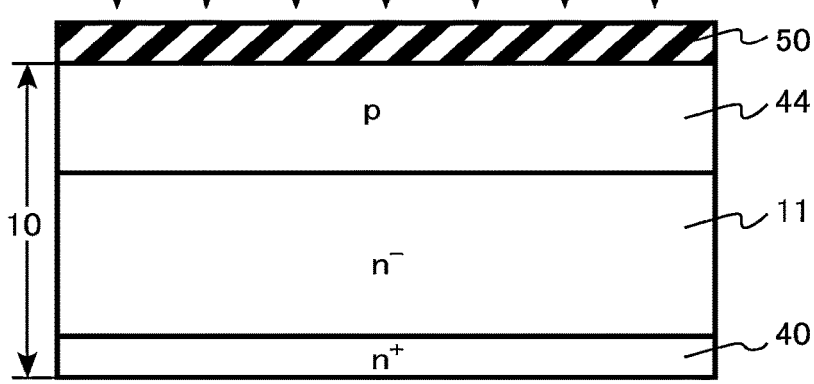
Figure 10C:
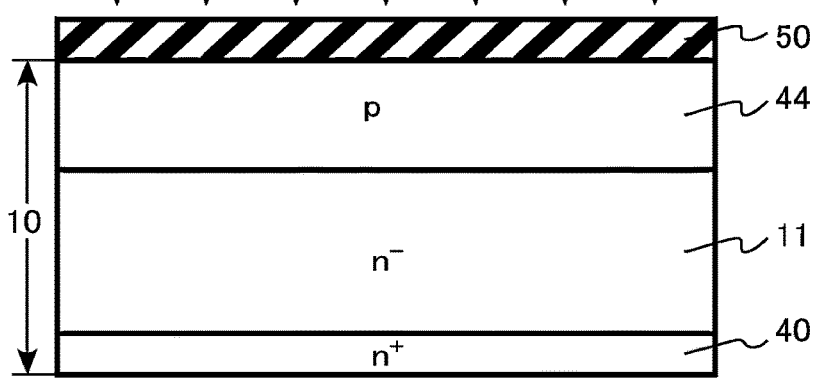

Next, the n+-type source region 46 is formed in the epitaxial layer 11 (FIG. 10A, FIG. 10B, and FIG. 10C). The source region 46 is formed, for example, by ion-implanting phosphorus (P) into the epitaxial layer 11 using the mask material 50 as a mask.

Next, the mask material 50 is removed. Next, a mask material 52 is formed on the face of the silicon carbide layer 10. The mask material 52 is formed by, for example, deposition of a film by a chemical vapor deposition method (CVD method) and patterning of a film using a lithography method and a reactive ion etching method (RIE method). The mask material 50 is, for example, silicon oxide.

Figure 11A:
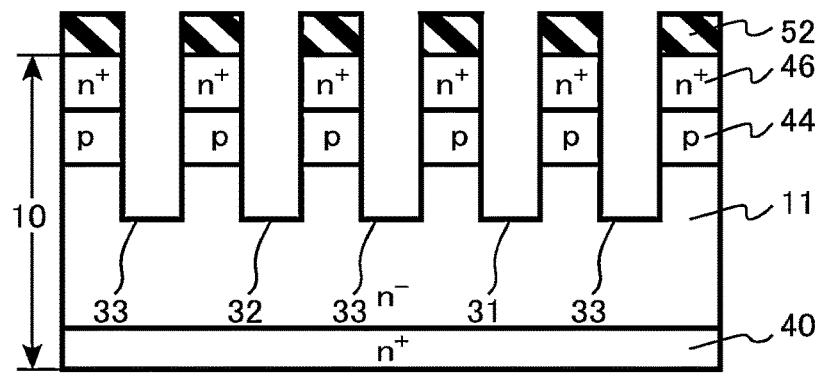
FIGS. 11A, 11B, and 11C are schematic cross-sectional views illustrating an example of the method for manufacturing the semiconductor device according to the first embodiment.
Figure 11B:
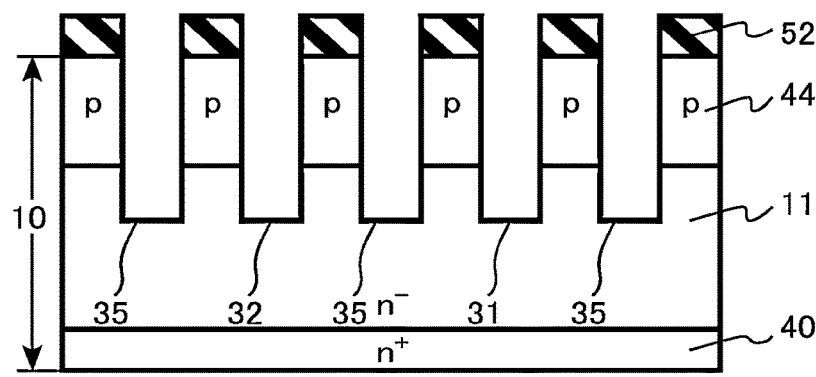
Figure 11C:
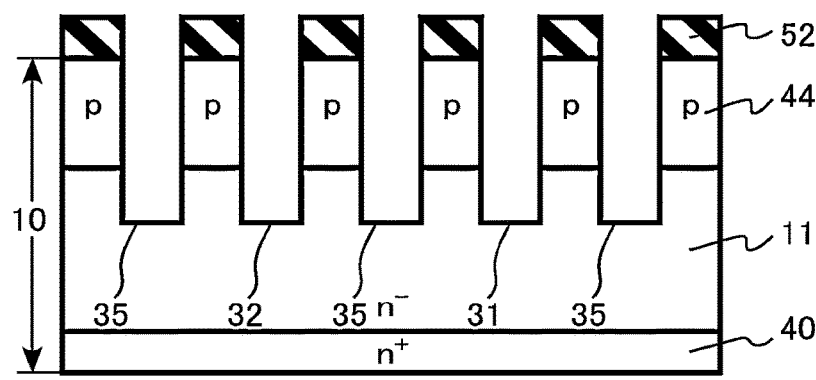

Next, the first gate trench 31, the second gate trench 32, the contact trench 33, the outer peripheral trench 34, and the intermediate trench 35 are formed (FIG. 11A, FIG. 11B, and FIG. 11C). The first gate trench 31, the second gate trench 32, the contact trench 33, the outer peripheral trench 34, and the intermediate trench 35 are formed by the RIE method using the mask material 52 as a mask.

Next, the mask material 52 is removed. The mask material 52 is removed by, for example, a wet etching method.

Next, a mask material 54 is formed on the face of the silicon carbide layer 10. The mask material 54 covers the first gate trench 31 and the second gate trench 32. The mask material 52 is, for example, a photoresist.

Figure 12A:
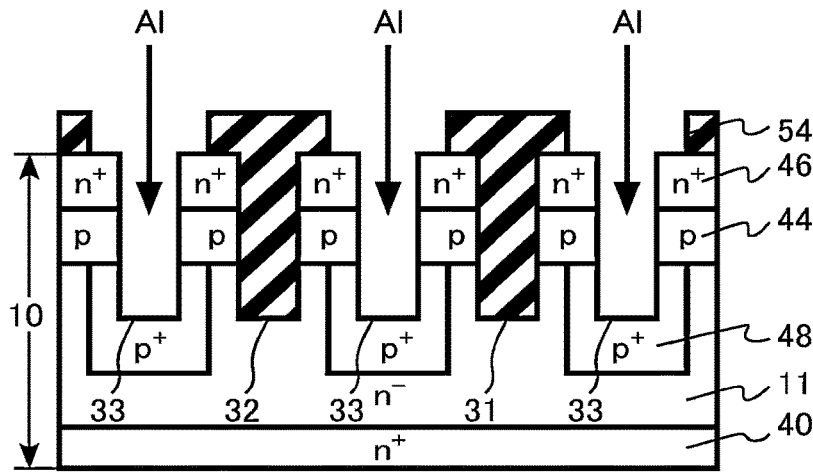
FIGS. 12A, 12B, and 12C are schematic cross-sectional views illustrating an example of the method for manufacturing the semiconductor device according to the first embodiment.
Figure 12B:
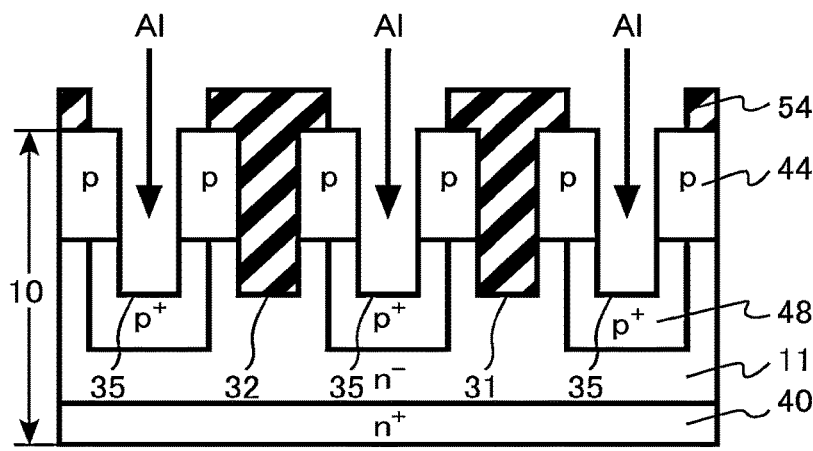
Figure 12C:
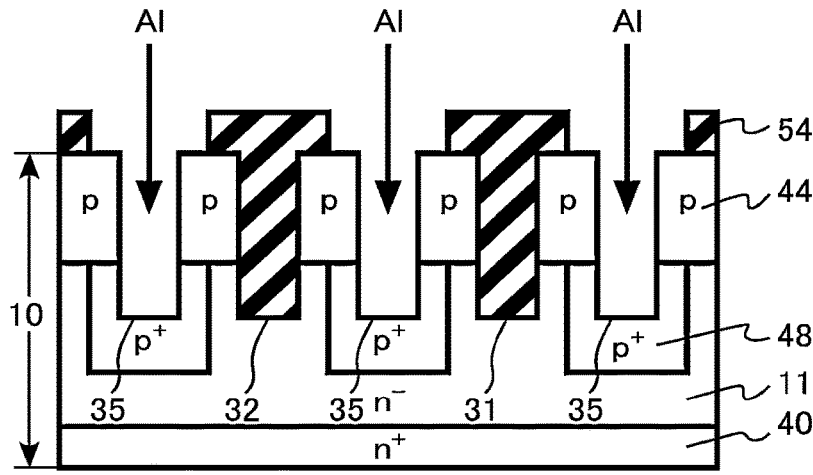

Next, the p$^+$-type electric field relaxation region 48 is formed (FIG. 12A, FIG. 12B, and FIG. 12C). The electric field relaxation region 48 is formed by implanting aluminum into the epitaxial layer 11 at the bottom of the contact trench 33, the outer peripheral trench 34, and the intermediate trench 35 by an ion implantation method using the mask material 54 as a mask.

Figure 13A:
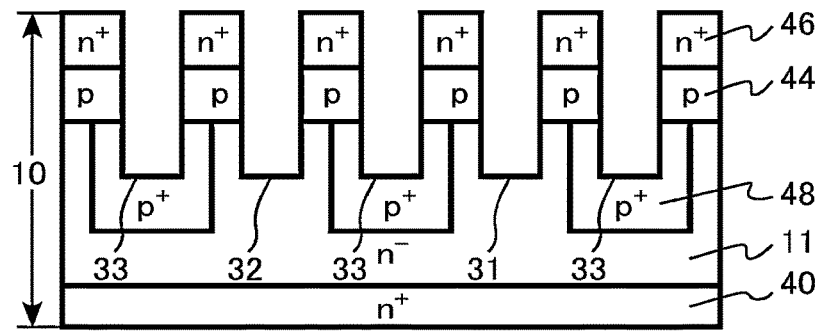
FIGS. 13A, 13B, and 13C are schematic cross-sectional views illustrating an example of the method for manufacturing the semiconductor device according to the first embodiment.
Figure 13B:
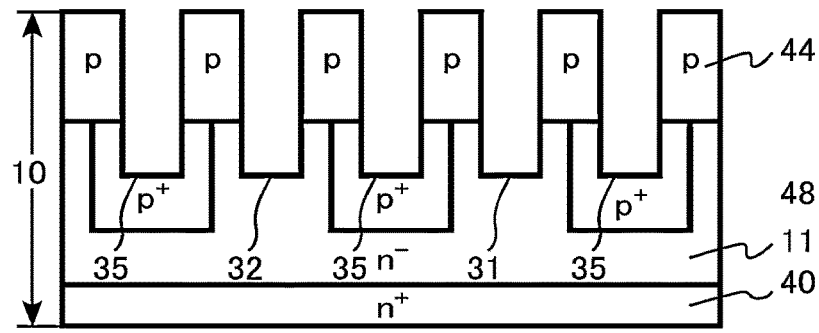
Figure 13C:
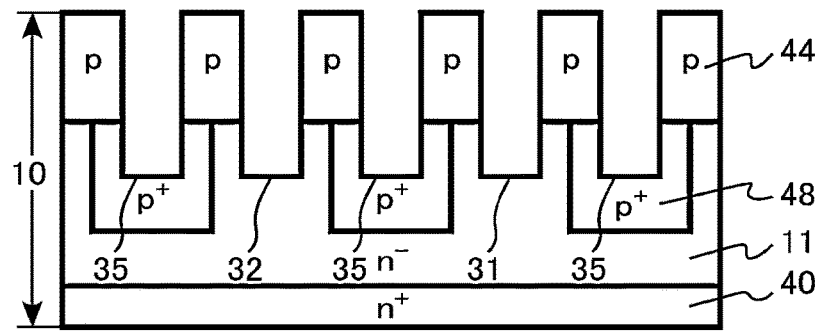

Next, the mask material 54 is removed (FIG. 13A, FIG. 13B, and FIG. 13C). Next, activation annealing for activating impurities implanted into the epitaxial layer 11 is performed. The activation annealing is performed, for example, at a temperature of 1400° C. or more and 1600° C. or less in a hydrogen atmosphere.

Figure 14A:
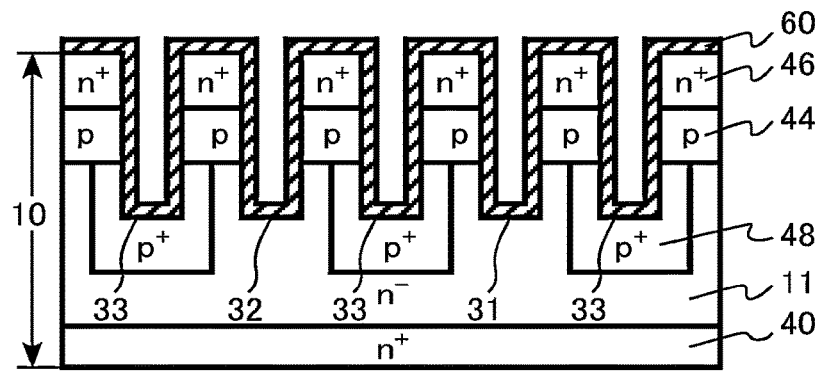
FIGS. 14A, 14B, and 14C are schematic cross-sectional views illustrating an example of the method for manufacturing the semiconductor device according to the first embodiment.
Figure 14B:
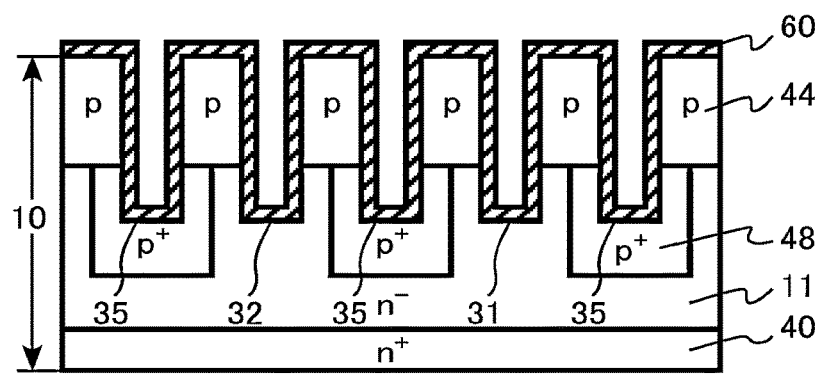
Figure 14C:
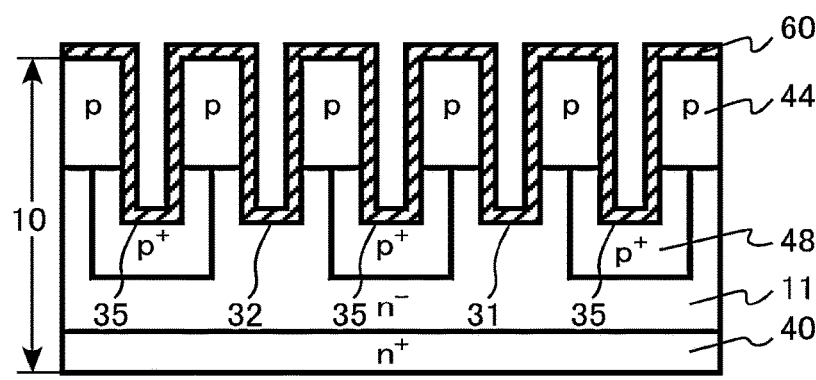

Next, a first silicon oxide film 60 is formed in the first gate trench 31, the second gate trench 32, the contact trench 33, the outer peripheral trench 34, and the intermediate trench 35 (FIG. 14A, FIG. 14B, and FIG. 14C).

The first silicon oxide film 60 is formed by, for example, the CVD method. The first silicon oxide film 60 becomes the gate insulating layer 24.

Figure 15A:
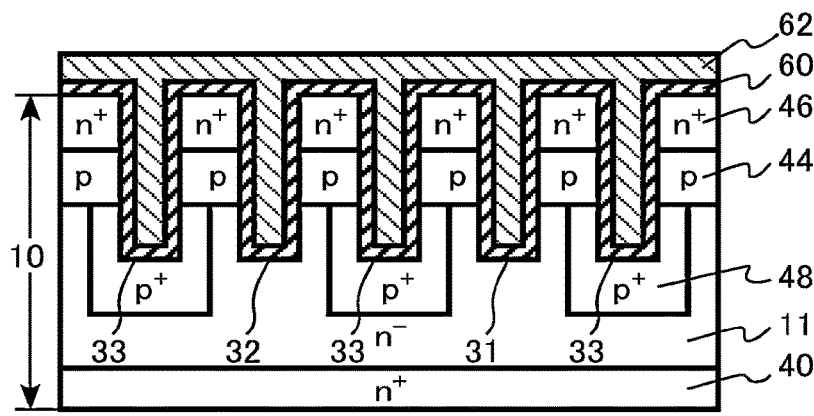
FIGS. 15A, 15B, and 15C are schematic cross-sectional views illustrating an example of the method for manufacturing the semiconductor device according to the first embodiment.
Figure 15B:
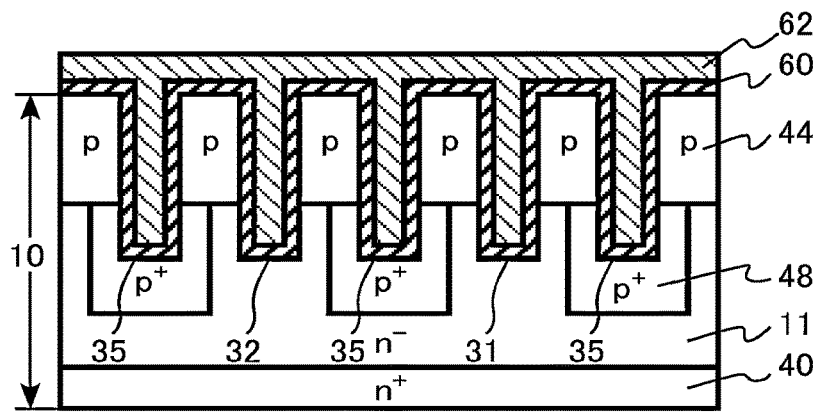
Figure 15C:
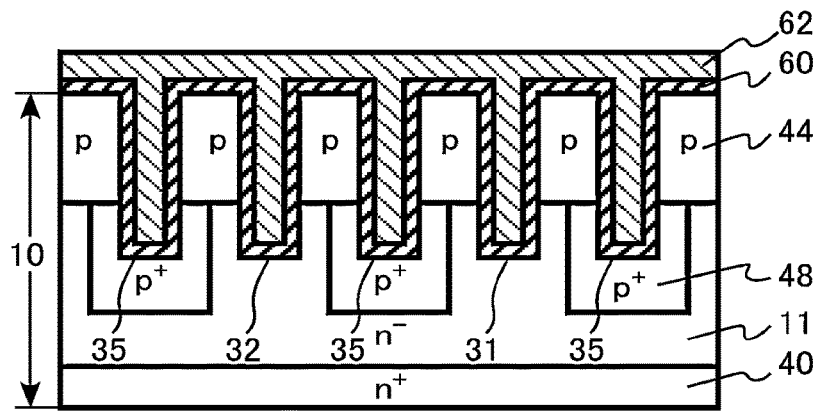

Next, a polycrystalline silicon film 62 is formed in the first gate trench 31, the second gate trench 32, the contact trench 33, the outer peripheral trench 34, and the intermediate trench 35 (FIG. 15A, FIG. 15B, and FIG. 15C).

The polycrystalline silicon film 62 is formed by, for example, the CVD method. The polycrystalline silicon film 62 becomes the gate electrode 20 and the gate wiring 22.

Next, a mask material 56 is formed on a face of the polycrystalline silicon film 62. The mask material 56 covers a region where the gate wiring 22 is formed. The mask material 56 is, for example, a photoresist.

Figure 16A:
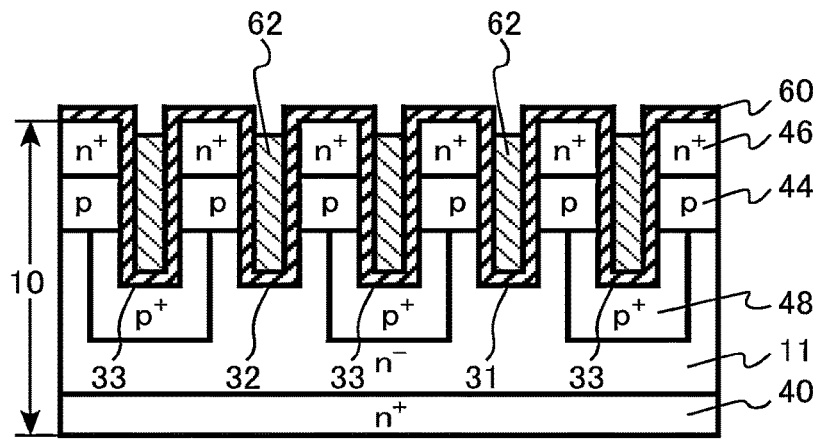
FIGS. 16A, 16B, and 16C are schematic cross-sectional views illustrating an example of the method for manufacturing the semiconductor device according to the first embodiment.
Figure 16B:
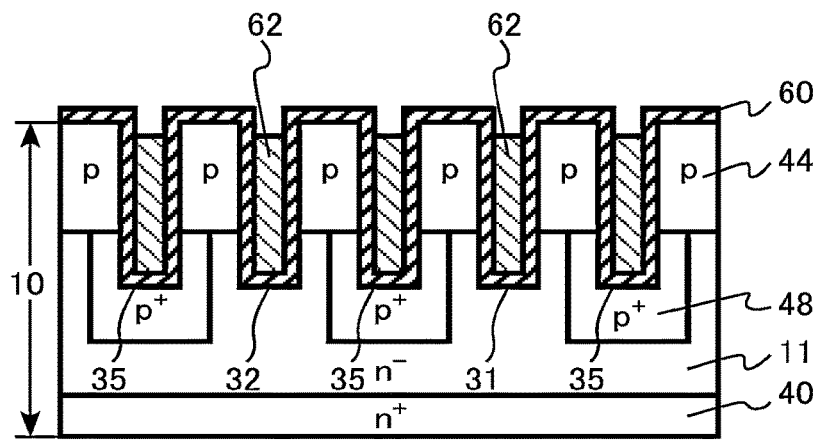
Figure 16C:
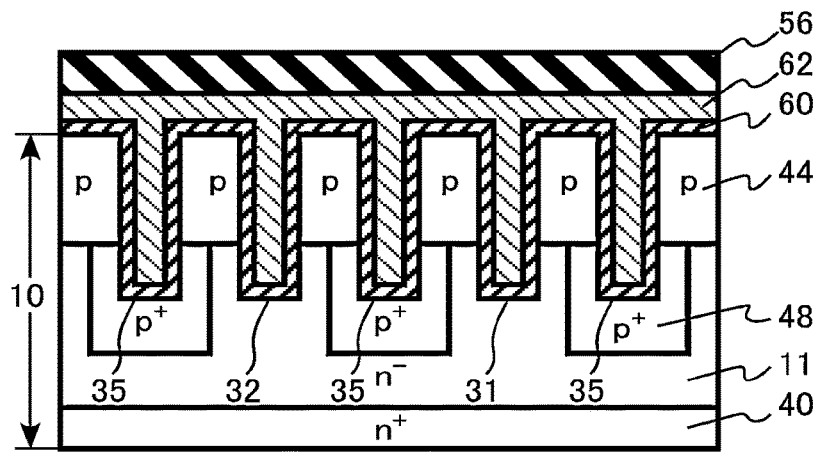

Next, a part of the polycrystalline silicon film 62 is removed using the mask material 56 as a mask (FIG. 16A, FIG. 16B, and FIG. 16C). The part of the polycrystalline silicon film 62 is removed by, for example, a dry etching method. Another portion of the polycrystalline silicon film 62 remains in the first gate trench 31, the second gate trench 32, the contact trench 33, the outer peripheral trench 34, and the intermediate trench 35. Further, still another part of the polycrystalline silicon film 62 remains continuously on the first gate trench 31, the second gate trench 32, and the intermediate trench 35 (FIG. 16C).

Next, the mask material 56 is removed. Next, a mask material 58 is formed. The mask material 58 is, for example, a photoresist.

The mask material 58 covers the polycrystalline silicon film 62 of the first gate trench 31, the second gate trench 32, and the intermediate trench 35.

Figure 17A:
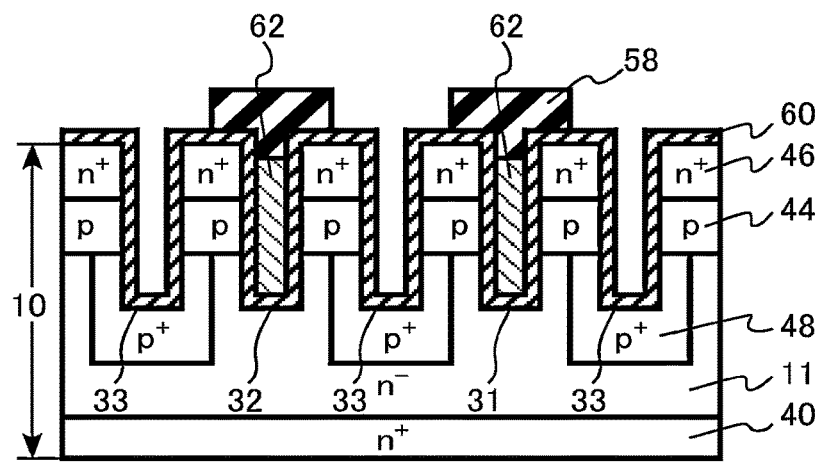
FIGS. 17A, 17B, and 17C are schematic cross-sectional views illustrating an example of the method for manufacturing the semiconductor device according to the first embodiment.
Figure 17B:
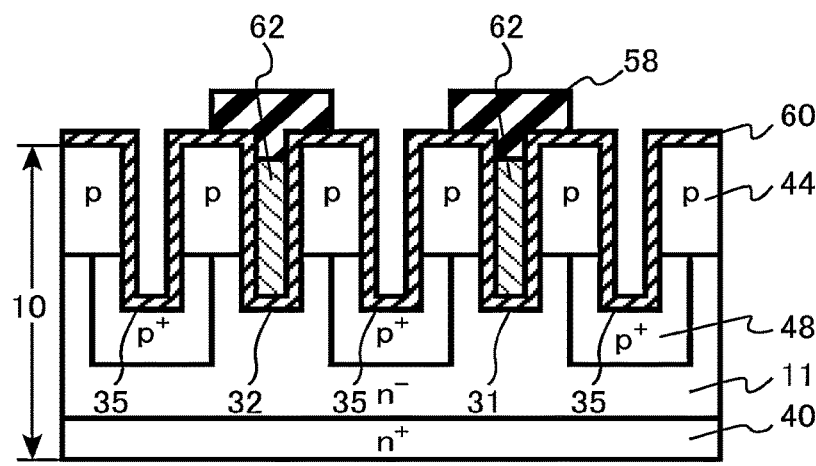
Figure 17C:
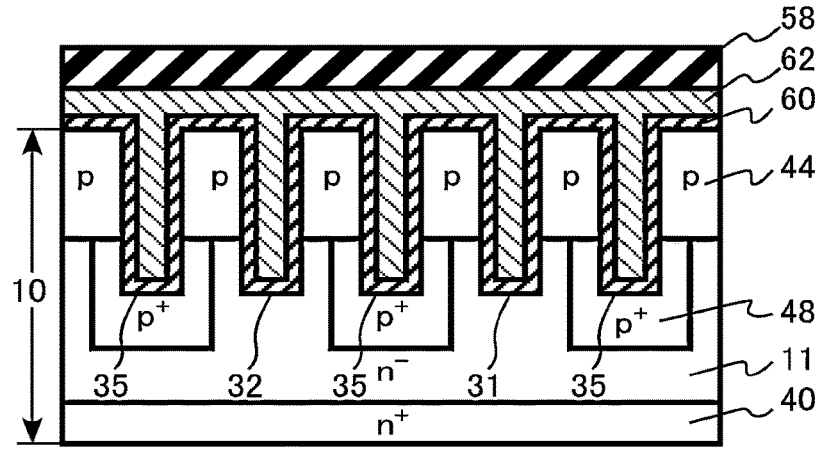

Next, the polycrystalline silicon film 62 in the contact trench 33 and the outer peripheral trench 34 is removed using the mask material 58 as a mask (FIG. 17A, FIG. 17B, and FIG. 17C). The polycrystalline silicon film 62 is removed by, for example, the dry etching method.

Figure 18A:
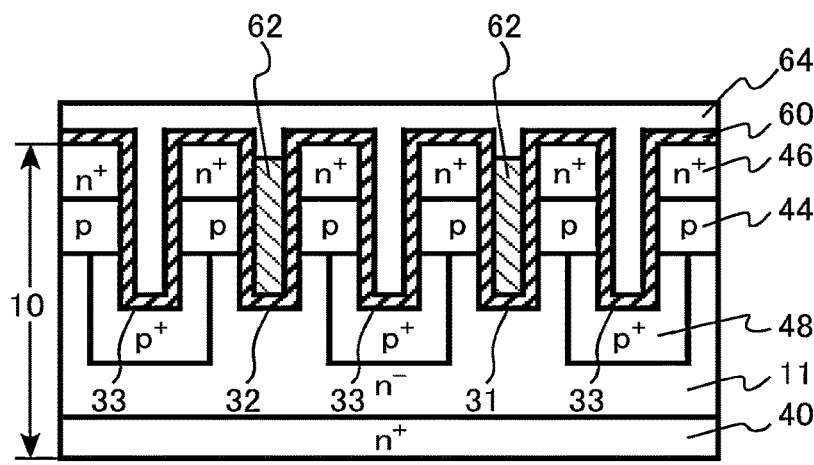
FIGS. 18A, 18B, and 18C are schematic cross-sectional views illustrating an example of the method for manufacturing the semiconductor device according to the first embodiment.
Figure 18B:
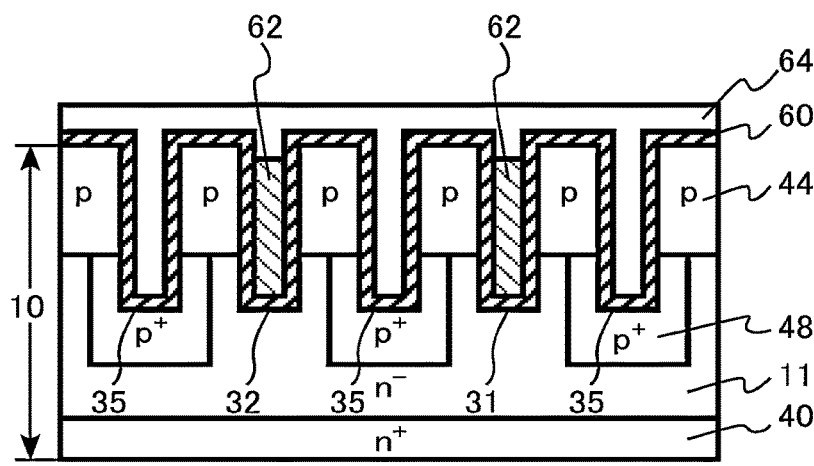
Figure 18C:
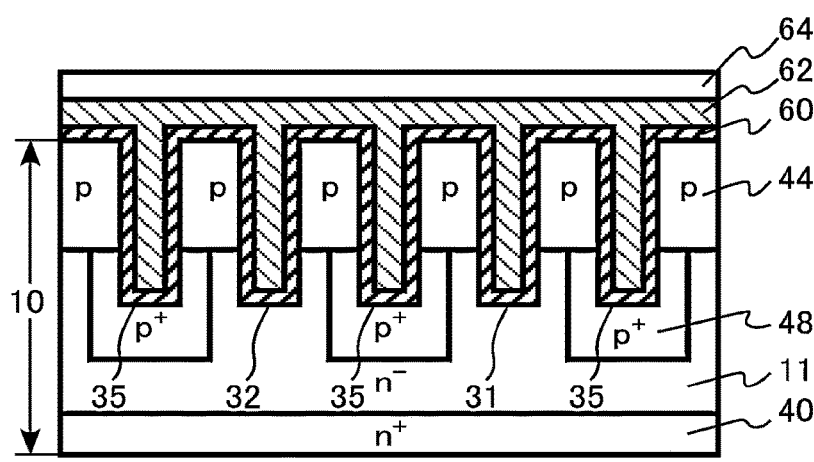

Next, the mask material 58 is removed. Next, a second silicon oxide film 64 is formed on the first silicon oxide film 60 and the polycrystalline silicon film 62 (FIG. 18A, FIG. 18B, and FIG. 18C). The second silicon oxide film 64 is formed by, for example, the CVD method. A part of the second silicon oxide film 64 becomes the interlayer insulating layer 26.

Next, a mask material 66 is formed. The mask material 66 is, for example, a photoresist.

The mask material 66 covers the second silicon oxide film 64 of the first gate trench 31, the second gate trench 32, the outer peripheral trench 34, and the intermediate trench 35. A part of the second silicon oxide film 64 on the intermediate trench 35 is not covered with the mask material 66.

Figure 19A:
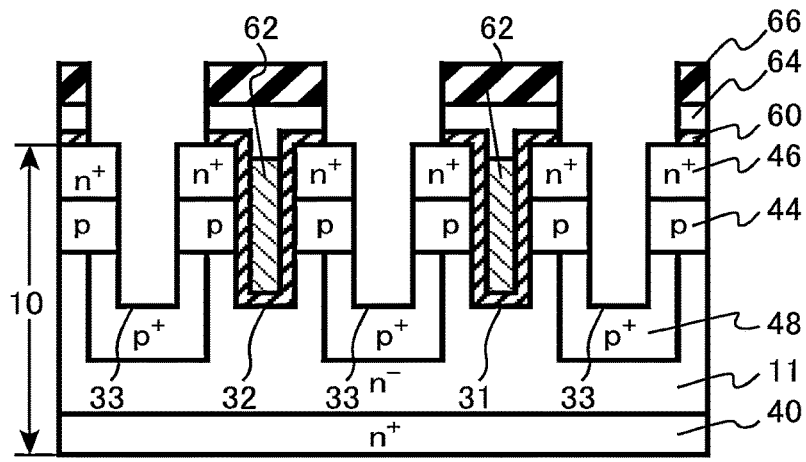
FIGS. 19A, 19B, and 19C are schematic cross-sectional views illustrating an example of the method for manufacturing the semiconductor device according to the first embodiment.
Figure 19B:
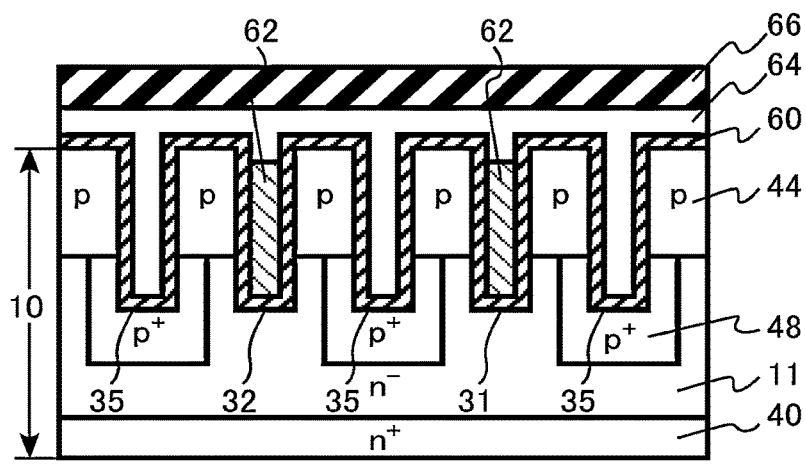
Figure 19C:
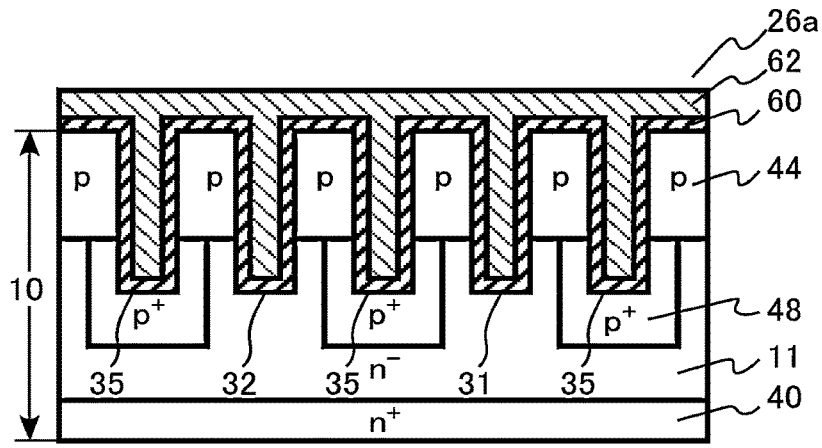

Next, the first silicon oxide film 60 and the second silicon oxide film 64 are removed using the mask material 66 as a mask (FIG. 19A, FIG. 19B, and FIG. 19C). The first silicon oxide film 60 and the second silicon oxide film 64 are removed by, for example, the wet etching method.

The first silicon oxide film 60 and the second silicon oxide film 64 in the contact trench 33 are removed. Further, a contact hole 26a is formed in the second silicon oxide film 64 on the intermediate trench 35. The polycrystalline silicon film 62 in the region to be the gate wiring 22 is exposed.

Next, the mask material 66 is removed. Next, in the contact trench 33, the source electrode 12 and the metal wiring 18 are formed on the polycrystalline silicon film 62 in the region to be the gate wiring 22 and on the second silicon oxide film 64. The source electrode 12 and the metal wiring 18 are formed by, for example, deposition of a metal film by a CVD method and patterning of a film using a lithography method and an RIE method.

Figure 20A:
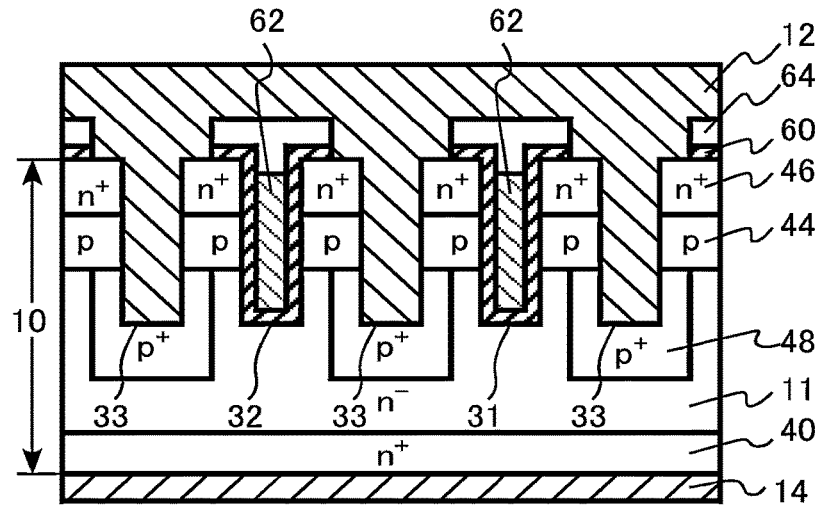
FIGS. 20A, 20B, and 20C are schematic cross-sectional views illustrating an example of the method for manufacturing the semiconductor device according to the first embodiment.
Figure 20B:
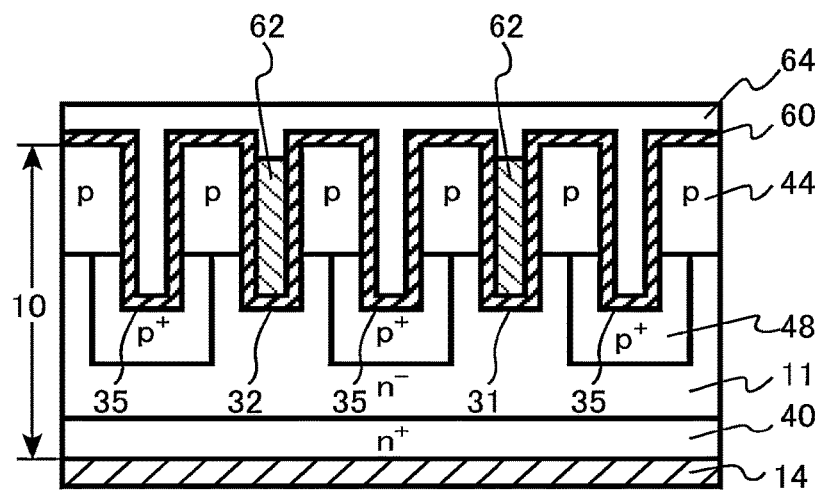
Figure 20C:
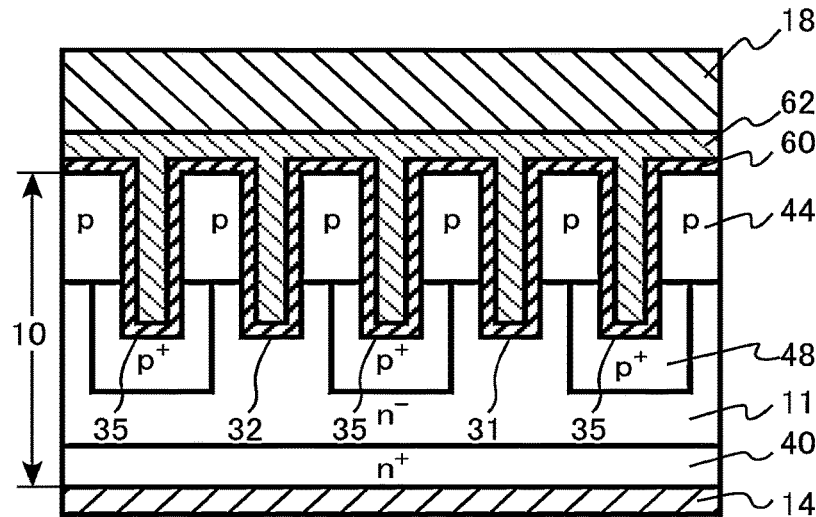

Then, the drain electrode 14 is formed on the back face of the silicon carbide layer 10 using known process technology (FIG. 20A, FIG. 20B, and FIG. 20C). The MOSFET 100 of the first embodiment is manufactured by the above manufacturing method.

Next, functions and effects of the semiconductor device and the method for manufacturing the semiconductor device according to the first embodiment will be described.

A trench gate structure in which the gate electrode 20 is provided in the first gate trench 31 and the second gate trench 32 is applied to the MOSFET 100. By applying the trench gate structure, a channel area per unit area is increased, and the on-resistance of the MOSFET 100 is reduced.

Further, in the MOSFET 100, the contact region 12a to be a part of the source electrode 12 is provided in the contact trench 33. The MOSFET 100 is a MOSFET having a so-called double trench structure.

By providing the contact region 12a in the contact trench 33, electrical connection to the body region 44 and the source region 46 can be made on the side face of the contact trench 33. Therefore, a connection area of the source electrode 12 on the face of the silicon carbide layer 10 can be reduced. As a result, the channel area per unit area is increased, and the on-resistance of the MOSFET 100 is reduced.

Further, the MOSFET 100 includes the electric field relaxation region 48 around the bottom face and the side face of the contact trench 33. Therefore, when the MOSFET 100 is turned off, the electric field applied to the gate insulating layer 24 is alleviated. As a result, the reliability of the gate insulating layer 24 is improved.

Furthermore, in the MOSFET 100, neither the gate electrode 20 nor the gate wiring 22 is present between the end E of the first gate trench 31 in the first direction and the interlayer insulating layer 26. At the end E of the first gate trench 31 in the first direction, there is not a metal oxide semiconductor (MOS) structure in which the gate insulating layer 24 is sandwiched between the gate electrode 20 or the gate wiring 22 and the silicon carbide layer 10. Therefore, the reliability of the gate insulating layer 24 is further improved.

Figure 21:
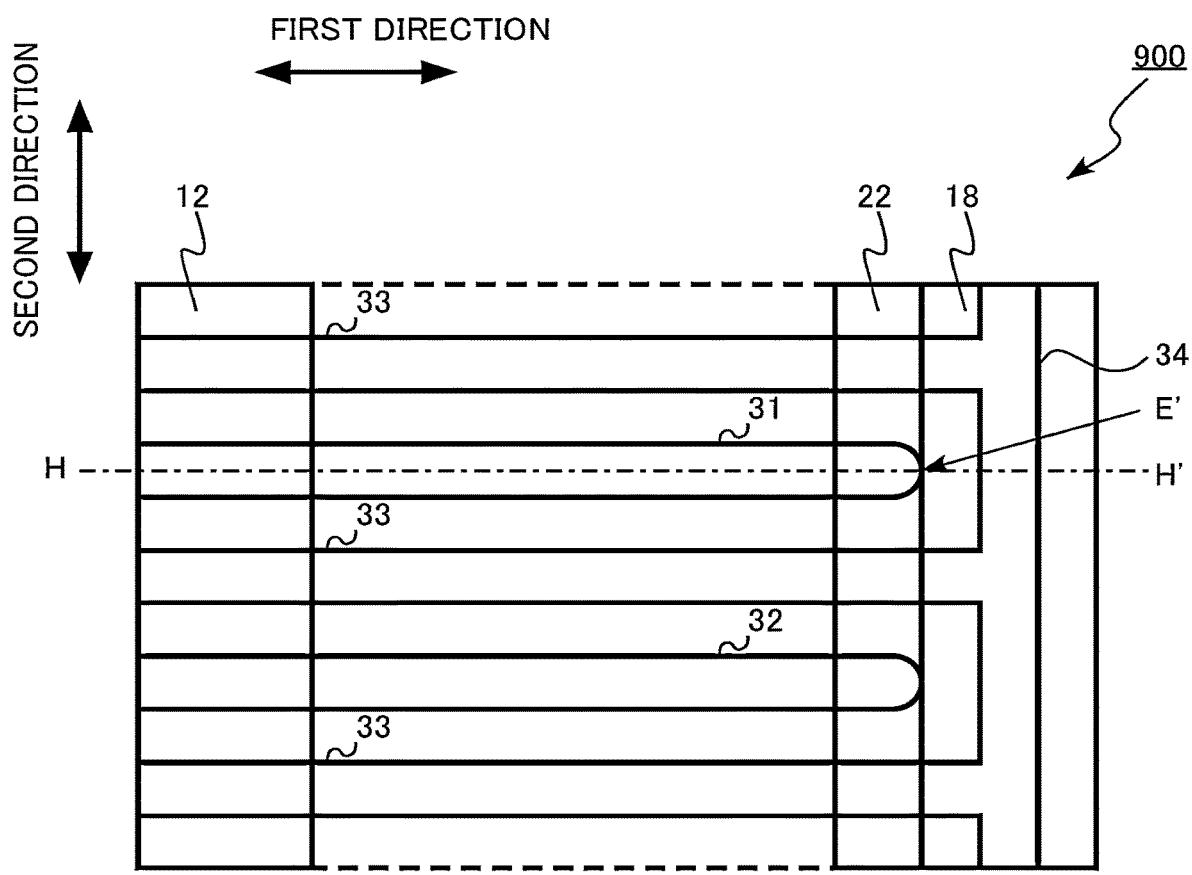
FIG. 21 is an enlarged schematic top view of a semiconductor device according to a comparative example of the first embodiment.

FIG. 21 is an enlarged schematic top view of a semiconductor device according to a comparative example of the first embodiment. FIG. 21 illustrates a pattern layout of a trench, a source electrode, a gate wiring, and a metal wiring. FIG. 21 is a diagram corresponding to FIG. 2.

Figure 22:
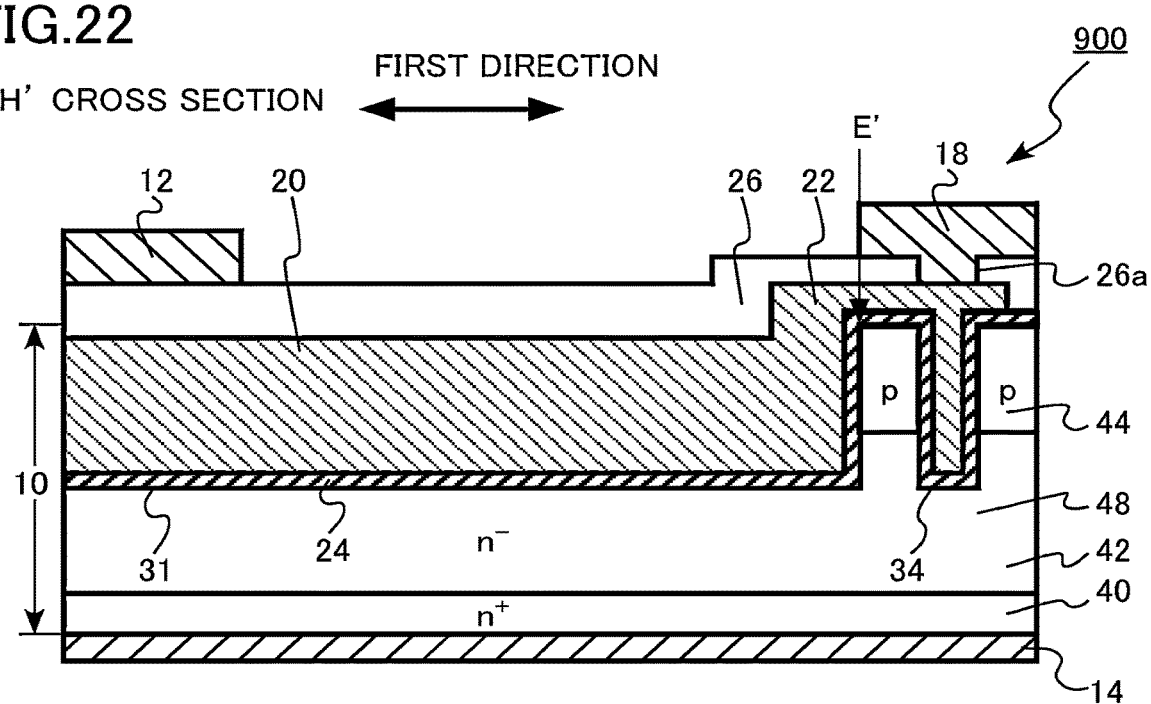
FIG. 22 is a schematic cross-sectional view of a semiconductor device according to a comparative example of the first embodiment.

FIG. 22 is a schematic cross-sectional view of a semiconductor device according to a comparative example of the first embodiment. FIG. 22 is a cross-sectional view taken along the line HH' of FIG. 21. FIG. 22 is a diagram corresponding to FIG. 4A.

The semiconductor device according to the comparative example of the first embodiment is a MOSFET 900. The MOSFET 900 is different from the MOSFET 100 of the first embodiment in that the gate wiring 22 is provided between the end E' of the first gate trench 31 in the first direction and the interlayer insulating layer 26.

In the MOSFET 900, the gate wiring 22 is provided in the first direction of the first gate trench 31. The gate wiring 22 is connected to the gate electrode 20.

The metal wiring 18 is provided on the gate wiring 22. The metal wiring 18 is in contact with the gate wiring 22 via the contact hole 26a provided in the interlayer insulating layer 26 on the gate wiring 22.

Figure 23:
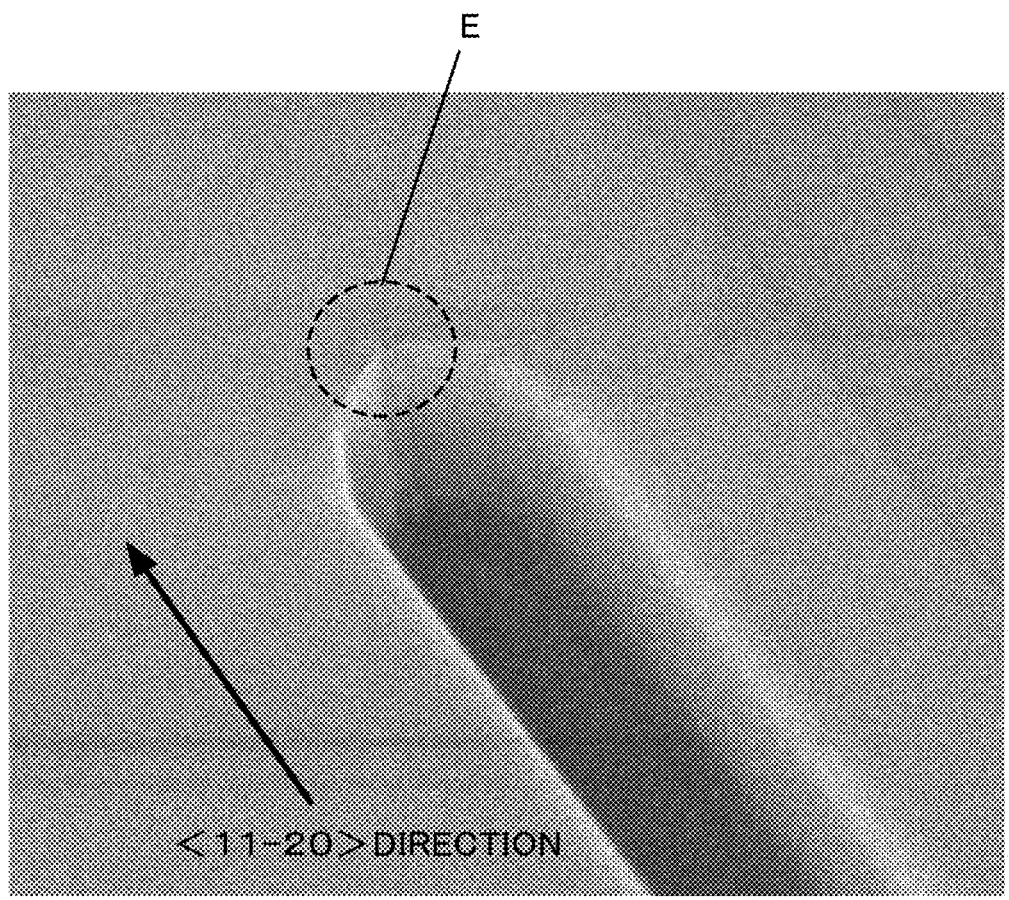
FIG. 23 is a diagram illustrating a function and an effect of the semiconductor device according to the first embodiment.

FIG. 23 is a diagram illustrating functions and effects of the semiconductor device of the first embodiment. FIG. 23 is an SEM image of the vicinity of the end E in the first direction of the gate trench after activation annealing is performed. The gate trench in FIG. 23 extends in a <11-20> direction. That is, the first direction is the <11-20> direction.

As illustrated in FIG. 23, the gate trench has an angular shape at the end E after the activation annealing is performed. This is considered to be because the crystal structure of SiC is reflected in the shape of the trench by the activation annealing. Note that, even if the first direction is a direction other than the <11-20> direction, the angular position changes, but similarly, the gate trench has an angular shape at the end E.

In the MOSFET 900, when the gate voltage is applied to the gate electrode 20, the reliability of the gate insulating layer 24 at the end E' of the first gate trench 31 in the first direction decreases. This is considered to be because the electric field concentrates in the vicinity of the end E' due to the shape of the trench illustrated in FIG. 23. Therefore, it is considered that the electric field intensity applied to the gate insulating layer 24 in the vicinity of the end E' increases. Therefore, it is considered that the leakage current of the gate insulating layer 24 in the vicinity of the end E' increases, and the reliability of the gate insulating layer 24 decreases.

In the MOSFET 100 of the first embodiment, as illustrated in FIG. 4A, neither the gate electrode 20 nor the gate wiring 22 is present between the end E of the first gate trench 31 in the first direction and the interlayer insulating layer 26. Therefore, a problem of a decrease in the reliability of the gate insulating layer 24 at the end E does not occur. Therefore, in the MOSFET 100, the reliability is improved as compared with the MOSFET 900 of the comparative example.

In particular, when the first direction in which the first gate trench 31 extends is a direction inclined by 0° or more and 8° or less with respect to the <11-20> direction, the center portion of the tip of the end E has an angular shape as illustrated in FIG. 23. Therefore, in particular, it is considered that the leakage current of the gate insulating layer 24 due to the electric field concentration increases, and the reliability of the gate insulating layer 24 decreases. Therefore, when the first direction is a direction inclined by 0° or more and 8° or less with respect to the <11-20> direction, it is considered that the reliability of the MOSFET 100 is further improved as compared with the MOSFET 900 of the comparative example.

Further, the MOSFET 100 of the first embodiment can be manufactured without requiring an additional process as compared with the MOSFET 900 of the comparative example. Specifically, as illustrated in FIGS. 2 and 21, the MOSFET 100 can be manufactured by the manufacturing method similar to that of the MOSFET 900 only by changing the pattern layout of the source electrode 12, the gate wiring 22, and the metal wiring 18. Therefore, the MOSFET 100 with improved reliability can be manufactured at the manufacturing cost similar to that of the MOSFET 900 of the comparative example.

As described above, according to the first embodiment, a MOSFET capable of improving reliability can be realized.

Second Embodiment

A semiconductor device of a second embodiment is different from the semiconductor device of the first embodiment in that a gate electrode is provided in a fourth trench. Hereinafter, description of contents overlapping with those of the first embodiment may be partially omitted.

The semiconductor device according to the second embodiment is a vertical MOSFET 200 using silicon carbide. The MOSFET 200 is a MOSFET having a trench gate structure in which a gate electrode is provided in a trench. Further, the MOSFET 200 is a MOSFET having a so-called double trench structure in which a source electrode is provided in a trench. Further, the MOSFET 200 is an n-channel MOSFET using electrons as carriers.

Figure 24:
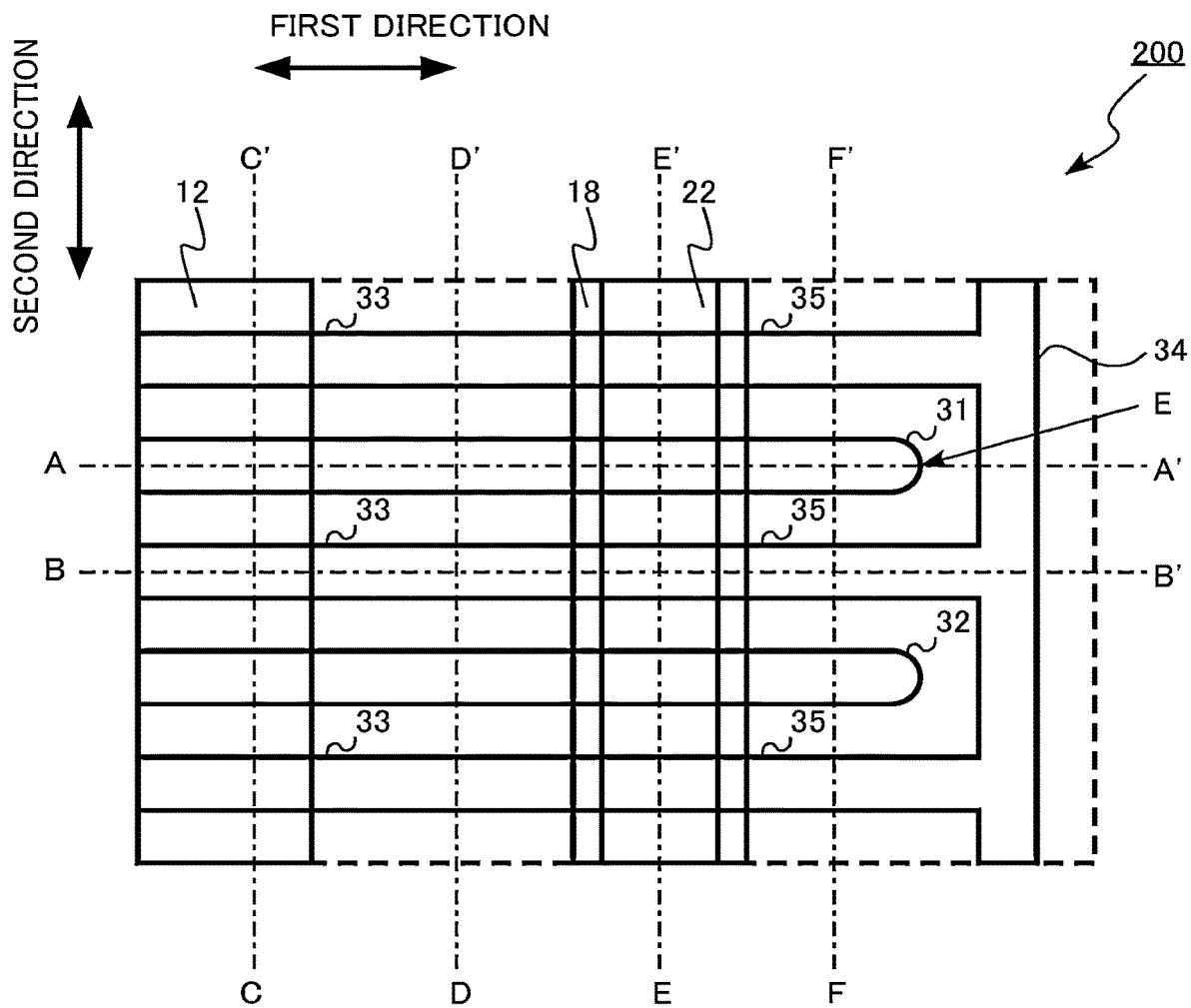
FIG. 24 is an enlarged schematic top view of a semiconductor device according to a second embodiment.

FIG. 24 is an enlarged schematic top view of the semiconductor device according to the second embodiment. FIG. 24 illustrates a pattern layout of a trench, a source electrode, a gate wiring, and a metal wiring. FIG. 24 is a top view corresponding to FIG. 2.

Figure 25:
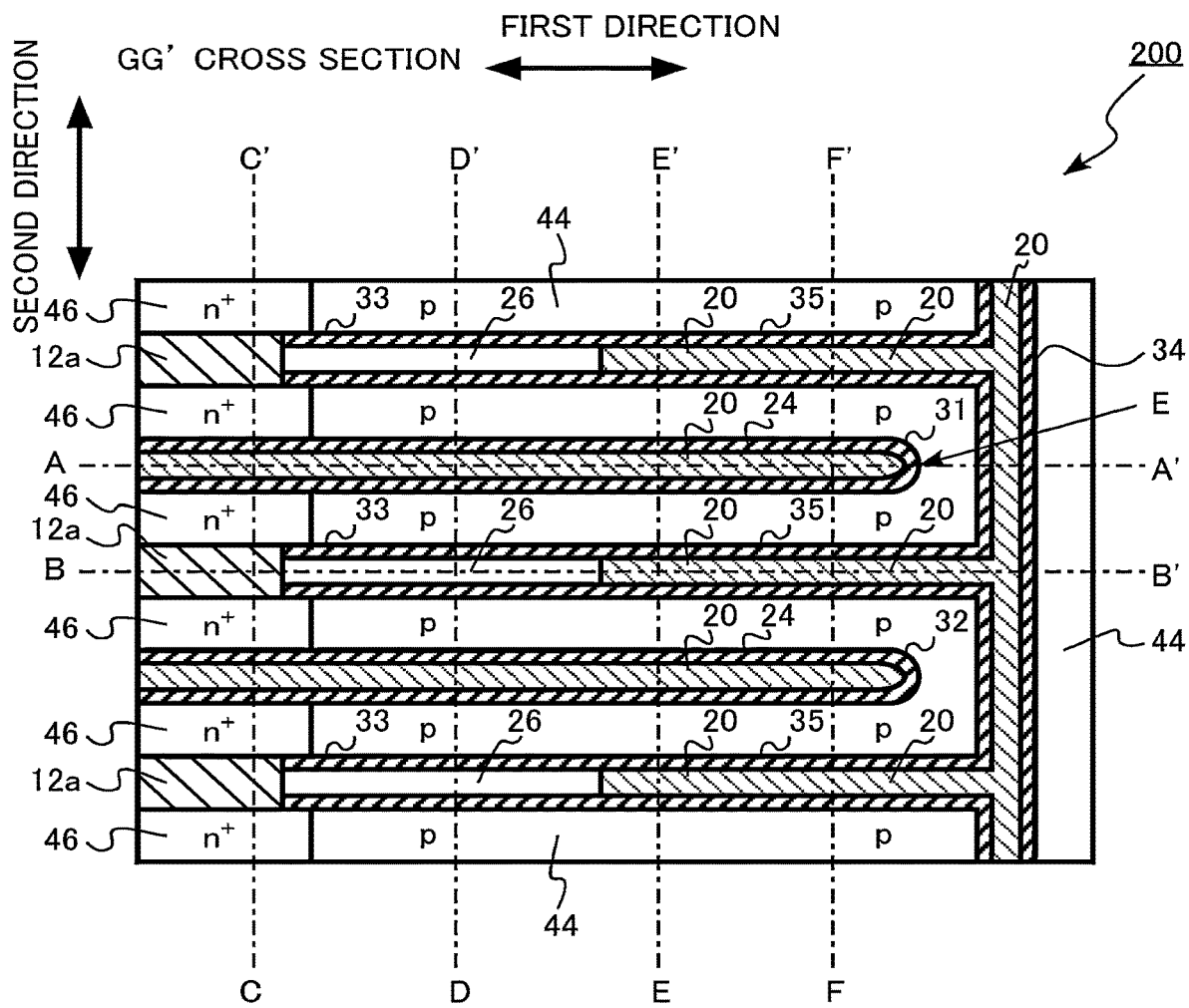
FIG. 25 is a schematic cross-sectional view of the semiconductor device according to the second embodiment.
Figure 27A:
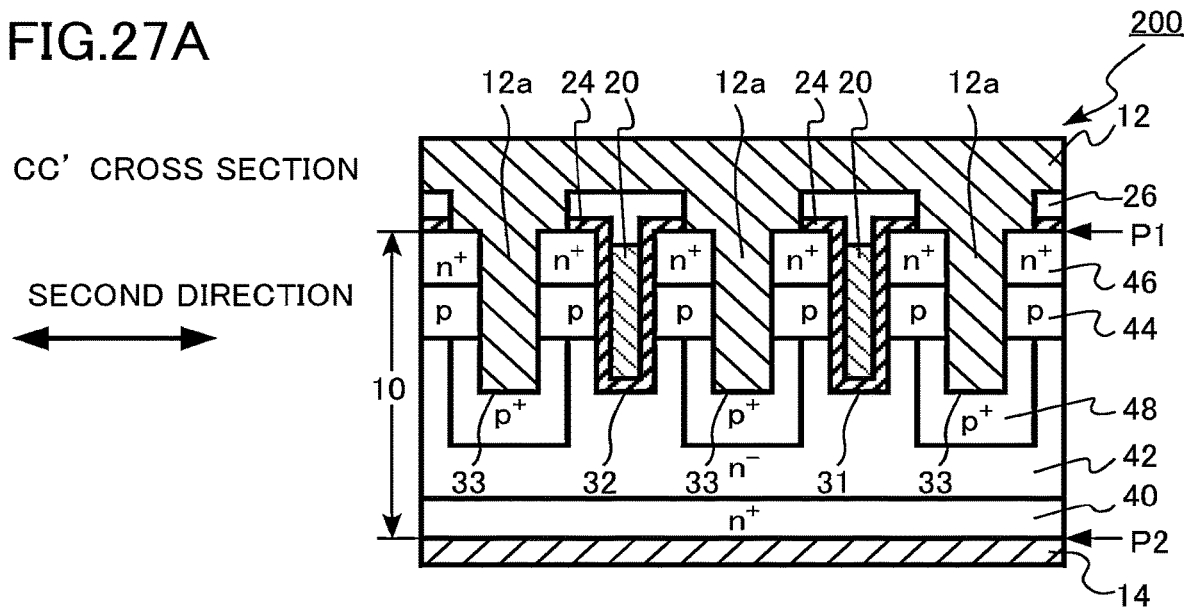
FIGS. 27A and 27B are schematic cross-sectional views of the semiconductor device according to the second embodiment.
Figure 27B:
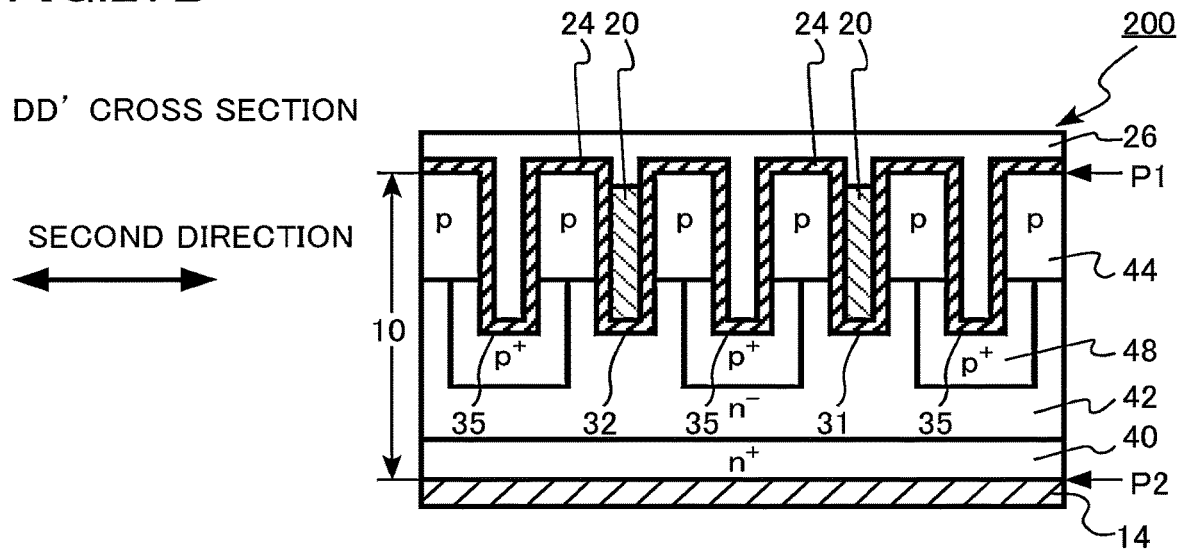
Figure 28A:
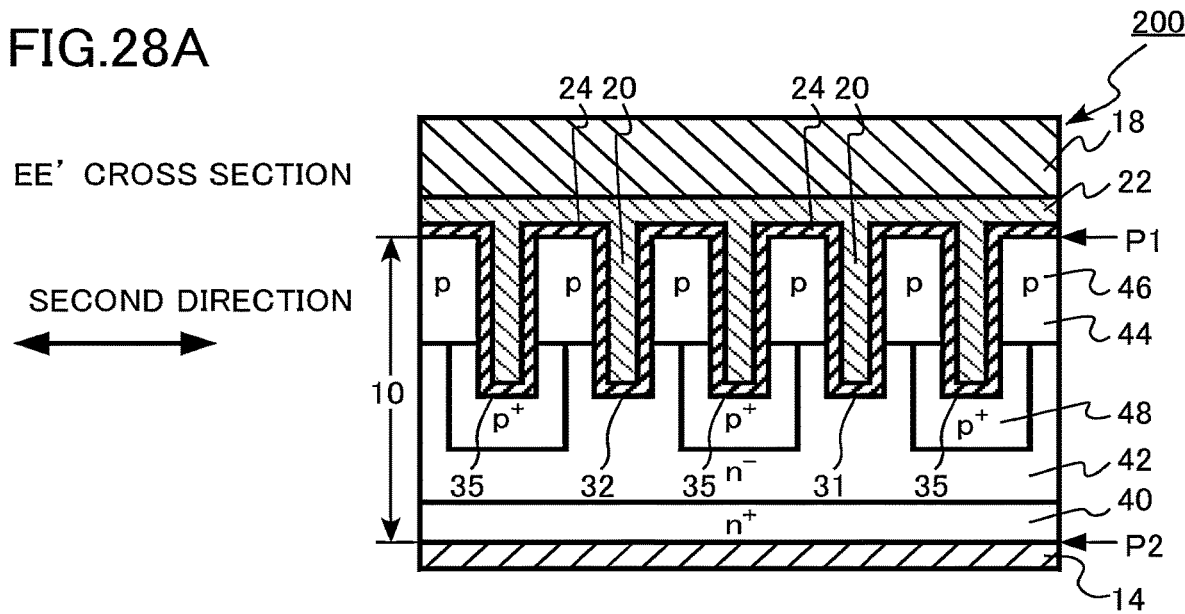
FIGS. 28A and 28B are schematic cross-sectional views of the semiconductor device according to the second embodiment.
Figure 28B:
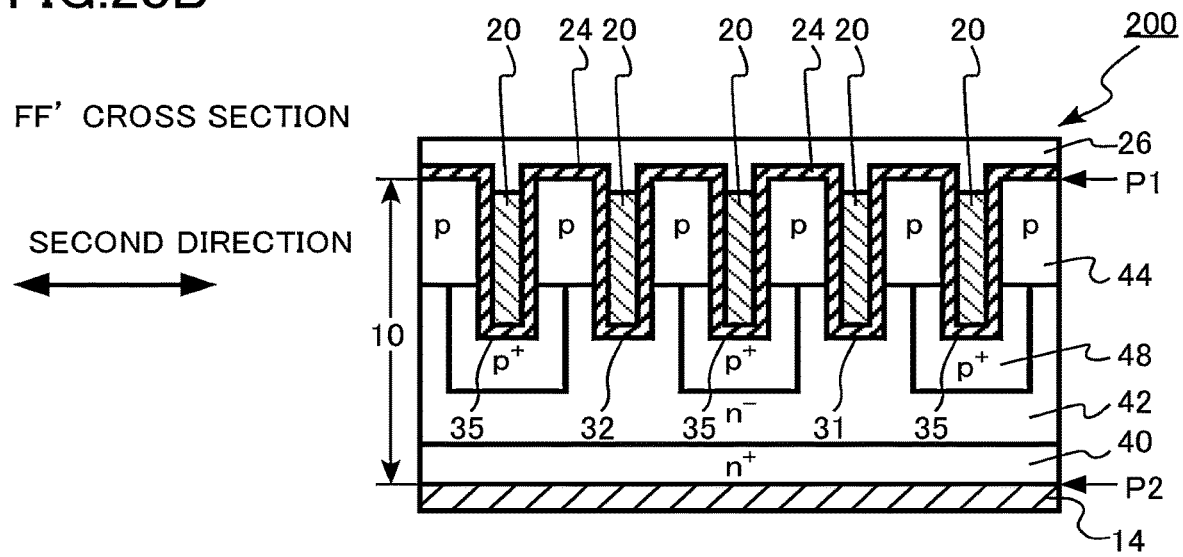

FIGS. 25 to 28B are schematic cross-sectional views of the semiconductor device according to the second embodiment. FIG. 25 is a cross-sectional view taken along the line GG' of FIGS. 26A and 26B. FIG. 26A is a cross-sectional view taken along the line AA' of FIGS. 24 and 25. FIG. 26B is a cross-sectional view taken along the line BB' of FIGS. 24 and 25. FIG. 27A is a cross-sectional view taken along the line CC' of FIGS. 24 and 25. FIG. 27B is a cross-sectional view taken along the line DD' of FIGS. 24 and 25. FIG. 28A is a cross-sectional view taken along the line EE' of FIGS. 24 and 25. FIG. 28B is a cross-sectional view taken along the line FF' of FIGS. 24 and 25.

The MOSFET 200 includes a silicon carbide layer 10, a source electrode 12 (first electrode), a drain electrode 14 (second electrode), a gate electrode pad 16, a metal wiring 18, a gate electrode 20, a gate wiring 22, a gate insulating layer 24, and an interlayer insulating layer 26. The source electrode 12 has a contact region 12*a*. The interlayer insulating layer 26 has a contact hole 26*a*.

The source electrode 12 is an example of the first electrode. The drain electrode 14 is an example of the second electrode.

The silicon carbide layer 10 includes a first gate trench 31 (first trench), a second gate trench 32 (second trench), a contact trench 33 (third trench), an outer peripheral trench 34 (fourth trench), an intermediate trench 35 (fifth trench), an n$^+$-type drain region 40, an n$^-$-type drift region 42 (first silicon carbide region), a p-type body region 44 (second silicon carbide region), an n$^+$-type source region 46 (third silicon carbide region), and a p$^+$-type electric field relaxation region 48 (fourth silicon carbide region).

The first gate trench 31 is an example of the first trench. The second gate trench 32 is an example of the second trench. The contact trench 33 is an example of the third trench. The outer peripheral trench 34 is an example of the fourth trench. The intermediate trench 35 is an example of the fifth trench. The drift region 42 is an example of the first silicon carbide region. The body region 44 is an example of the second silicon carbide region. The source region 46 is an example of the third silicon carbide region. The electric field relaxation region 48 is an example of the fourth silicon carbide region.

A part of the gate electrode 20 is provided in the intermediate trench 35. A part of the gate electrode 20 is provided in the outer peripheral trench 34. The outer peripheral trench 34 is embedded with the gate electrode 20. The gate electrode 20 in the intermediate trench 35 and the gate electrode 20 in the outer peripheral trench 34 are continuous.

As illustrated in FIG. 26A, neither the gate electrode 20 nor the gate wiring 22 is present between an end E of the first gate trench 31 in a first direction and the interlayer insulating layer 26. For example, the gate insulating layer 24 and the interlayer insulating layer 26 are in contact with each other at the end E of the first gate trench 31 in the first direction.

According to the MOSFET 200 of the second embodiment, similarly to the MOSFET 100 of the first embodiment, neither the gate electrode 20 nor the gate wiring 22 is present between the end E of the first gate trench 31 in the first direction and the interlayer insulating layer 26. Therefore, similarly to the MOSFET 100 of the first embodiment, the reliability of the MOSFET 200 is improved.

Further, in the MOSFET 200 of the second embodiment, the outer peripheral trench 34 is embedded with the gate electrode 20. Therefore, flatness of a face of the interlayer insulating layer 26 on the outer peripheral trench 34 is improved. Therefore, for example, patterning of a metal film for forming the source electrode 12 or the metal wiring 18 is facilitated.

As described above, according to the second embodiment, a MOSFET capable of improving reliability can be realized.

Third Embodiment

A semiconductor device according to a third embodiment is different from the semiconductor device according to the second embodiment in that a third trench and a fifth trench are separated from each other. Hereinafter, description of contents overlapping with those of the first and second embodiments may be partially omitted.

The semiconductor device according to the third embodiment is a vertical MOSFET 300 using silicon carbide. The MOSFET 300 is a MOSFET having a trench gate structure in which a gate electrode is provided in a trench. Further, the MOSFET 300 is a MOSFET having a so-called double trench structure in which a source electrode is provided in a trench. Further, the MOSFET 300 is an n-channel MOSFET using electrons as carriers.

Figure 29:
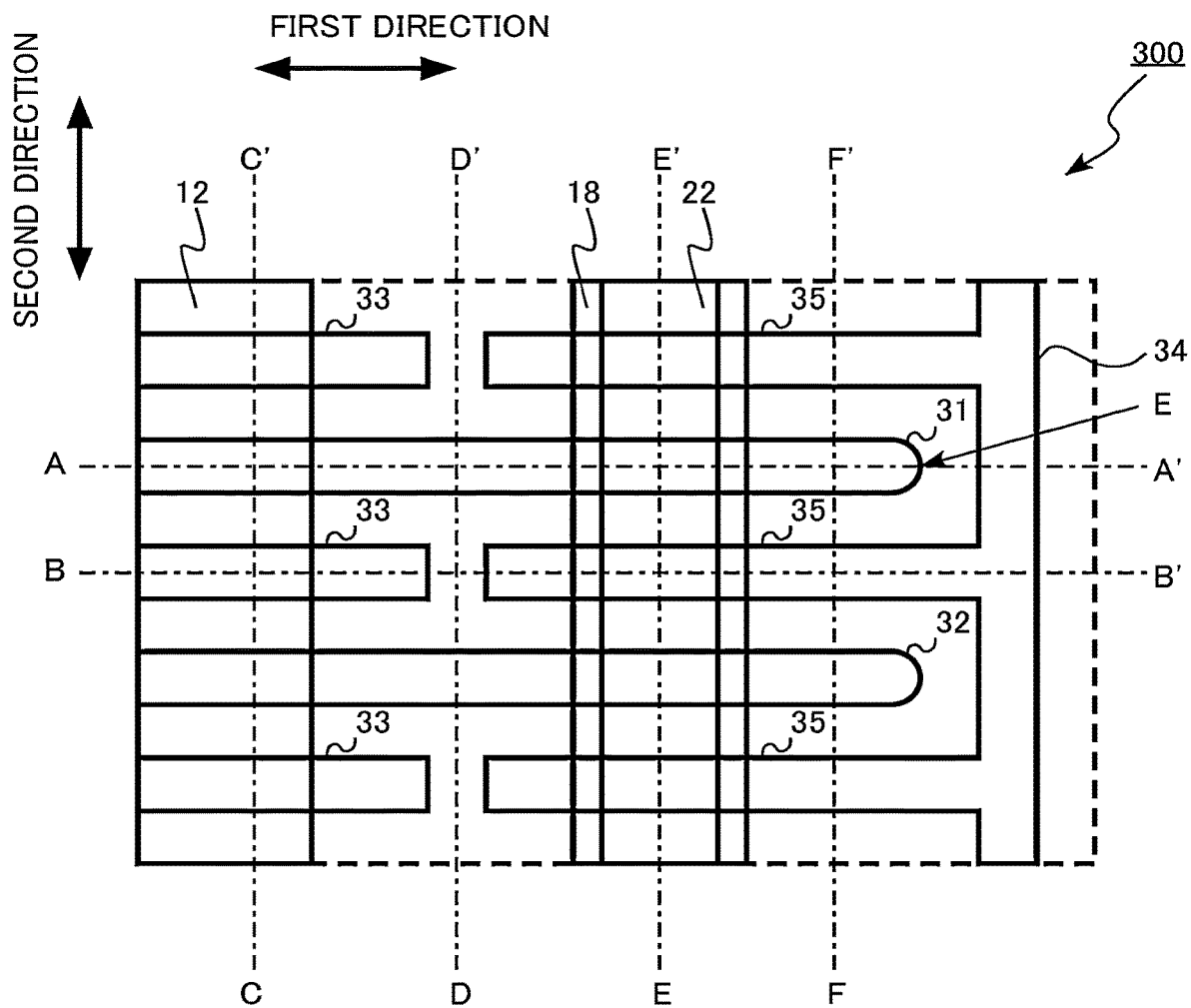
FIG. 29 is an enlarged schematic top view of a semiconductor device according to a third embodiment.

FIG. 29 is an enlarged schematic top view of the semiconductor device according to the third embodiment. FIG. 29 illustrates a pattern layout of a trench, a source electrode, a gate wiring, and a metal wiring. FIG. 29 is a diagram corresponding to FIG. 24.

Figure 30:
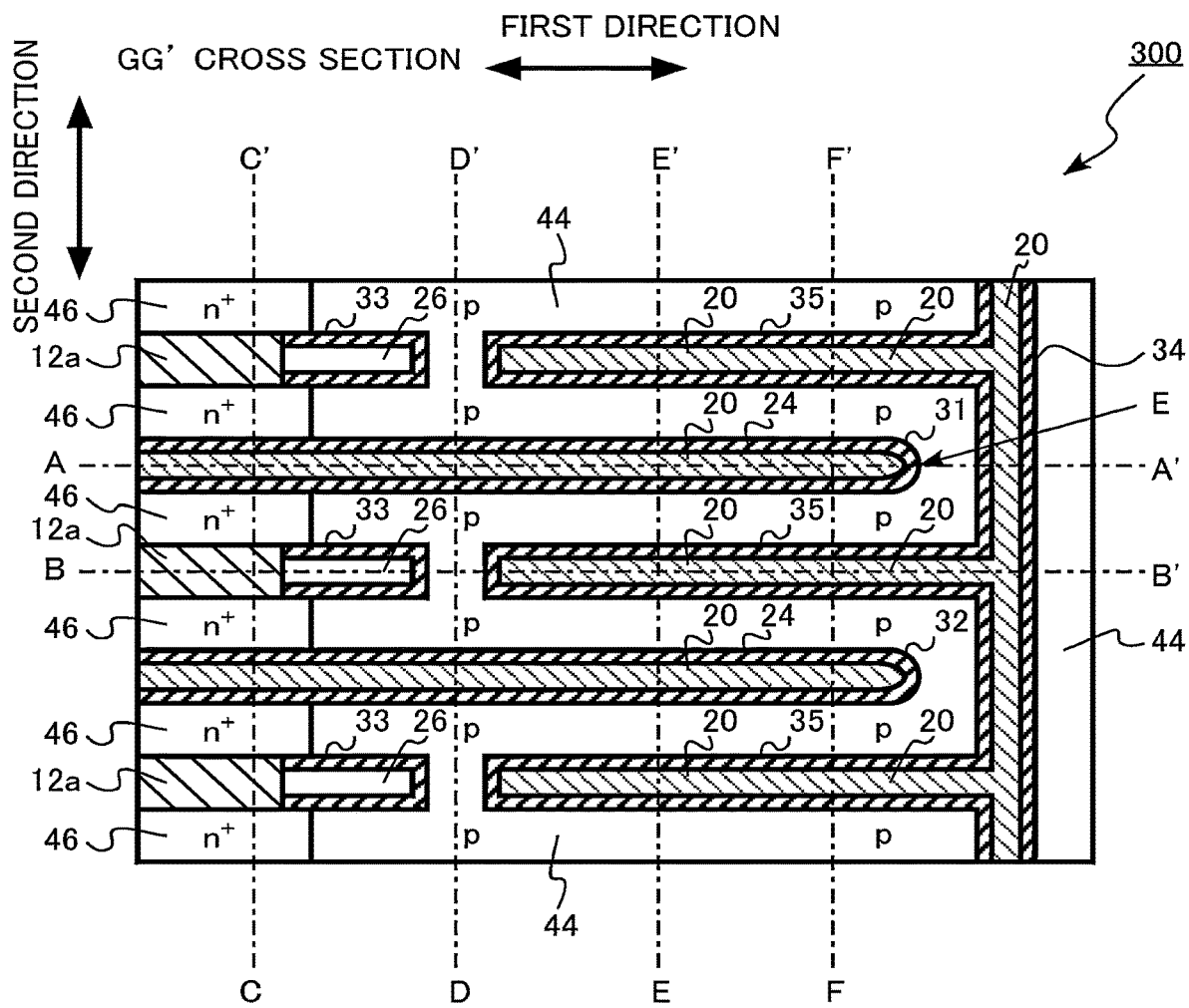
FIG. 30 is a schematic cross-sectional view of the semiconductor device according to the third embodiment.
Figure 32A:
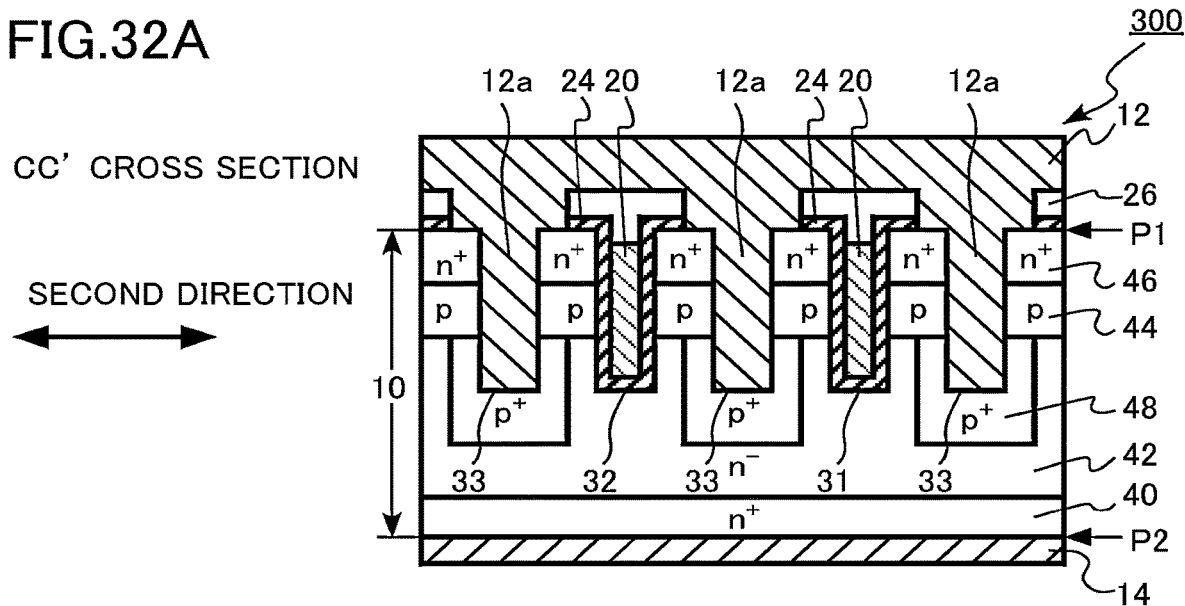
FIGS. 32A and 32B are schematic cross-sectional views of the semiconductor device according to the third embodiment.
Figure 32B:
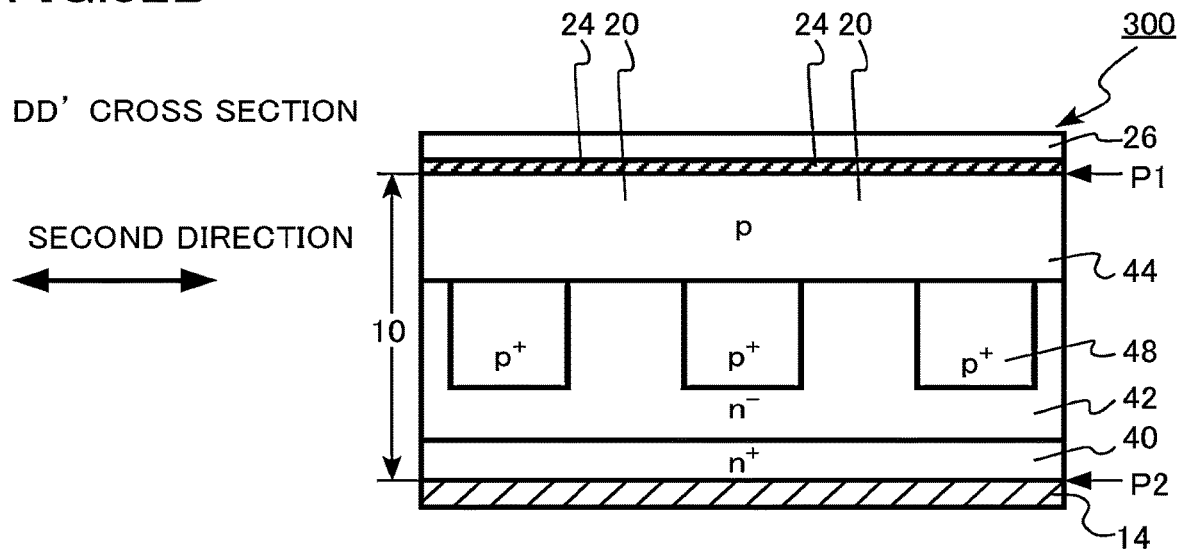
Figure 33A:
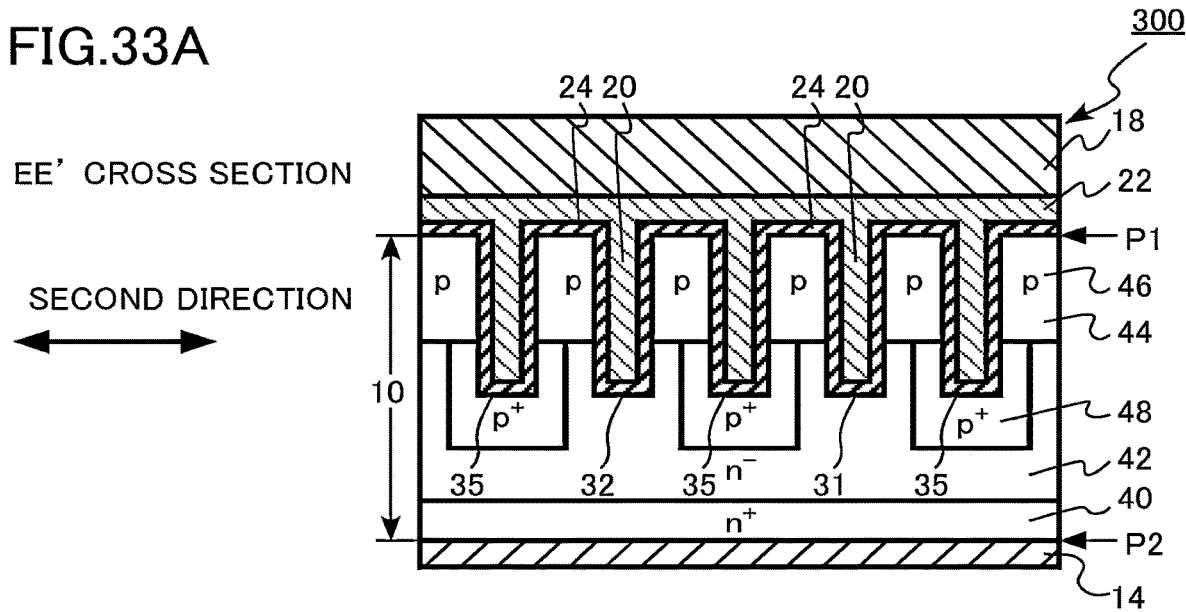
FIGS. 33A and 33B are schematic cross-sectional views of the semiconductor device according to the third embodiment.
Figure 33B:
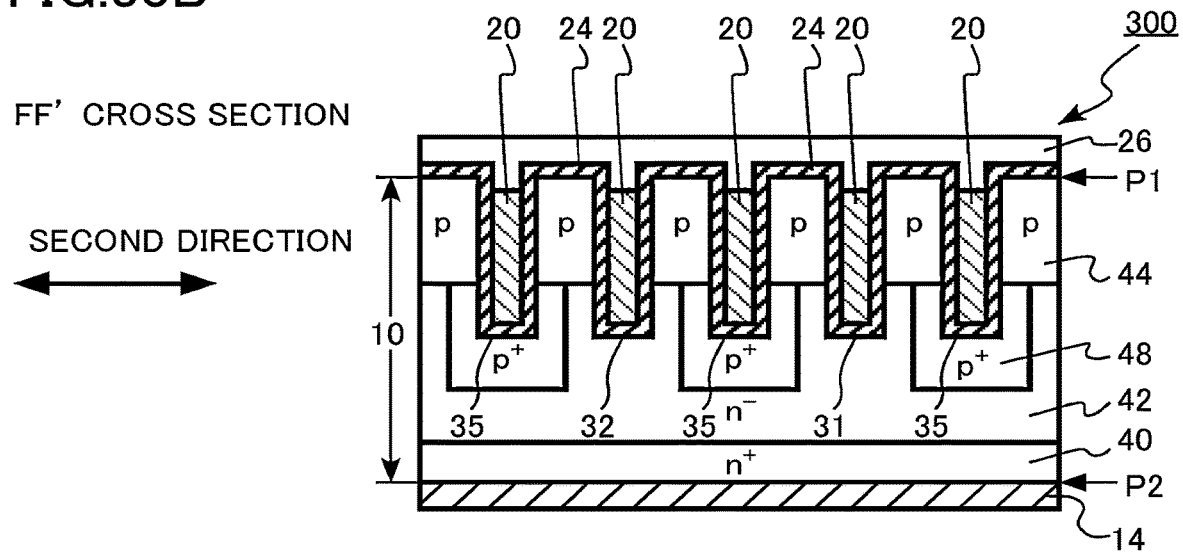

FIGS. 30 to 33B are schematic cross-sectional views of the semiconductor device of the third embodiment. FIG. 30 is a cross-sectional view taken along the line GG' of FIGS. 31A and 31B. FIG. 31A is a cross-sectional view taken along the line AA' of FIGS. 29 and 30. FIG. 31B is a cross-sectional view taken along the line BB' of FIGS. 29 and 30. FIG. 32A is a cross-sectional view taken along the line CC' of FIGS. 29 and 30. FIG. 32B is a cross-sectional view taken along the line DD' of FIGS. 29 and 30. FIG. 33A is a cross-sectional view taken along the line EE' of FIGS. 29 and 30. FIG. 33B is a cross-sectional view taken along the line FF' of FIGS. 29 and 30.

The MOSFET 300 includes a silicon carbide layer 10, a source electrode 12 (first electrode), a drain electrode 14 (second electrode), a gate electrode pad 16, a metal wiring 18, a gate electrode 20, a gate wiring 22, a gate insulating layer 24, and an interlayer insulating layer 26. The source electrode 12 has a contact region 12*a*. The interlayer insulating layer 26 has a contact hole 26*a*.

The source electrode 12 is an example of the first electrode. The drain electrode 14 is an example of the second electrode.

The silicon carbide layer 10 includes a first gate trench 31 (first trench), a second gate trench 32 (second trench), a contact trench 33 (third trench), an outer peripheral trench 34 (fourth trench), an intermediate trench 35 (fifth trench), an n$^+$-type drain region 40, an n$^-$-type drift region 42 (first silicon carbide region), a p-type body region 44 (second silicon carbide region), an n$^+$-type source region 46 (third silicon carbide region), and a p$^+$-type electric field relaxation region 48 (fourth silicon carbide region).

The first gate trench 31 is an example of the first trench. The second gate trench 32 is an example of the second trench. The contact trench 33 is an example of the third trench. The outer peripheral trench 34 is an example of the fourth trench. The intermediate trench 35 is an example of the fifth trench. The drift region 42 is an example of the first silicon carbide region. The body region 44 is an example of the second silicon carbide region. The source region 46 is an example of the third silicon carbide region. The electric field relaxation region 48 is an example of the fourth silicon carbide region.

The contact trench 33 and the intermediate trench 35 are separated from each other in a first direction. The drift region 42 and the body region 44 are provided between the contact trench 33 and the intermediate trench 35.

As illustrated in FIG. 31A, neither the gate electrode 20 nor the gate wiring 22 is present between the end E of the first gate trench 31 in the first direction and the interlayer insulating layer 26. For example, the gate insulating layer 24 and the interlayer insulating layer 26 are in contact with each other at the end E of the first gate trench 31 in the first direction.

According to the MOSFET 300 of the third embodiment, similarly to the MOSFET 100 of the first embodiment, neither the gate electrode 20 nor the gate wiring 22 is present between the end E of the first gate trench 31 in the first direction and the interlayer insulating layer 26. Therefore, similarly to the MOSFET 100 of the first embodiment, the reliability of the MOSFET 300 is improved.

Further, in the MOSFET 300 of the third embodiment, similarly to the MOSFET 100 of the second embodiment, the outer peripheral trench 34 is embedded with the gate electrode 20. Therefore, flatness of a face of the interlayer insulating layer 26 on the outer peripheral trench 34 is improved. Therefore, for example, patterning of a metal film for forming the source electrode 12 or the metal wiring 18 is facilitated.

Further, in the MOSFET 300 of the third embodiment, the contact trench 33 and the intermediate trench 35 are separated from each other in the first direction. Therefore, for example, an electrical short circuit between the contact region 12a and the gate electrode 20 via the trench can be suppressed. Therefore, the yield of the MOSFET 300 is improved.

As described above, according to the third embodiment, a MOSFET capable of improving reliability can be realized.

Fourth Embodiment

A semiconductor device according to a fourth embodiment is different from the semiconductor device according to the third embodiment in that a fourth trench and a fifth trench are separated from each other. Hereinafter, description of contents overlapping with those of the first to third embodiments may be partially omitted.

The semiconductor device according to the fourth embodiment is a vertical MOSFET 400 using silicon carbide. The MOSFET 400 is a MOSFET having a trench gate structure in which a gate electrode is provided in a trench. Further, the MOSFET 400 is a MOSFET having a so-called double trench structure in which a source electrode is provided in a trench. Further, the MOSFET 400 is an n-channel MOSFET using electrons as carriers.

Figure 34:
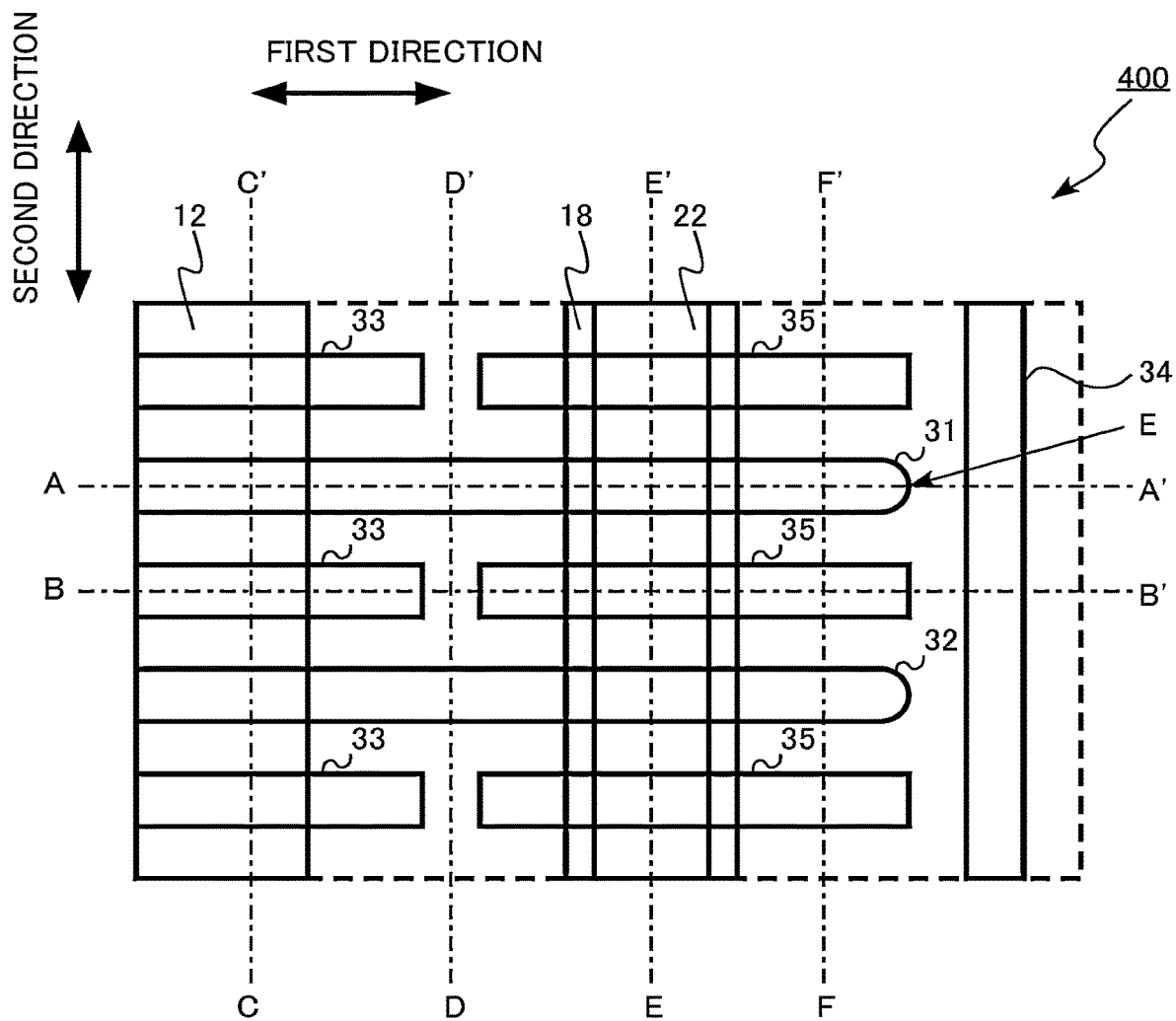
FIG. 34 is an enlarged schematic top view of a semiconductor device according to a fourth embodiment.

FIG. 34 is an enlarged schematic top view of the semiconductor device according to the fourth embodiment. FIG. 34 illustrates a pattern layout of a trench, a source electrode, a gate wiring, and a metal wiring. FIG. 34 is a diagram corresponding to FIG. 29.

Figure 35:
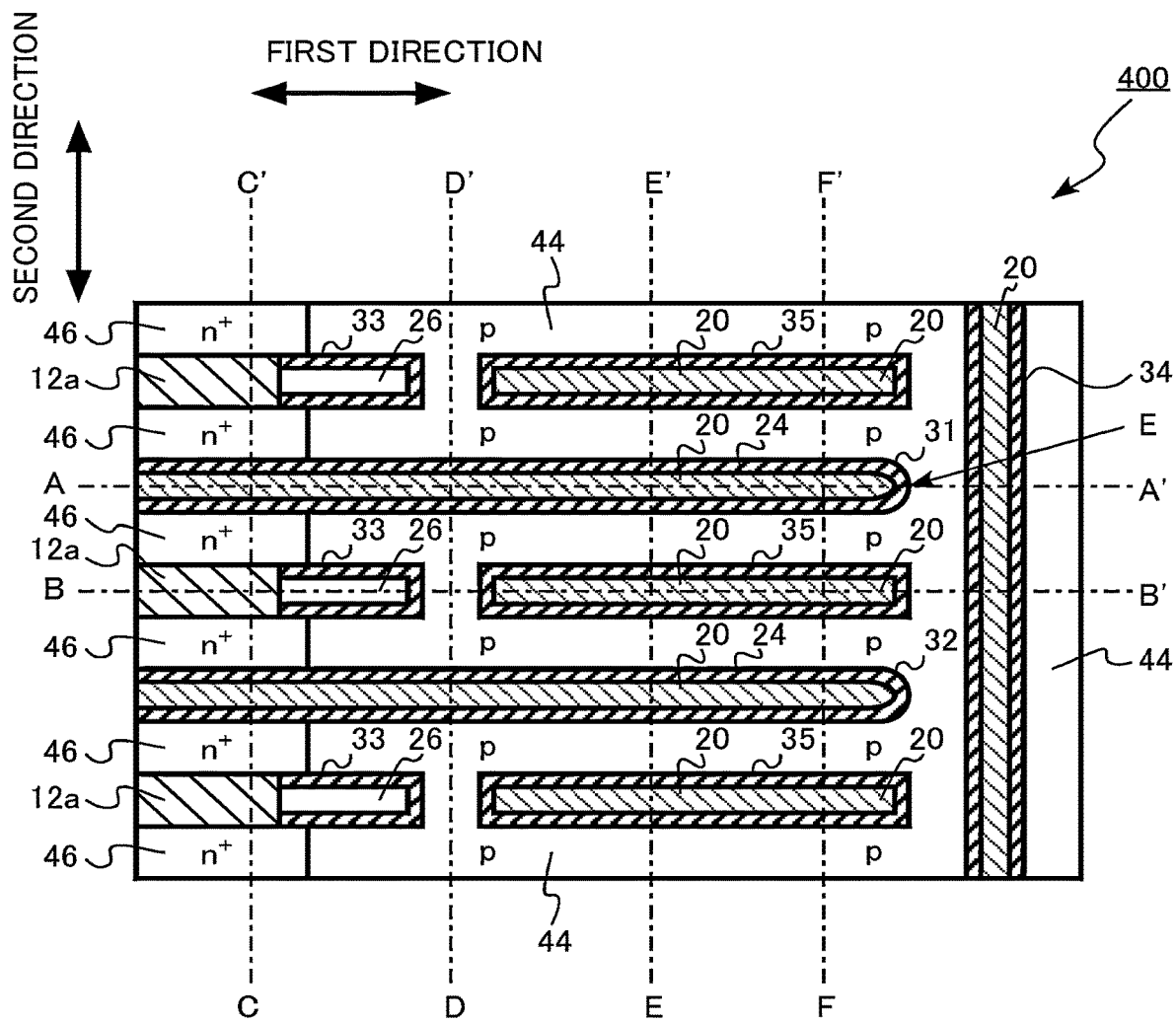
FIG. 35 is a schematic cross-sectional view of the semiconductor device according to the fourth embodiment.
Figure 37A:
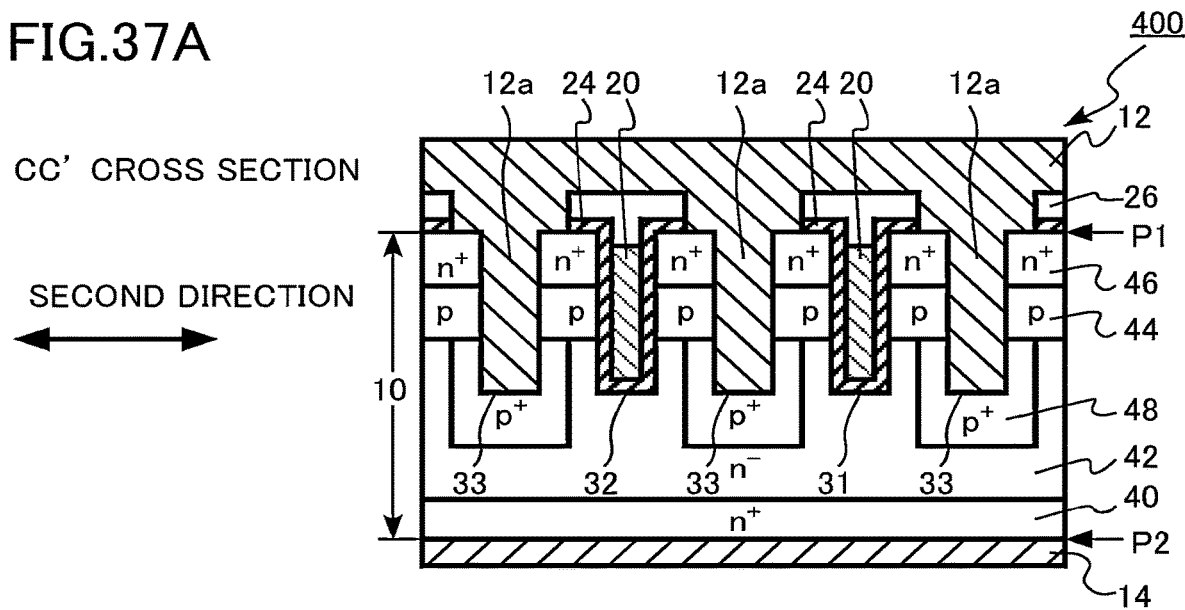
FIGS. 37A and 37B are schematic cross-sectional views of the semiconductor device according to the fourth embodiment.
Figure 37B:
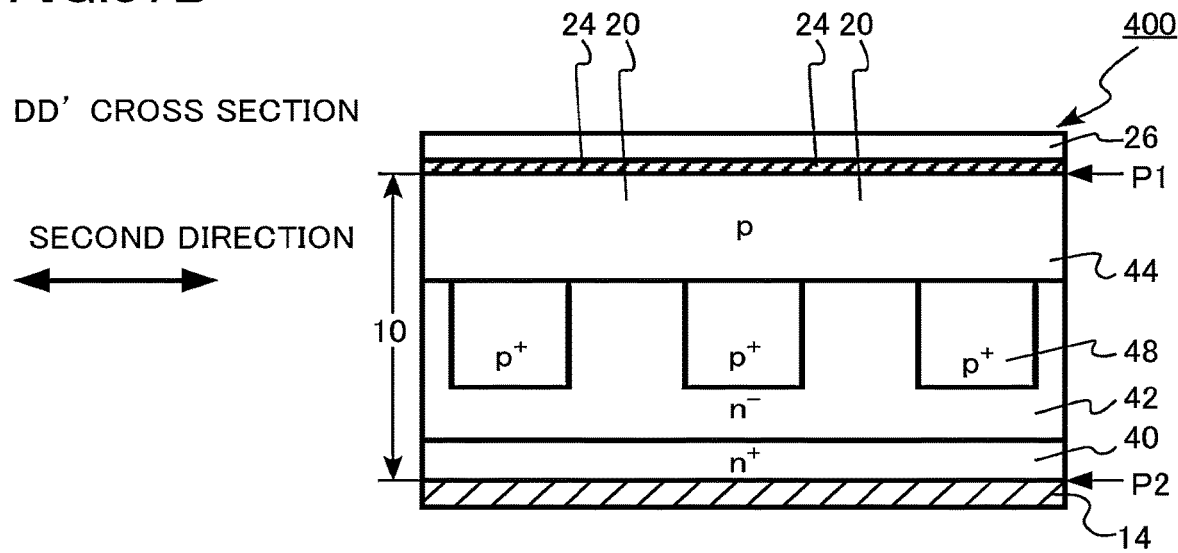
Figure 38A:
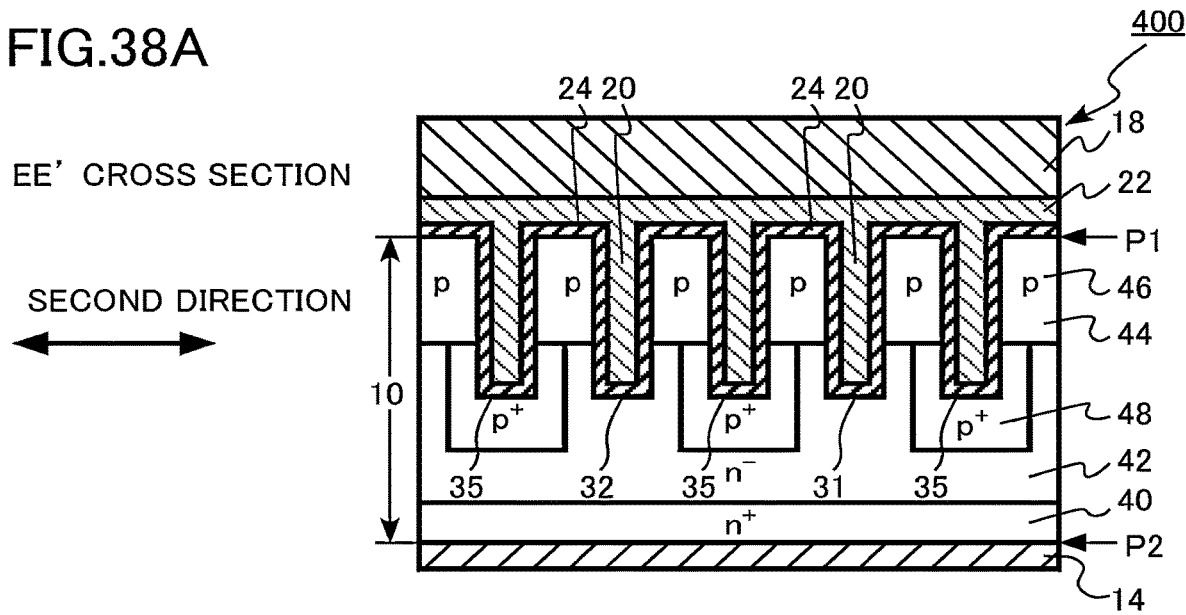
FIGS. 38A and 38B are schematic cross-sectional views of the semiconductor device according to the fourth embodiment.
Figure 38B:
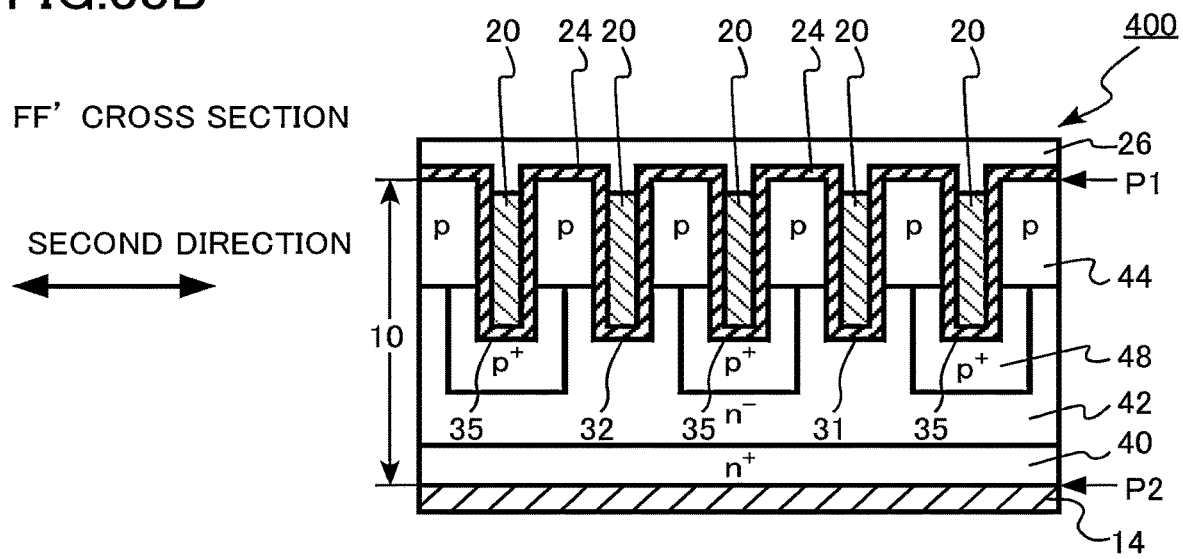

FIGS. 35 to 38B are schematic cross-sectional views of the semiconductor device of the fourth embodiment. FIG. 35 is a cross-sectional view taken along the line GG' of FIGS. 36A and 36B. FIG. 36A is a cross-sectional view taken along the line AA' of FIGS. 34 and 35. FIG. 36B is a cross-sectional view taken along the line BB' of FIGS. 34 and 35. FIG. 37A is a cross-sectional view taken along the line CC' of FIGS. 34 and 35. FIG. 37B is a cross-sectional view taken along the line DD' of FIGS. 34 and 35. FIG. 38A is a cross-sectional view taken along the line EE' of FIGS. 34 and 35. FIG. 38B is a cross-sectional view taken along the line FF' of FIGS. 34 and 35.

The MOSFET 400 includes a silicon carbide layer 10, a source electrode 12 (first electrode), a drain electrode 14 (second electrode), a gate electrode pad 16, a metal wiring 18, a gate electrode 20, a gate wiring 22, a gate insulating layer 24, and an interlayer insulating layer 26. The source electrode 12 has a contact region 12a. The interlayer insulating layer 26 has a contact hole 26a.

The source electrode 12 is an example of the first electrode. The drain electrode 14 is an example of the second electrode.

The silicon carbide layer 10 includes a first gate trench 31 (first trench), a second gate trench 32 (second trench), a contact trench 33 (third trench), an outer peripheral trench 34 (fourth trench), an intermediate trench 35 (fifth trench), an $n^+$-type drain region 40, an $n^-$-type drift region 42 (first silicon carbide region), a p-type body region 44 (second silicon carbide region), an $n^+$-type source region 46 (third silicon carbide region), and a $p^+$-type electric field relaxation region 48 (fourth silicon carbide region).

The first gate trench 31 is an example of the first trench. The second gate trench 32 is an example of the second trench. The contact trench 33 is an example of the third trench. The outer peripheral trench 34 is an example of the fourth trench. The intermediate trench 35 is an example of the fifth trench. The drift region 42 is an example of the first silicon carbide region. The body region 44 is an example of the second silicon carbide region. The source region 46 is an example of the third silicon carbide region. The electric field relaxation region 48 is an example of the fourth silicon carbide region.

The outer peripheral trench 34 and the intermediate trench 35 are separated from each other in the first direction. The electric field relaxation region 48 and the body region 44 are provided between the outer peripheral trench 34 and the intermediate trench 35.

As illustrated in FIG. 36A, neither the gate electrode 20 nor the gate wiring 22 is present between an end E of the first gate trench 31 in the first direction and the interlayer insulating layer 26. For example, the gate insulating layer 24 and the interlayer insulating layer 26 are in contact with each other at the end E of the first gate trench 31 in the first direction.

According to the MOSFET 400 of the fourth embodiment, similarly to the MOSFET 100 of the first embodiment, neither the gate electrode 20 nor the gate wiring 22 is present between the end E of the first gate trench 31 in the first direction and the interlayer insulating layer 26. Therefore, similarly to the MOSFET 100 of the first embodiment, the reliability of the MOSFET 400 is improved.

Further, in the MOSFET 400 according to the fourth embodiment, similarly to the MOSFET 200 according to the second embodiment, the outer peripheral trench 34 is embedded with the gate electrode 20. Therefore, flatness of a face of the interlayer insulating layer 26 on the outer peripheral trench 34 is improved. Therefore, for example, patterning of a metal film for forming the source electrode 12 or the metal wiring 18 is facilitated.

Further, in the MOSFET 400 of the fourth embodiment, similarly to the MOSFET 300 of the third embodiment, the contact trench 33 and the intermediate trench 35 are separated in the first direction. Therefore, for example, an electrical short circuit between the contact region 12a and the gate electrode 20 via the trench can be suppressed. Therefore, the yield of the MOSFET 400 is improved.

Further, in the MOSFET 400 according to the fourth embodiment, since the outer peripheral trench 34 and the intermediate trench 35 are separated from each other in the first direction, there is no intersection portion between the outer peripheral trench 34 and the intermediate trench 35. If there is an intersection portion between the outer peripheral trench 34 and the intermediate trench 35 as in the MOSFET 300 of the third embodiment, for example, the embeddability of the gate electrode 20 at this portion is degraded, and the flatness of the interlayer insulating layer 26 is degraded.

In the MOSFET 400 of the fourth embodiment, since there is no intersection portion between the outer peripheral trench 34 and the intermediate trench 35, for example, the flatness of the interlayer insulating layer 26 is improved. Therefore, for example, patterning of a metal film for forming the source electrode 12 or the metal wiring 18 is facilitated.

As described above, according to the fourth embodiment, a MOSFET capable of improving reliability can be realized.

Fifth Embodiment

A semiconductor device of a fifth embodiment is different from the semiconductor device of the fourth embodiment in that a fourth trench is embedded with an interlayer insulating layer. Hereinafter, description of contents overlapping with those of the first to fourth embodiments may be partially omitted.

The semiconductor device according to the fifth embodiment is a vertical MOSFET 500 using silicon carbide. The MOSFET 500 is a MOSFET having a trench gate structure in which a gate electrode is provided in a trench. Further, the MOSFET 500 is a MOSFET having a so-called double trench structure in which a source electrode is provided in a trench. Further, the MOSFET 500 is an n-channel MOSFET using electrons as carriers.

Figure 39:
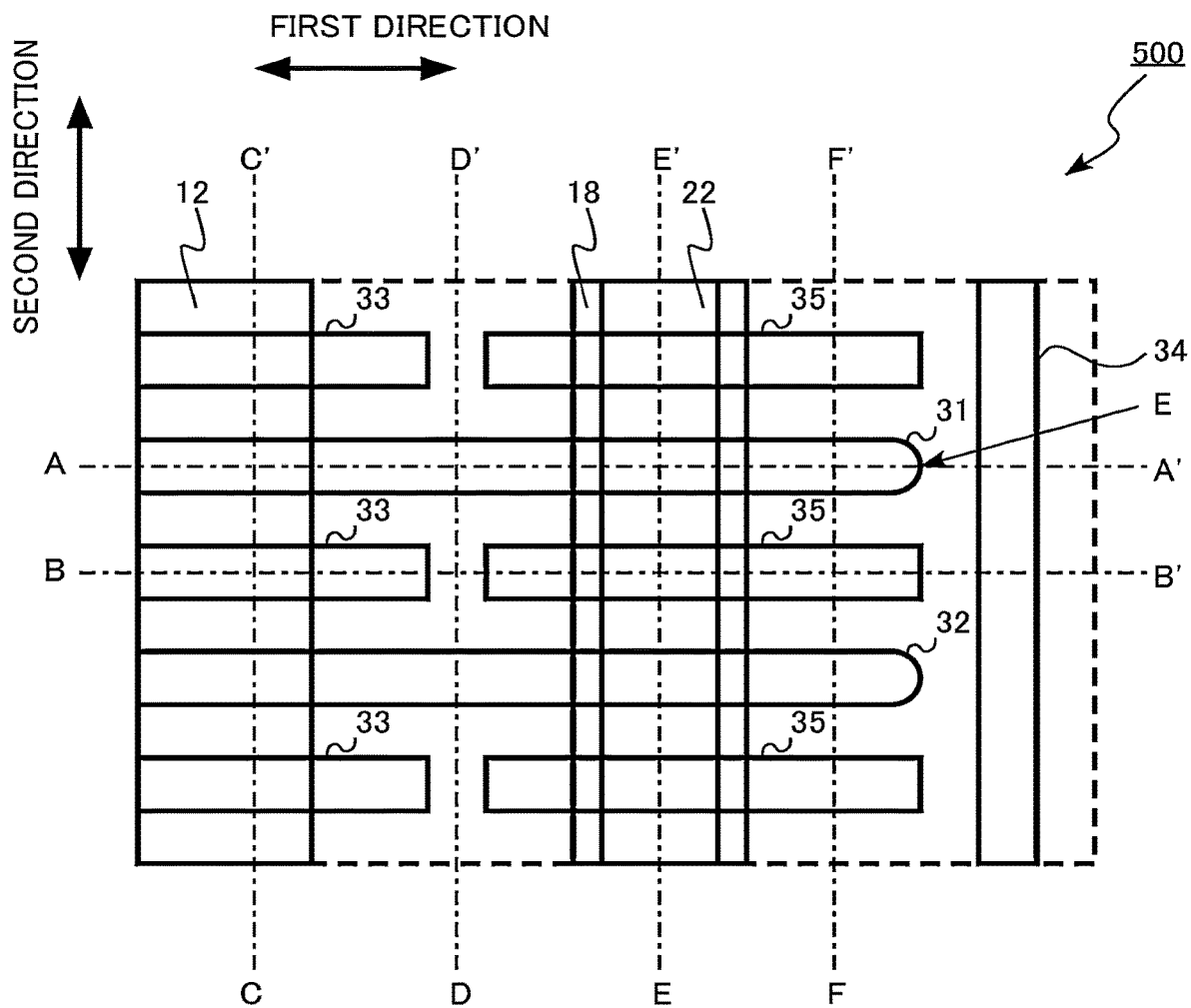
FIG. 39 is an enlarged schematic top view of a semiconductor device according to a fifth embodiment.

FIG. 39 is an enlarged schematic top view of the semiconductor device according to the fifth embodiment. FIG. 39 illustrates a pattern layout of a trench, a source electrode, a gate wiring, and a metal wiring. FIG. 39 is a diagram corresponding to FIG. 34.

Figure 40:
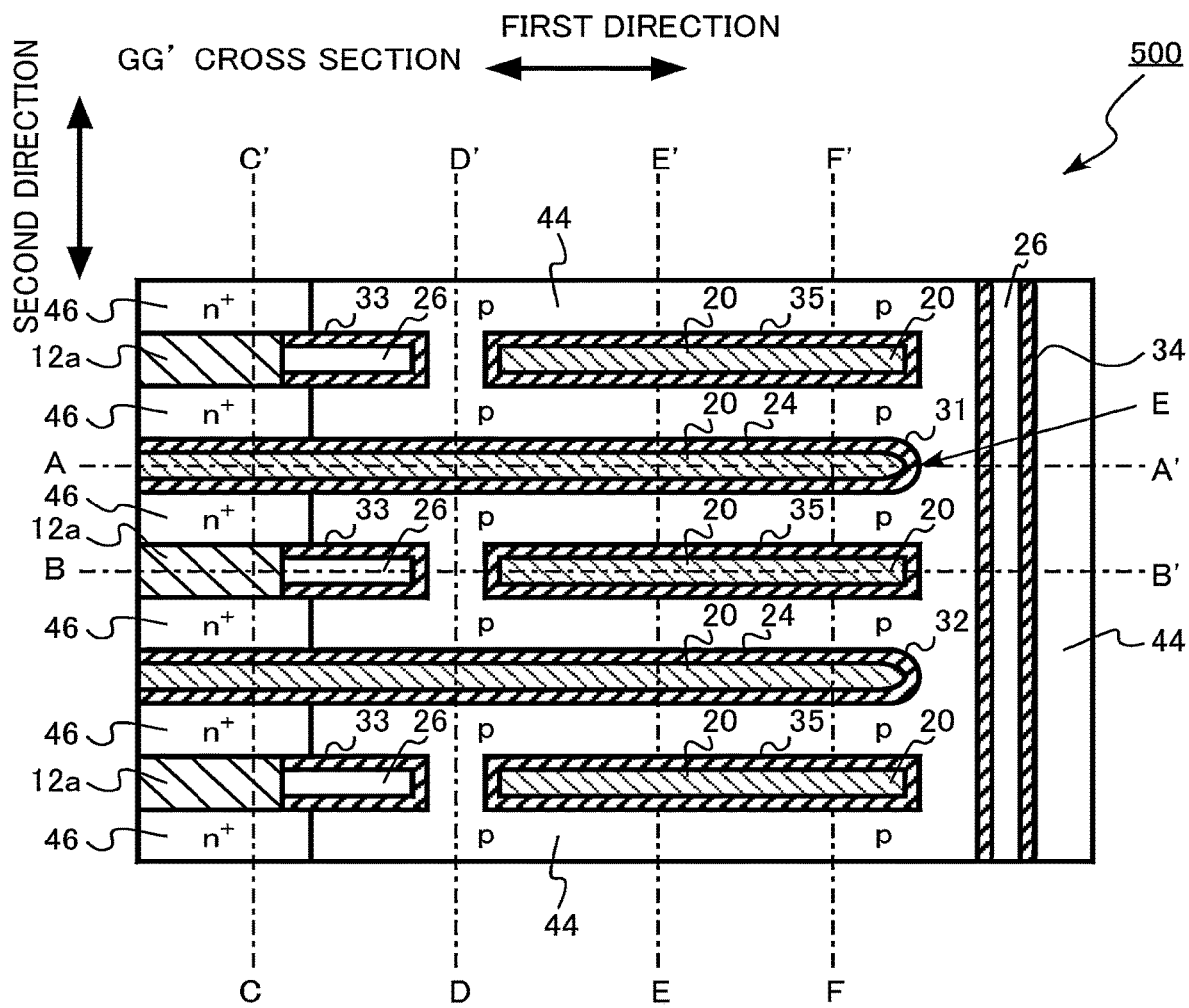
FIG. 40 is a schematic cross-sectional view of the semiconductor device according to the fifth embodiment.
Figure 43A:
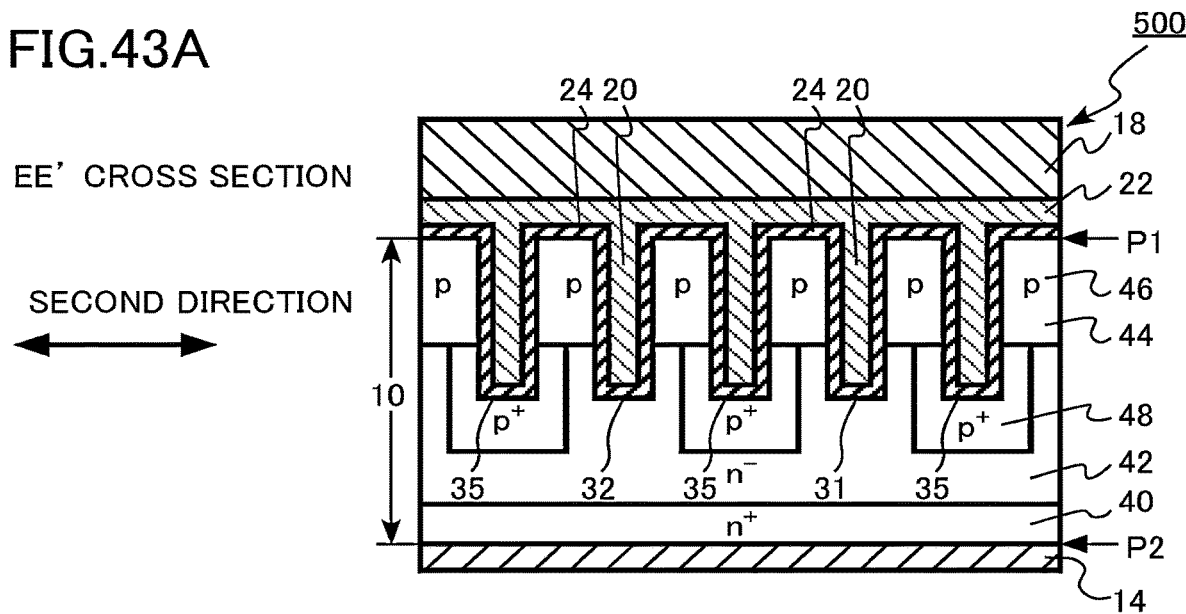
FIGS. 43A and 43B are schematic cross-sectional views of the semiconductor device according to the fifth embodiment.
Figure 43B:
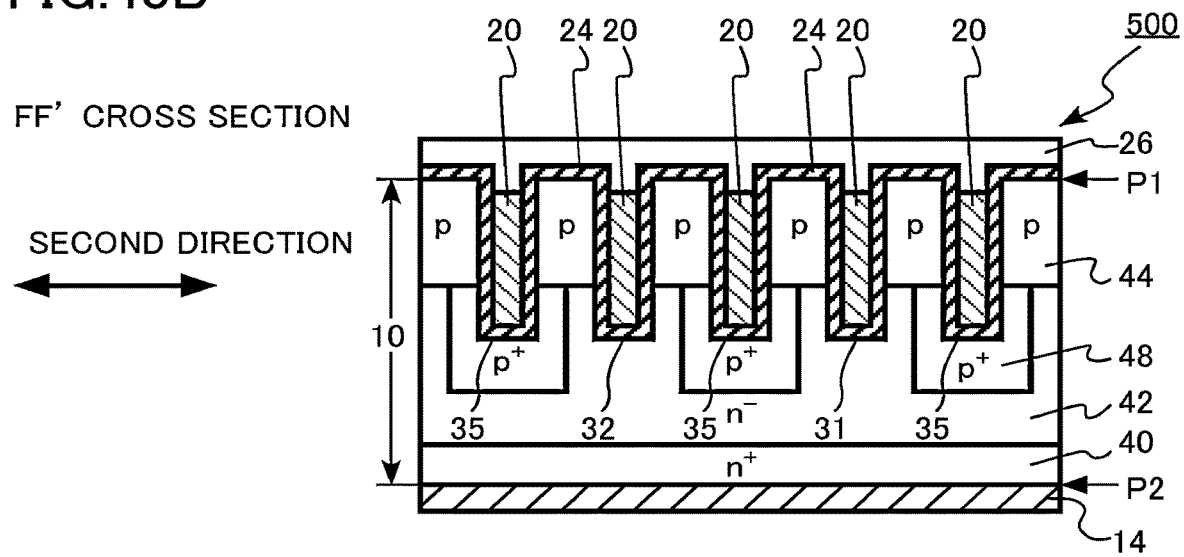

FIGS. 40 to 43B are schematic cross-sectional views of the semiconductor device of the fifth embodiment. FIG. 40 is a cross-sectional view taken along the line GG' of FIGS. 41A and 41B. FIG. 41A is a cross-sectional view taken along the line AA' of FIGS. 39 and 40. FIG. 41B is a cross-sectional view taken along the line BB' of FIGS. 39 and 40. FIG. 42A is a cross-sectional view taken along the line CC' of FIGS. 39 and 40. FIG. 42B is a cross-sectional view taken along the line DD' of FIGS. 39 and 40. FIG. 43A is a cross-sectional view taken along the line EE' of FIGS. 39 and 40. FIG. 43B is a cross-sectional view taken along the line FF' of FIGS. 39 and 40.

The MOSFET 500 includes a silicon carbide layer 10, a source electrode 12 (first electrode), a drain electrode 14 (second electrode), a gate electrode pad 16, a metal wiring 18, a gate electrode 20, a gate wiring 22, a gate insulating layer 24, and an interlayer insulating layer 26. The source electrode 12 has a contact region 12*a*. The interlayer insulating layer 26 has a contact hole 26*a*.

The source electrode 12 is an example of the first electrode. The drain electrode 14 is an example of the second electrode.

The silicon carbide layer 10 includes a first gate trench 31 (first trench), a second gate trench 32 (second trench), a contact trench 33 (third trench), an outer peripheral trench 34 (fourth trench), an intermediate trench 35 (fifth trench), an n$^+$-type drain region 40, an n$^-$-type drift region 42 (first silicon carbide region), a p-type body region 44 (second silicon carbide region), an n$^+$-type source region 46 (third silicon carbide region), and a p$^+$-type electric field relaxation region 48 (fourth silicon carbide region).

The first gate trench 31 is an example of the first trench. The second gate trench 32 is an example of the second trench. The contact trench 33 is an example of the third trench. The outer peripheral trench 34 is an example of the fourth trench. The intermediate trench 35 is an example of the fifth trench. The drift region 42 is an example of the first silicon carbide region. The body region 44 is an example of the second silicon carbide region. The source region 46 is an example of the third silicon carbide region. The electric field relaxation region 48 is an example of the fourth silicon carbide region.

The outer peripheral trench 34 is embedded with an interlayer insulating layer 26.

Figure 41A:
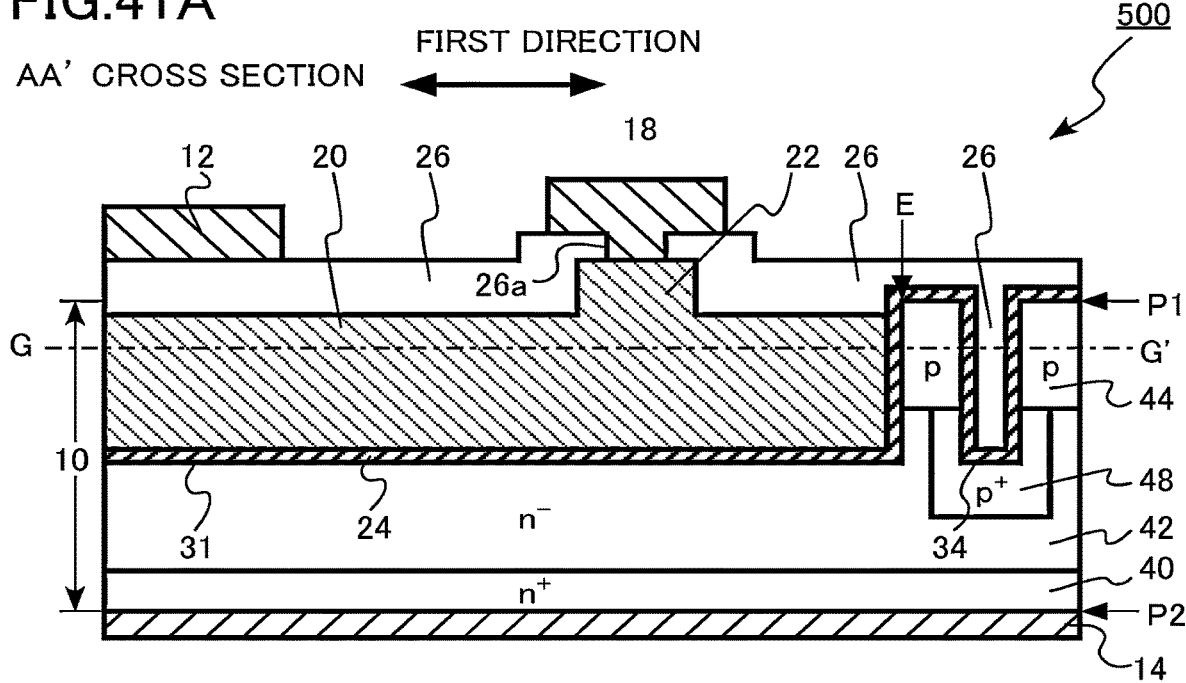
FIGS. 41A and 41B are schematic cross-sectional views of the semiconductor device according to the fifth embodiment.
Figure 41B:
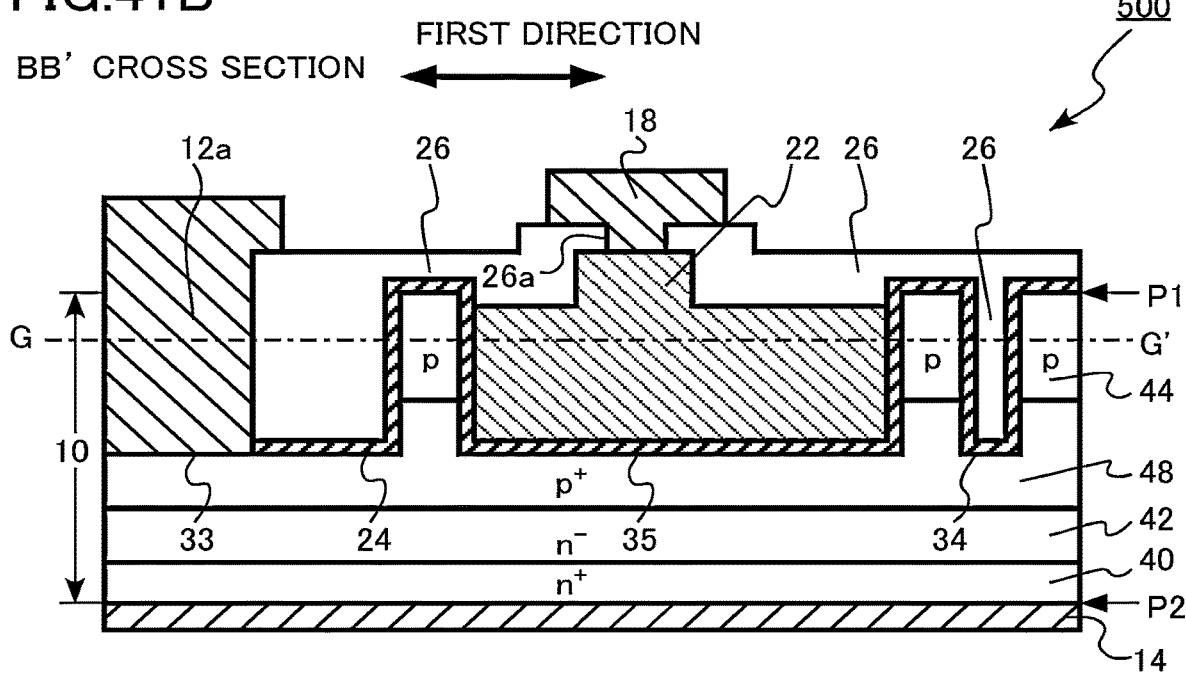
Figure 42A:
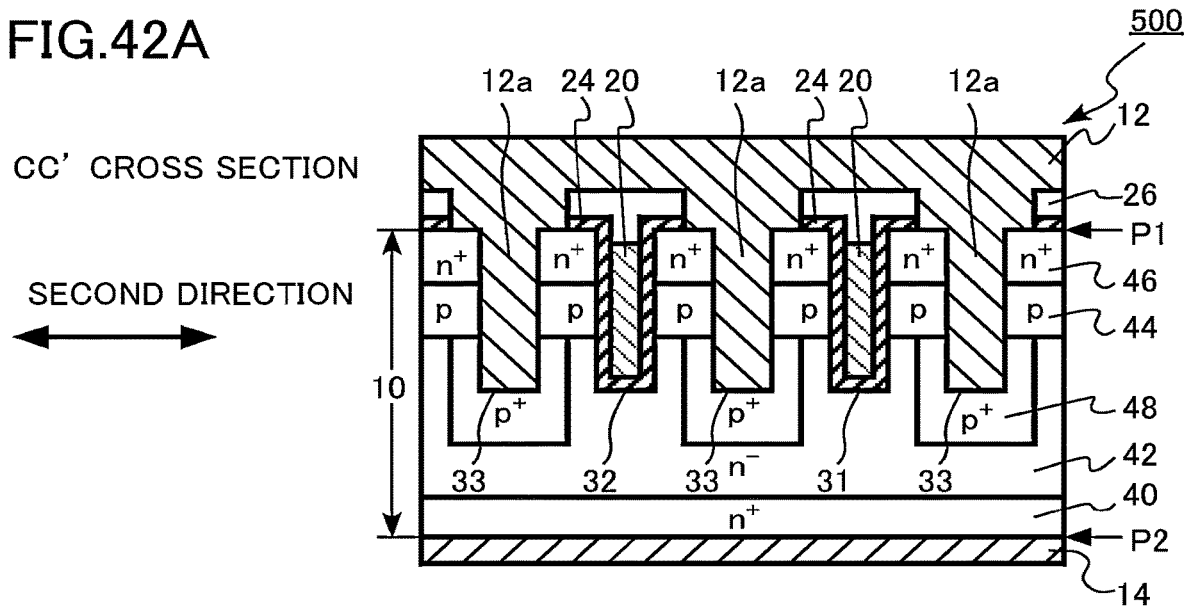
FIGS. 42A and 42B are schematic cross-sectional views of the semiconductor device according to the fifth embodiment.
Figure 42B:
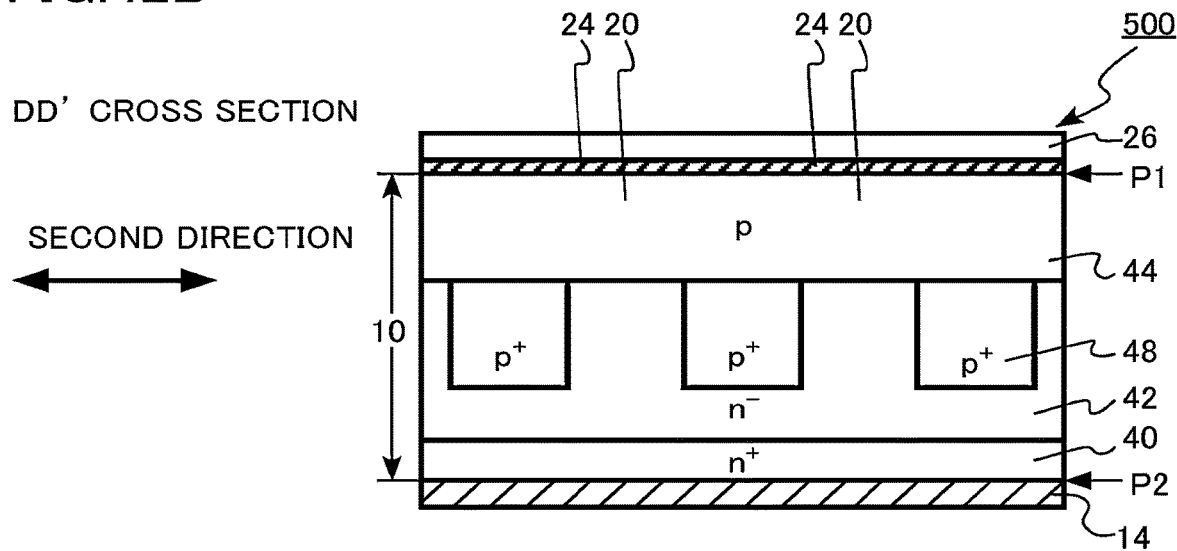

As illustrated in FIG. 41A, neither the gate electrode 20 nor the gate wiring 22 is present between an end E of the first gate trench 31 in the first direction and the interlayer insulating layer 26. For example, the gate insulating layer 24 and the interlayer insulating layer 26 are in contact with each other at the end E of the first gate trench 31 in the first direction.

According to the MOSFET 500 of the fifth embodiment, similarly to the MOSFET 100 of the first embodiment, neither the gate electrode 20 nor the gate wiring 22 is present between the end E of the first gate trench 31 in the first direction and the interlayer insulating layer 26. Therefore, similarly to the MOSFET 100 of the first embodiment, the reliability of the MOSFET 500 is improved.

Further, in the MOSFET 500 of the fifth embodiment, the contact trench 33 and the intermediate trench 35 are separated in the first direction, similarly to the MOSFET 300 of the third embodiment. Therefore, for example, an electrical short circuit between the contact region 12*a* and the gate electrode 20 via the trench can be suppressed. Therefore, the yield of the MOSFET 500 is improved.

Furthermore, in the MOSFET 500 according to the fifth embodiment, similarly to the MOSFET 400 according to the fourth embodiment, since the outer peripheral trench 34 and the intermediate trench 35 are separated from each other in the first direction, there is no intersection portion between the outer peripheral trench 34 and the intermediate trench 35. Therefore, for example, patterning of a metal film for forming the source electrode 12 or the metal wiring 18 is facilitated.

As described above, according to the fifth embodiment, a MOSFET capable of improving reliability can be realized.

Sixth Embodiment

An inverter circuit and a drive device according to a sixth embodiment are an inverter circuit and a drive device including the semiconductor device according to the first embodiment.

Figure 44:
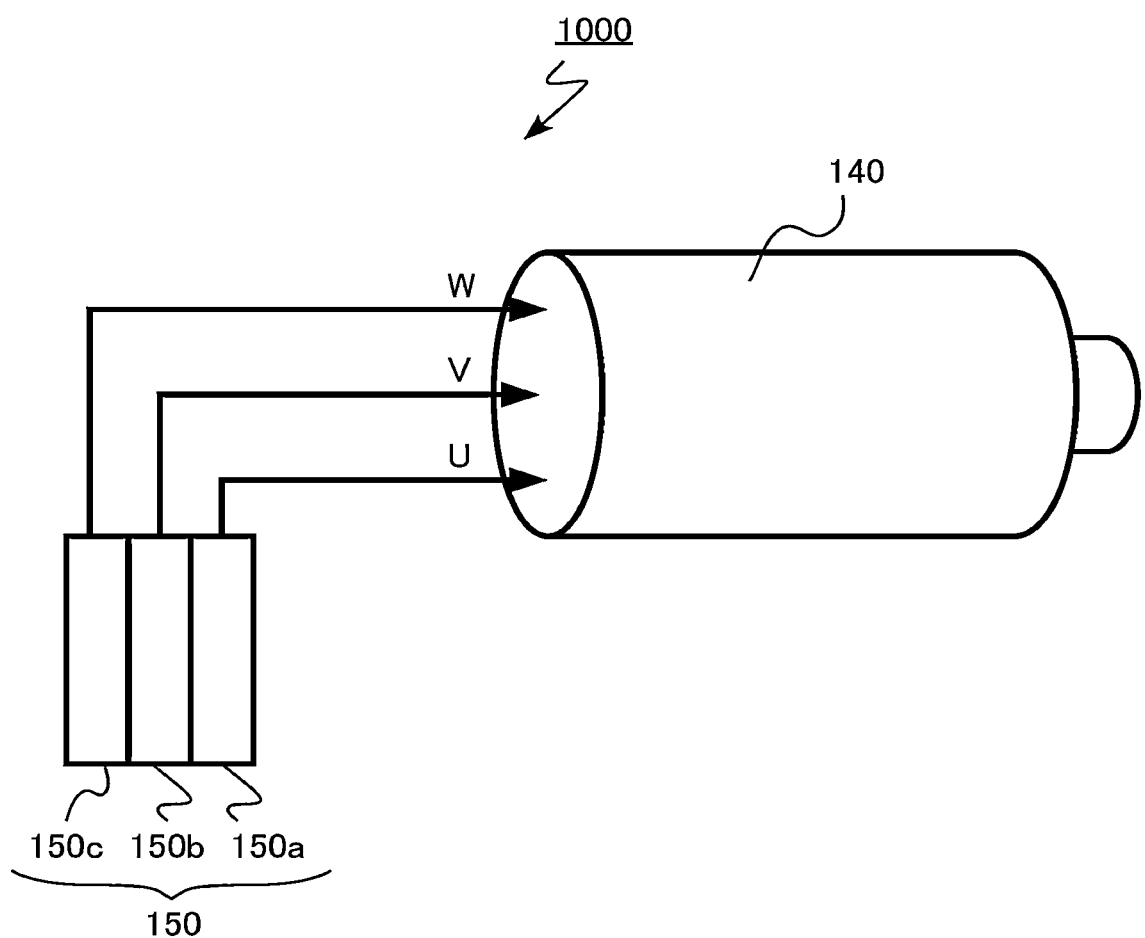
FIG. 44 is a schematic diagram of a drive device according to a sixth embodiment.

FIG. 44 is a schematic diagram of the drive device according to the sixth embodiment. A drive device 1000 includes a motor 140 and an inverter circuit 150.

The inverter circuit 150 includes three semiconductor modules 150*a*, 150*b*, and 150*c* using the MOSFET 100 according to the first embodiment as a switching element. By connecting the three semiconductor modules 150*a*, 150*b*, and 150*c* in parallel, the three-phase inverter circuit 150 including three AC voltage output terminals U, V, and W is realized. The motor 140 is driven by an AC voltage output from the inverter circuit 150.

According to the sixth embodiment, characteristics of the inverter circuit 150 and the drive device 1000 are improved by including the MOSFET 100 having improved characteristics.

Seventh Embodiment

A vehicle according to a seventh embodiment is a vehicle including the semiconductor device according to the first embodiment.

Figure 45:
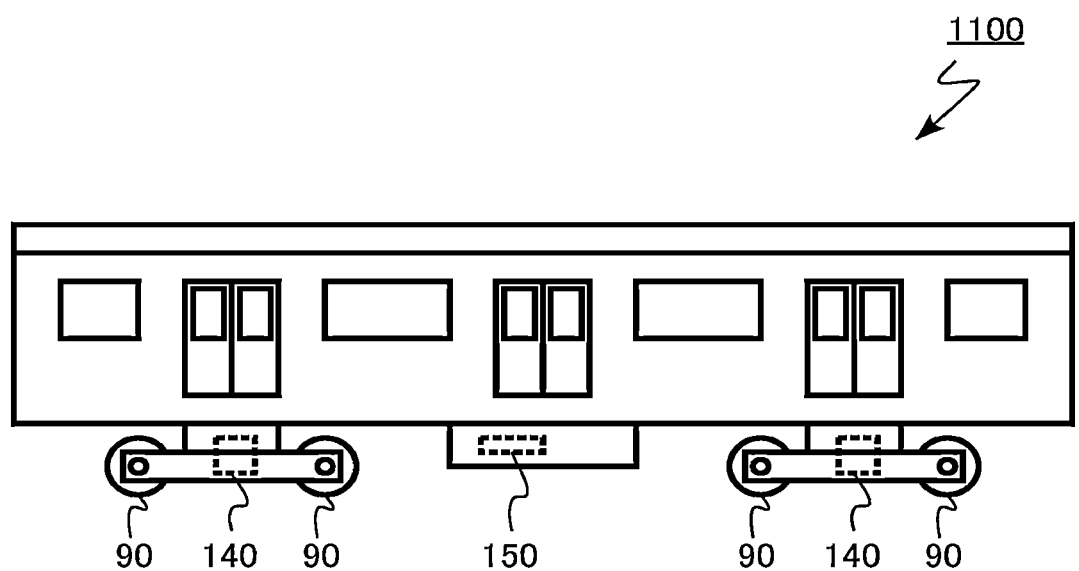
FIG. 45 is a schematic diagram of a vehicle according to a seventh embodiment.

FIG. 45 is a schematic diagram of the vehicle according to the seventh embodiment. A vehicle 1100 according to the seventh embodiment is a railroad vehicle. The vehicle 1100 includes motors 140 and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized. The motor 140 is driven by an AC voltage output from the inverter circuit 150. Wheels 90 of the vehicle 1100 are rotated by the motor 140.

According to the seventh embodiment, characteristics of the vehicle 1100 are improved by including the MOSFET 100 having improved characteristics.

Eighth Embodiment

A vehicle according to an eighth embodiment is a vehicle including a semiconductor device according to the first embodiment.

Figure 46:
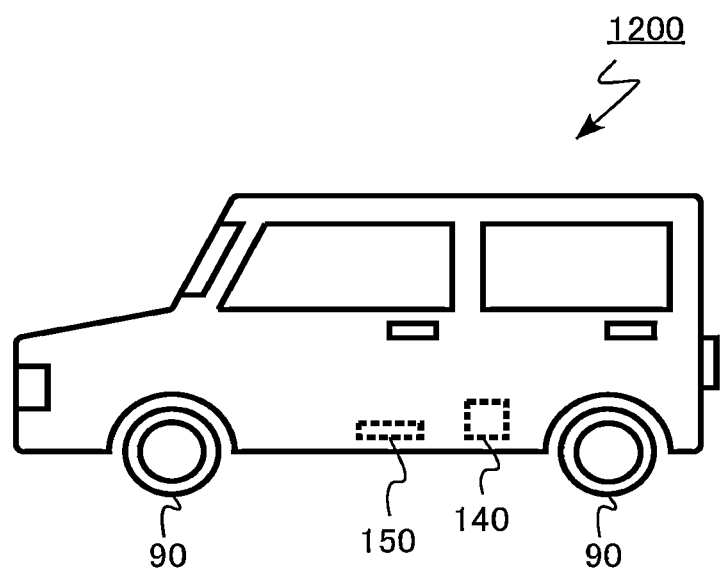
FIG. 46 is a schematic diagram of a vehicle according to an eighth embodiment.

FIG. 46 is a schematic diagram of the vehicle according to the eighth embodiment. A vehicle 1200 according to the eighth embodiment is an automobile. The vehicle 1200 includes a motor 140 and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized.

The motor 140 is driven by an AC voltage output from the inverter circuit 150. Wheels 90 of the vehicle 1200 are rotated by the motor 140.

According to the eighth embodiment, characteristics of the vehicle 1200 are improved by including the MOSFET 100 having improved characteristics.

Ninth Embodiment

An elevator according to a ninth embodiment is an elevator including the semiconductor device according to the first embodiment.

Figure 47:
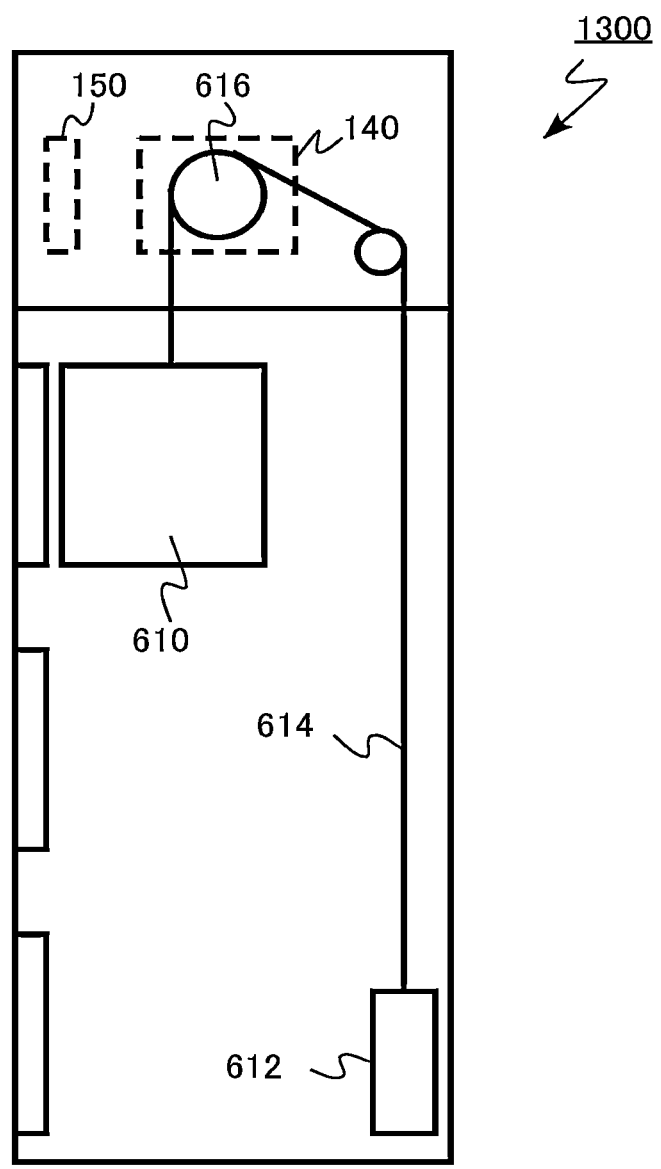
FIG. 47 is a schematic diagram of an elevator according to a ninth embodiment.

FIG. 47 is a schematic diagram of the elevator according to the ninth embodiment. An elevator 1300 according to the ninth embodiment includes a car 610, a counter weight 612, a wire rope 614, a winding machine 616, a motor 140, and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized.

The motor 140 is driven by an AC voltage output from the inverter circuit 150. The winding machine 616 is rotated by the motor 140 and the car 610 is elevated.

According to the ninth embodiment, characteristics of the elevator 1300 are improved by including the MOSFET 100 having improved characteristics.

In the first to fifth embodiments described above, the case where 4H—SiC is used as a crystal structure of silicon carbide has been described as an example. However, the present disclosure can be applied to silicon carbide of other crystal structure such as 6H—SiC and 3C—SiC.

Further, in the sixth to ninth embodiments, the case where the semiconductor device according to the first embodiment is included has been described as an example. However, the semiconductor device according to any one of the second to fifth embodiments can be applied.

Further, in the sixth to ninth embodiments, the case where the semiconductor device according to the present disclosure is applied to the vehicle or the elevator has been described as an example. However, the semiconductor device according to the present disclosure can be applied to a power conditioner of a photovoltaic power generation system and the like.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first plane parallel to a first direction and a second direction orthogonal to the first direction, and a second plane facing the first plane, the silicon carbide layer including a first trench provided on a side of the first plane and extending in the first direction, a second trench provided on the side of the first plane, the second trench extending in the first direction, and the second trench separated from the first trench in the second direction, an n-type first silicon carbide region, a p-type second silicon carbide region provided between the first silicon carbide region and the first plane and provided between the first trench and the second trench, and an n-type third silicon carbide region provided between the second silicon carbide region and the first plane and provided between the first trench and the second trench;
   a gate electrode provided in the first trench and the second trench;
   a gate insulating layer provided between the gate electrode and the silicon carbide layer;
   a gate wiring extending in the second direction, the gate wiring intersecting with the first trench and the second trench, the gate wiring connected to the gate electrode, and the gate wiring made of a same material as the gate electrode;
   a first electrode provided on the side of the first plane of the silicon carbide layer and electrically connected to the third silicon carbide region;
   a second electrode provided on a side of the second plane of the silicon carbide layer; and
   an interlayer insulating layer provided between the gate electrode and the first electrode, wherein
   neither the gate electrode nor the gate wiring is present between an end of the first trench in the first direction and the interlayer insulating layer.

2. The semiconductor device according to claim 1, wherein
   the gate electrode and the gate wiring are made of polycrystalline silicon.

3. The semiconductor device according to claim 1, wherein the gate insulating layer is provided between the first plane between the first trench and the second trench and the gate wiring, and the gate wiring is in contact with the gate insulating layer.

4. The semiconductor device according to claim 1, further comprising:
a metal wiring extending in the second direction, the metal wiring intersecting with the first trench and the second trench, the interlayer insulating layer being provided between the gate wiring and the metal wiring, and the metal wiring being electrically connected to the gate wiring.

5. The semiconductor device according to claim 4, wherein
the metal wiring is in contact with the gate wiring.

6. The semiconductor device according to claim 4, wherein
the metal wiring and the first electrode are made of a same material.

7. The semiconductor device according to claim 1, wherein
the silicon carbide layer further includes
a third trench provided on the side of the first plane, the third trench extending in the first direction, and the third trench provided between the first trench and the second trench;
a fourth trench provided on the side of the first plane, the fourth trench extending in the second direction, and the fourth trench separated from the first trench and the second trench in the first direction;
a fifth trench provided on the side of the first plane, the fifth trench extending in the first direction, the fifth trench provided between the first trench and the second trench, the fifth trench provided between the third trench and the fourth trench, and the fifth trench intersecting with the gate wiring; and
a p-type fourth silicon carbide region provided between the third trench and the first silicon carbide region,
a part of the first electrode is provided in the third trench, and the first electrode is electrically connected to the fourth silicon carbide region, and
the gate electrode is further provided in the fifth trench.

8. The semiconductor device according to claim 7, wherein
the fourth silicon carbide region is provided between the fourth trench and the first silicon carbide region and between the fifth trench and the first silicon carbide region.

9. The semiconductor device according to claim 7, wherein
the third trench, the fourth trench, and the fifth trench are continuous.

10. The semiconductor device according to claim 7, wherein
the third trench and the fifth trench are separated from each other.

11. The semiconductor device according to claim 10, wherein
the fourth trench and the fifth trench are separated from each other.

12. The semiconductor device according to claim 7, wherein
the gate electrode is further provided in the fourth trench.

13. The semiconductor device according to claim 1, wherein
the first direction is a direction inclined by 0° or more and 8° or less with respect to a <11-20> direction.

14. An inverter circuit comprising the semiconductor device according to claim 1.

15. A drive device comprising the semiconductor device according to claim 1.

16. A vehicle comprising the semiconductor device according to claim 1.

17. An elevator comprising the semiconductor device according to claim 1.

* * * * *